United States Patent
Sakamoto et al.

(10) Patent No.: US 11,222,902 B2
(45) Date of Patent: Jan. 11, 2022

(54) SEMICONDUCTOR MEMORY DEVICE

(71) Applicant: Toshiba Memory Corporation, Minato-ku (JP)

(72) Inventors: Manabu Sakamoto, Yokkaichi (JP); Kenji Tashiro, Kuwana (JP); Takamasa Ito, Nagoya (JP)

(73) Assignee: Toshiba Memory Corporation, Minato-ku (JP)

( * ) Notice: Subject to any disclaimer, the term of this patent is extended or adjusted under 35 U.S.C. 154(b) by 207 days.

(21) Appl. No.: 16/529,979

(22) Filed: Aug. 2, 2019

(65) Prior Publication Data

US 2020/0295033 A1   Sep. 17, 2020

(30) Foreign Application Priority Data

Mar. 15, 2019 (JP) .............................. JP2019-048283

(51) Int. Cl.
| | | |
|---|---|---|
| *H01L 27/11582* | (2017.01) | |
| *H01L 27/11524* | (2017.01) | |
| *G11C 5/06* | (2006.01) | |
| *H01L 27/1157* | (2017.01) | |
| *H01L 27/11556* | (2017.01) | |

(52) U.S. Cl.
CPC ........ *H01L 27/11582* (2013.01); *G11C 5/063* (2013.01); *H01L 27/1157* (2013.01); *H01L 27/11524* (2013.01); *H01L 27/11556* (2013.01)

(58) Field of Classification Search
CPC .......................... H01L 27/11551–11556; H01L 27/11578–11582
See application file for complete search history.

(56) References Cited

U.S. PATENT DOCUMENTS

| | | | | |
|---|---|---|---|---|
| 2015/0325588 | A1* | 11/2015 | Lee | H01L 27/11568 257/329 |
| 2017/0207226 | A1* | 7/2017 | Lee | H01L 27/11573 |
| 2017/0309636 | A1* | 10/2017 | Lee | H01L 27/0688 |
| 2018/0122904 | A1* | 5/2018 | Matsumoto | H01L 29/1037 |
| 2018/0138195 | A1* | 5/2018 | Lee | H01L 29/42348 |
| 2018/0175053 | A1* | 6/2018 | Park | H01L 27/11582 |
| 2018/0323213 | A1* | 11/2018 | Arai | H01L 27/11582 |
| 2018/0366486 | A1* | 12/2018 | Hada | H01L 27/11556 |
| 2019/0296117 | A1* | 9/2019 | Ishiduki | H01L 29/42344 |
| 2019/0326315 | A1* | 10/2019 | Lee | H01L 27/11582 |
| 2020/0194453 | A1* | 6/2020 | Lim | H01L 27/11582 |
| 2020/0273881 | A1* | 8/2020 | Kim | H01L 23/528 |

FOREIGN PATENT DOCUMENTS

JP   2018-142654 A   9/2018

* cited by examiner

*Primary Examiner* — Bryan R Junge
(74) *Attorney, Agent, or Firm* — Oblon, McClelland, Maier & Neustadt, L.L.P.

(57) ABSTRACT

A semiconductor memory device according to an embodiment includes a substrate, first and second conductive layers, first and second pillars, and a first member. The first conductive layer includes a first portion, a second portion, and a third portion above the second portion. The second conductive layers are stacked above the first conductive layer. The first pillar includes a first semiconductor layer in contact with the first portion in a direction crossing the stacked direction. The second pillar is provided to penetrate the second conductive layers and the third portion in the stacked direction. The first member is provided between the first and second pillars and between the second and third portions.

18 Claims, 48 Drawing Sheets

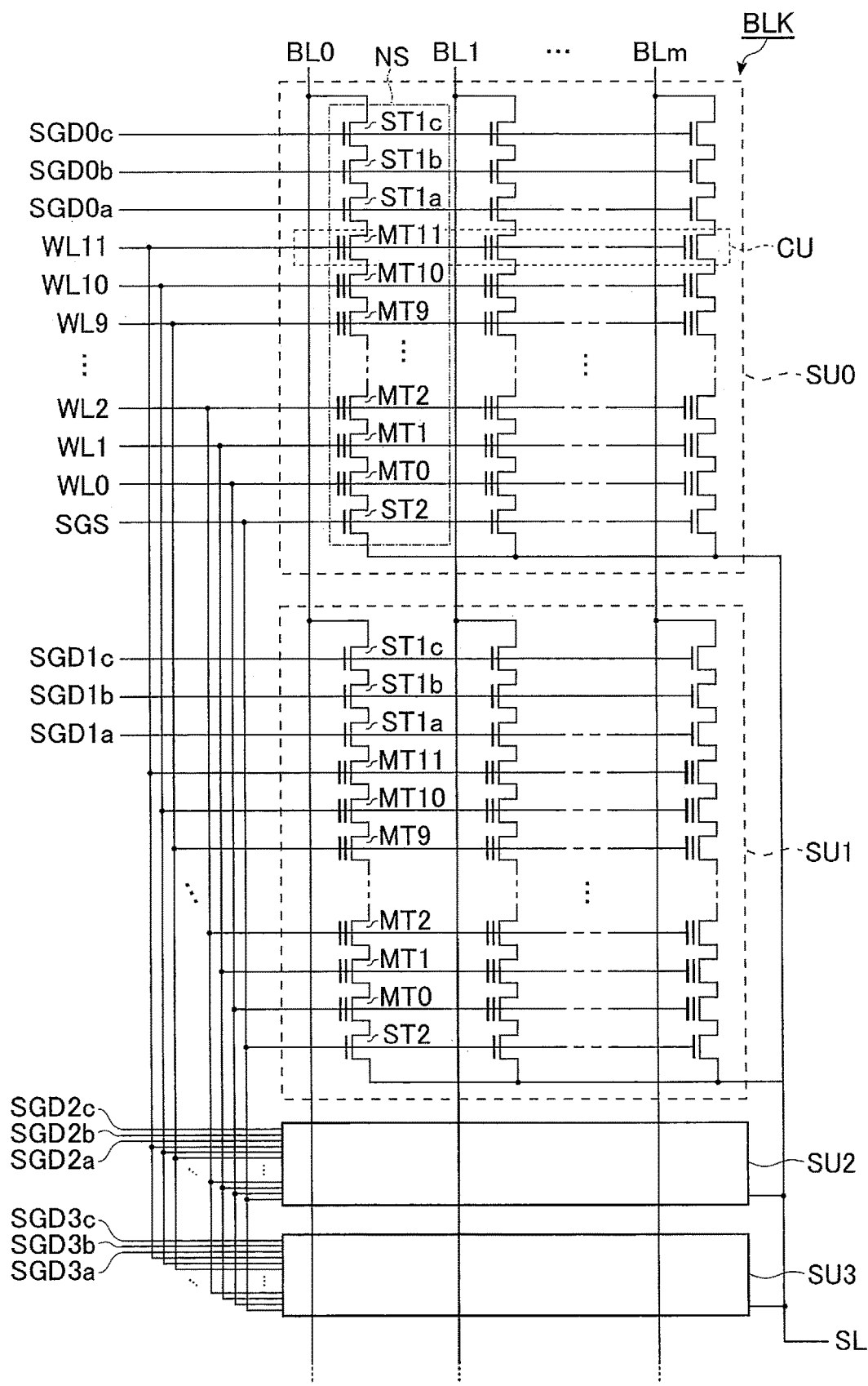
F I G. 2

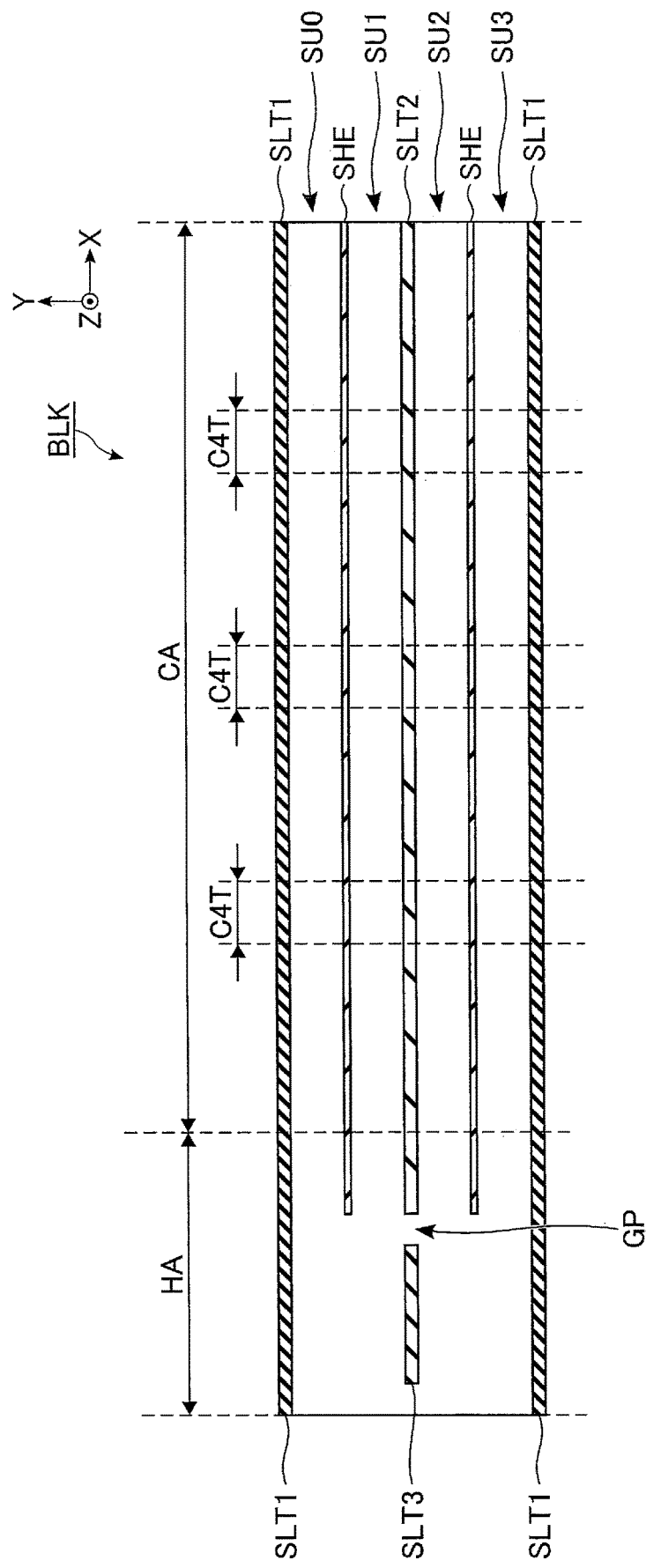
F I G. 3

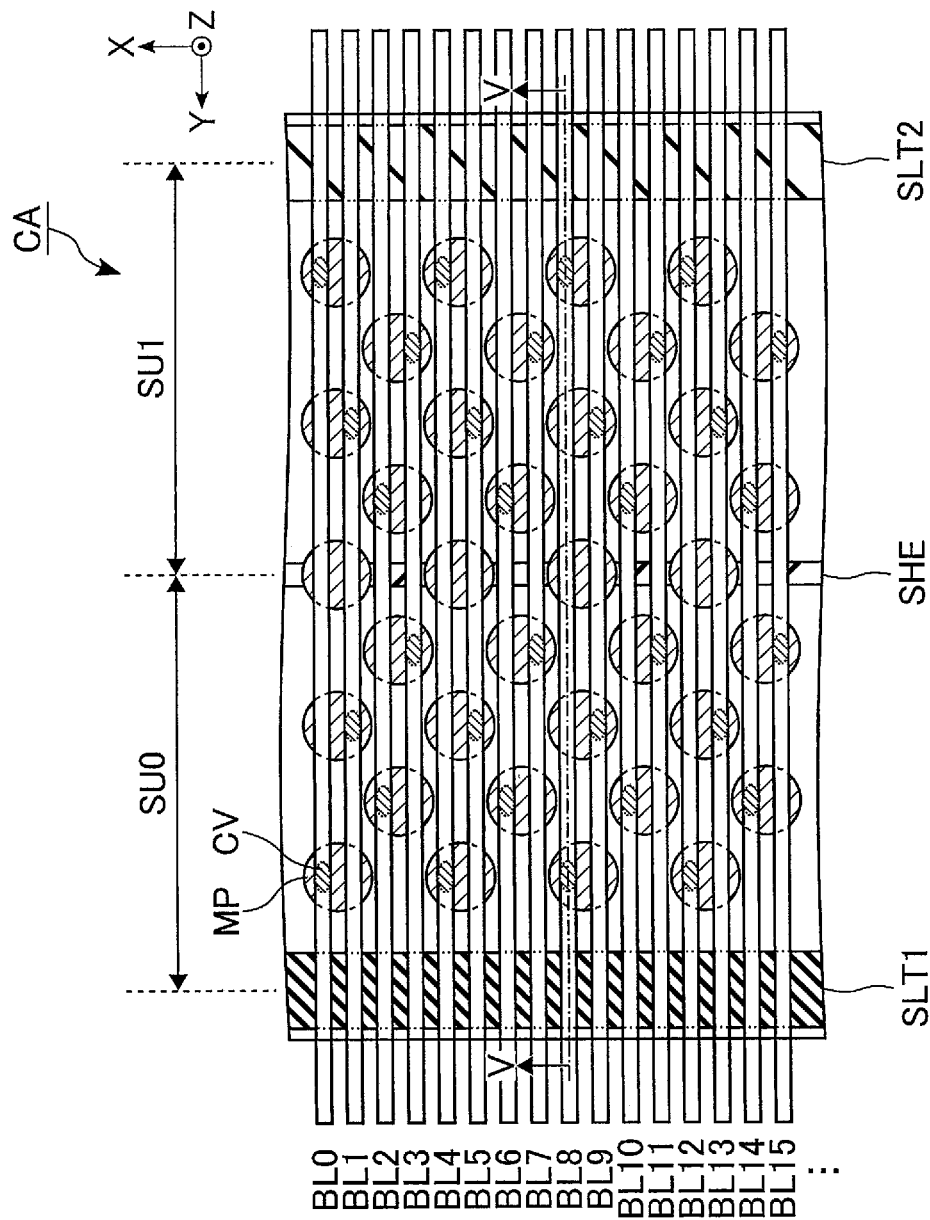
F I G. 4

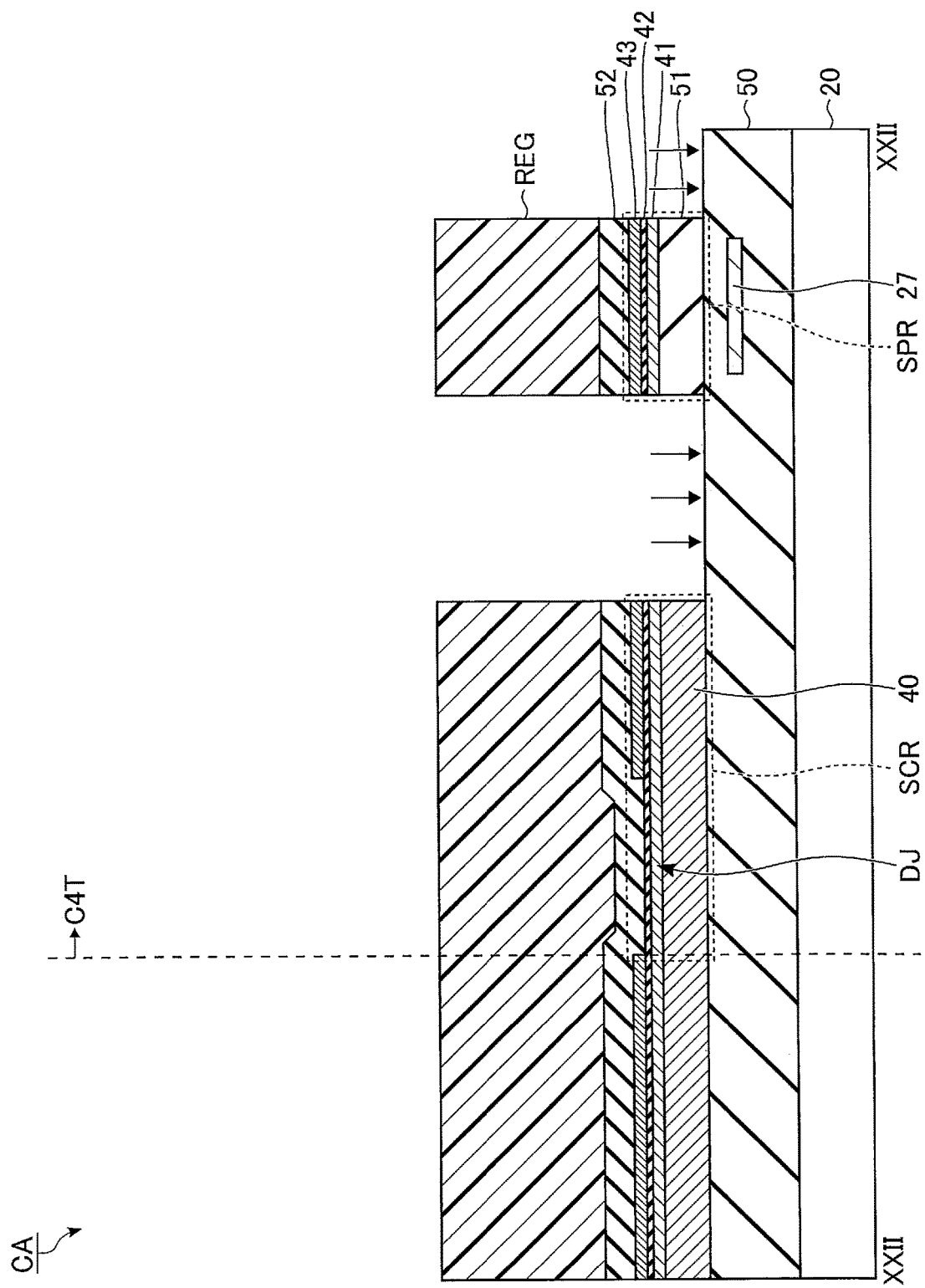
F I G. 22

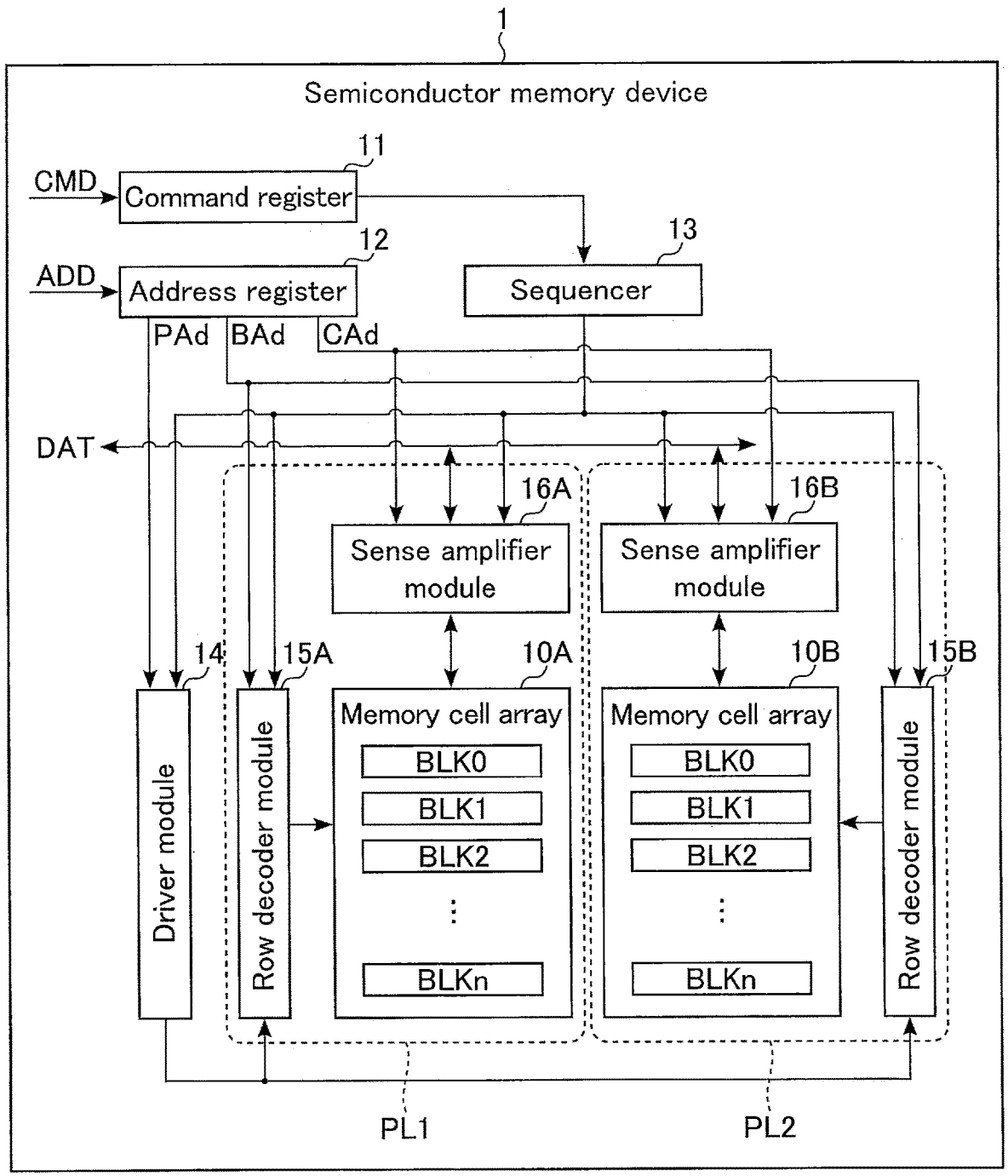
F I G. 40

SEMICONDUCTOR MEMORY DEVICE

CROSS-REFERENCE TO RELATED APPLICATIONS

This application is based upon and claims the benefit of priority from Japanese Patent Application No. 2019-048283, filed Mar. 15, 2019, the entire contents of which are incorporated herein by reference.

FIELD

Embodiments described herein relate generally to a semiconductor memory device.

BACKGROUND

A NAND-type flash memory capable of storing data in a nonvolatile manner is known.

BRIEF DESCRIPTION OF THE DRAWINGS

FIG. 2 is a circuit diagram showing an example of a circuit configuration of a memory cell array included in the semiconductor memory device according to the first embodiment;

FIG. 3 is a plane view showing an example of a planar layout of the memory cell array included in the semiconductor memory device according to the first embodiment;

FIG. 4 is a plane view showing an example of a detailed planar layout in a cell area of the memory cell array included in the semiconductor memory device according to the first embodiment;

FIG. 22 is a cross-sectional view of the memory cell array, taken along line XXII-XXII of FIG. 21, showing an example of a cross-section structure during the manufacturing process of the semiconductor memory device according to the first embodiment;

FIG. 40 is a block diagram showing a configuration example of a semiconductor memory device according to a second embodiment;

DETAILED DESCRIPTION

Figure 1:
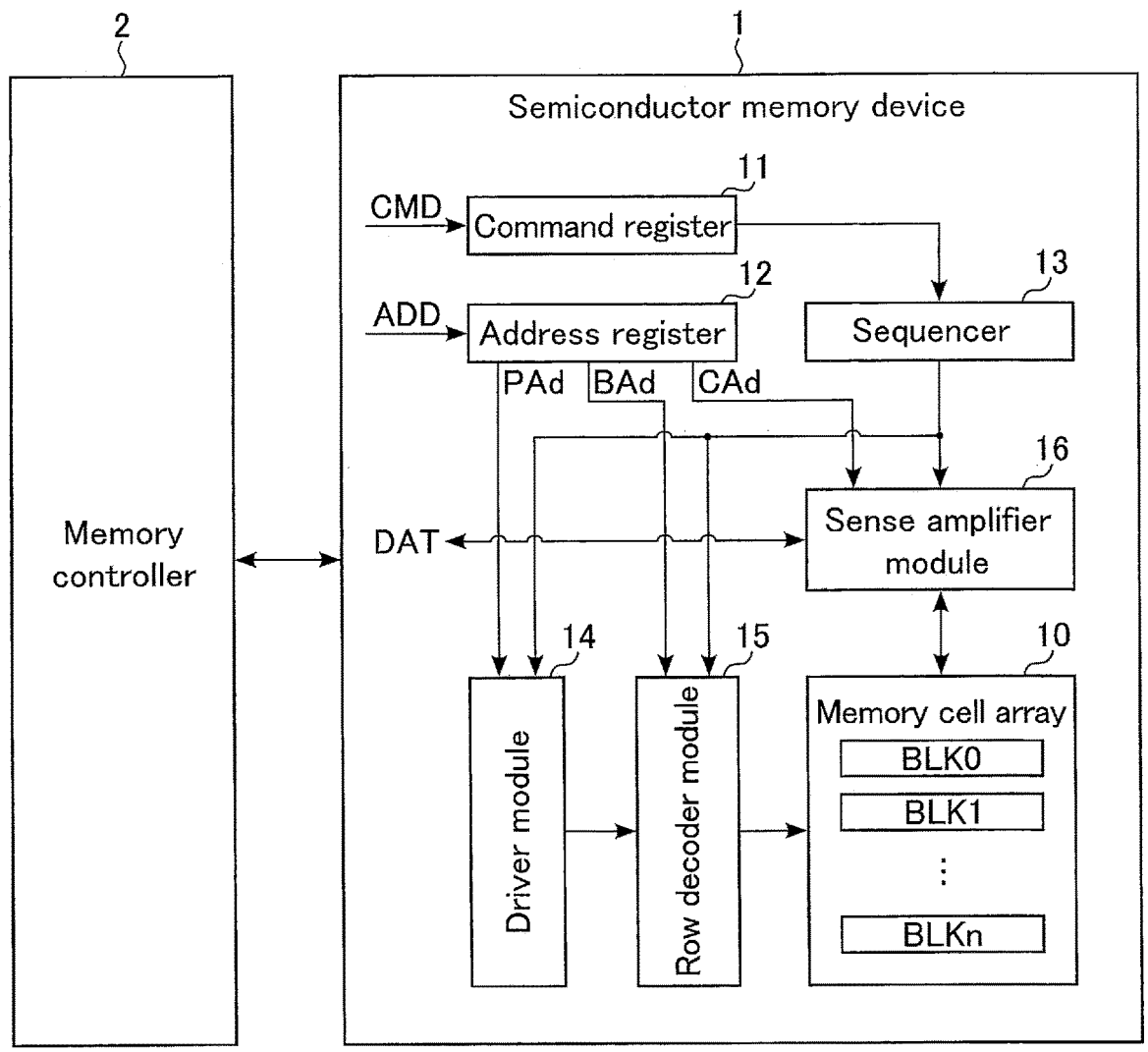
FIG. 1 is a block diagram showing a configuration example of a semiconductor memory device according to a first embodiment.

In general, according to one embodiment, a semiconductor memory device includes a substrate, a first conductive layer, a plurality of second conductive layers, a first pillar, a second pillar, and a first member. The substrate includes a first region and a second region. The first and second regions are adjacent in a first direction. The first conductive layer is provided above the substrate in the first and second regions. The first conductive layer includes a first portion in the first region, a second portion in the second region, and a third portion in the second region. The second portion is continuous with the first portion. The third portion is continuous with the first portion and apart from the second portion above the second portion. The second conductive layers are provided above the first conductive layer. The second conductive layers are stacked to be apart from one another. The first pillar is provided to penetrate the second conductive layers in a stacked direction of the second conductive layers to reach the first portion of the first conductive layer. The first pillar includes a first semiconductor layer and a first insulating layer. The first semiconductor layer is in contact with the first portion of the first conductive layer in a direction crossing the stacked direction. The first insulating layer is provided between the first semiconductor layer and the second conductive layers. The second pillar is provided to penetrate the second conductive layers and the third portion of the first conductive layer in the stacked direction. The first member differs in material from the first conductive layer. The first member is provided between the first and second pillars and between the second and third portions of the first conductive layer, is in contact with each of the second and third portions of the first conductive layer in the stacked direction, and is in contact with the first portion of the first conductive layer in the first direction.

Hereinafter, embodiments will be described with reference to the accompanying drawings. Each of the embodiments is an example of a device and a method to embody a technical idea of the invention. The drawings are schematic or conceptual, and the dimensions and ratios, etc. in the drawings are not always identical to the actual ones. Furthermore, the technical concept of the invention is not limited by the form, structure and arrangement or the like of the structural components.

In the following description, structural elements having substantially the same function and configuration will be assigned with the same reference numeral. The numerals following the letters constituting the reference numerals/symbols are referred to by the reference numerals/symbols including the same letter, and are used for distinction between elements having the same configuration. If elements represented by the reference symbols/numerals including the same letter need not be distinguished, those elements are assigned with references symbols/numerals including the same letter.

[1] First Embodiment

Hereinafter, a semiconductor memory device 1 according to the first embodiment will be described.

[1-1] Configuration of Semiconductor Memory Device 1

[1-1-1] Overall Configuration of Semiconductor Memory Device 1

FIG. 1 shows a configuration example of the semiconductor memory device 1 according to the first embodiment. The semiconductor memory device 1 is a NAND-type flash memory which can store data in a non-volatile manner, and is controlled by an external memory controller 2. Communications between the semiconductor memory device 1 and the memory controller 2 support the NAND interface standard, for example.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer greater than or equal to 1). A block BLK is a group of memory cells capable of storing data in a nonvolatile manner, and is, for example, a unit of erasing data. The memory cell array 10 is provided with a plurality of bit lines and word lines. Each memory cell is, for example, associated with a single bit line and a single word line. The memory cell array 10 will be described in detail later.

The command register 11 retains a command CMD received by the semiconductor memory device 1 from the memory controller 2. The command CMD includes instructions to cause the sequencer 13 to execute, for example, a read operation, a write operation, an erase operation, etc.

The address register 12 retains address information ADD received by the semiconductor memory device 1 from the memory controller 2. The address information ADD includes, for example, a block address BAd, a page address PAd, and a column address CAd. For example, the block address BAd, the page address PAd, and the column address CAd are used to select a block BLK, a word line, and a bit line, respectively.

The sequencer 13 controls the operation of the entire semiconductor memory device 1. For example, the sequencer 13 controls the driver module 14, the row decoder module 15, the sense amplifier module 16, etc., based on the command CMD held in the command register 11, and executes a read operation, a write operation, an erase operation, etc.

The driver module 14 generates voltages used for a read operation, a write operation, an erase operation, etc. The driver module 14 applies the generated voltage to a signal line corresponding to the selected word line based on, for example, the page address PAd held in the address register 12.

The row decoder module 15 selects one block BLK in the corresponding memory cell array 10, based on a block address BAd held in the address register 12. The row decoder module 15 transfers, for example, the voltage applied to the signal line corresponding to the selected word line to the selected word line in the selected block BLK.

In a write operation, the sense amplifier module 16 applies a desired voltage to each bit line in accordance with write data DAT received from the memory controller 2. In a read operation, the sense amplifier module 16 determines the data stored in a memory cell based on the voltage of the bit line, and transfers the determination result as read data DAT to the memory controller 2.

The above-mentioned semiconductor memory device 1 and memory controller 2 may be combined into a single semiconductor memory device. Such a semiconductor device may be a memory card, such as an SD™ card, and a solid state drive (SSD), for example.

[1-1-2] Circuit Configuration of Memory Cell Array 10

FIG. 2 shows an example of the circuit configuration of the memory cell array 10 included in the semiconductor memory device 1 according to the first embodiment, focusing on one block BLK among a plurality of blocks BLK included in the memory cell array 10. As shown in FIG. 2, the block BLK includes, for example, four string units SU0 to SU3.

Each string unit SU includes a plurality of NAND strings NS that are respectively associated with bit lines BL0 to BLm (where m is an integer greater than or equal to 1). Each NAND string NS includes, for example, memory cell transistors MT0 to MT11, and select transistors ST1a, ST1b, ST1c, and ST2. Each memory cell transistor MT includes a control gate and a charge storage layer, and stores data in a non-volatile manner. Each of select transistors ST1a, ST1b, ST1c, and ST2 is used to select a string unit SU at the time of performing various operations.

In each NAND string NS, select transistors ST1a, ST1b and ST1c are coupled in series, and memory cell transistors MT0 to MT11 are coupled in series. One end of select transistors ST1a, ST1b and ST1c coupled in series is coupled to the associated bit line BL, while the other end is coupled to one end of memory cell transistors MT0 to MT11 coupled in series. One end of select transistor ST2 is coupled to the other end of memory cell transistors MT0 to MT11 coupled in series, while the other end is coupled to the source line SL.

In the same block BLK, control gates of memory cell transistors MT0 to MT11 are coupled in common to respective word lines WL0 to WL11. In string unit SU0, the gates of select transistors ST1a, ST1b, and ST1c are coupled in common to respective select gate lines SGD0a, SGD0b, and SGD0c. In string unit SU1, the gates of select transistors ST1a, ST1b, and ST1c are coupled in common to respective select gate lines SGD1a, SGD1b, and SGD1c. In string unit SU2, the gates of select transistors ST1a, ST1b, and ST1c are coupled in common to respective select gate lines SGD2a, SGD2b, and SGD2c. In string unit SU3, the gates of select transistors ST1a, ST1b, and ST1c are coupled in common to respective select gate lines SGD3a, SGD3b, and SGD3c. The gates of select transistors ST2 in the same block BLK are coupled in common to select gate line SGS.

In the circuit configuration of the memory cell array 10 described above, the bit line BL is shared by the NAND strings NS to which the same column address is assigned in the string units SU. The source line SL is shared by a plurality of blocks BLK, for example.

A group of memory cell transistors MT coupled to a common word line WL in a string unit SU is referred to as, for example, a cell unit CU. For example, the storage capacity of the cell unit CU including the memory cell transistors MT, each holding 1-bit data, is defined as "1-page data". The cell unit CU may have a data storage capacity of two or more pages in accordance with the number of bits of data stored in the memory cell transistor MT.

The circuit configuration of the memory cell array 10 included in the semiconductor memory device 1 according to the first embodiment is not limited to the above-described configuration. For example, the number of memory cell transistors MT or select transistors ST1 and ST2 included in each NAND string NS may be determined as appropriate. The number of string units SU included in each block BLK may be determined as appropriate.

[1-1-3] Configuration of Memory Cell Array 10

An example of the configuration of the memory cell array 10 according to the first embodiment will be described.

In the drawings referred to in the following description, the X direction corresponds to the extending direction of word lines WL, the Y direction corresponds to the extending direction of bit lines BL, and the Z direction corresponds to the direction vertical to the surface of the semiconductor substrate 20 on which the semiconductor memory device 1 is formed. In the plan view, shading lines are provided as appropriate for viewability. The shading lines provided in the plan view are not necessarily related to materials or characteristics of elements with the shading lines. In each drawing, elements such as an insulation film (interlayer insulation film), an interconnect, a contact, etc. are omitted as appropriate for viewability.

(Planar Layout of Memory Cell Array 10)

FIG. 3 is an example of the planar layout of the memory cell array 10 included in the semiconductor memory device 1 according to the first embodiment, focusing on a region corresponding to one block BLK (i.e., string units SU0 to SU3). As shown in FIG. 3, the planar layout of the memory cell array 10 is divided into a cell area CA and a hookup area HA in the X direction. The memory cell array 10 includes slits SLT1, SLT2 and SLT3, and slits SHE.

The cell area CA is an area where the NAND string NS is formed. The cell area CA includes, for example, a plurality of penetration contact regions C4T each extending in the Y direction. The penetration contact region C4T penetrates the stacked word lines WL, etc., and is provided with a contact for electrically coupling the circuit above the memory cell array 10 and the circuit below the memory cell array 10.

The hookup area HA is an area where a contact is formed for electrically coupling the word lines WL and the select gate lines SGS and SGD coupled to the NAND string NS, and the row decoder module 15.

Each of slits SLT1, SLT2, and SLT3 is filled up with an insulating member, and divides the conductive layers provided in the same interconnect layer and provided adjacent through the slit. Specifically, each of slits SLT1, SLT2, and SLT3 divides a plurality of interconnect layers corresponding respectively to word lines WL0 to WL11, select gate lines SGDa, SGDb and SGDc, and select gate line SGS.

The slits SLT1 each extend along the X direction, and are arranged in the Y direction. The slits SLT1 extend across the hookup area HA and the cell area CA in the X direction. The slits SLT2 and SLT3 each extend in the X direction between the adjacent two slits SLT1. The slit SLT2 extends from the end area in the hookup area HA, and across the cell area CA in the X direction. The slit SLT3 is arranged to be apart from the slit SLT2 in the hookup area HA.

The slits SLT2 and SLT3 are, for example, arranged in the X direction. A gap portion GP is arranged between the slits SLT2 and SLT3. In other words, a slit SLT that extends from the hookup area HA over the cell area CA is provided, excluding the gap portion GP, between the two slits SLT1 adjacent in the Y direction.

The slit SHE is filled up with an insulating member, and insulates the conductive layers provided in the same interconnect layer and adjacent through the slit SHE. Specifically, the slit SHE divides a plurality of interconnect layers corresponding respectively to select gate lines SGDa, SGDb, and SGDc. The slit SHE is arranged between the adjacent slits SLT1 and SLT2. The slit SHE extends from the end area in the hookup area HA, and across the cell area CA in the X direction.

In the planar layout of the memory cell array 10 described above, each of the regions partitioned by the slits SLT1, SLT2, and SHE in the cell area CA corresponds to one string unit SU. That is, in this example, string units SU0 to SU3 each extending in the X direction are arranged in the Y direction. In the memory cell array 10, the layout shown in FIG. 3, for example, is repeatedly arranged in the Y direction.

In the above-described planar layout of the memory cell array 10, the number of slits SLT2 or SLT3 arranged between the adjacent two slits SLT1 may be determined as appropriate. The number of slits SHE arranged between the adjacent slits SLT1 and SLT2 may be determined as appropriate. The number of string units SU between the adjacent two slits SLT1 varies based on the number of slits SLT2 and SHE arranged between the adjacent two slits SLT1.

(Configuration of Memory Cell Array 10 in Cell Area CA)

FIG. 4 is an example of the detailed planar layout of the memory cell array 10 in the cell area CA of the semiconductor memory device 1 according to the first embodiment, focusing on a region corresponding to string units SU0 and SU1. As shown in FIG. 4, in the cell area CA, the memory cell array 10 includes a plurality of memory pillars MP, contacts CV, and bit lines BL.

Each of the memory pillars MP functions as one NAND string NS, for example. The memory pillars MP are, for example, staggered in nine lines in a region between adjacent slits SLT1 and SLT2. For example, the memory pillars MP aligned in the X direction at the intermediate portion of adjacent slits SLT1 and SLT2 are arranged to overlap with slit SHE1. That is, the memory pillars MP include ones that penetrate the slit SHE1 and are in contact with the adjacent select gate lines SGD.

The bit lines BL each extend in the Y direction, and are aligned in the X direction. Each bit line BL is arranged to overlap with at least one memory pillar MP in each string unit SU. In this example, two bit lines BL overlap with each memory pillar MP. A contact CV is provided between the memory pillar MP and one of the bit lines BL overlapping with the memory pillar MP. Each memory pillar MP is electrically coupled to the corresponding bit line BL through the contact CV.

The contact CV is omitted between the bit line BL and the memory pillar MP overlapping with the slit SHE. That is, the contact CV is omitted between the bit line BL and the memory pillar MP in contact with two different select gate lines SGD. The number or the arrangement of the memory pillars MP, or the slits SHE between the adjacent slits SLT, is not limited to the configuration described with reference to FIG. 4, and may be changed as appropriate.

The planar layout of the memory cell array 10 in the region corresponding to string units SU2 and SU3 is similar to that in the region corresponding to string units SU0 and SU1; thus, descriptions thereof are omitted.

Figure 5:
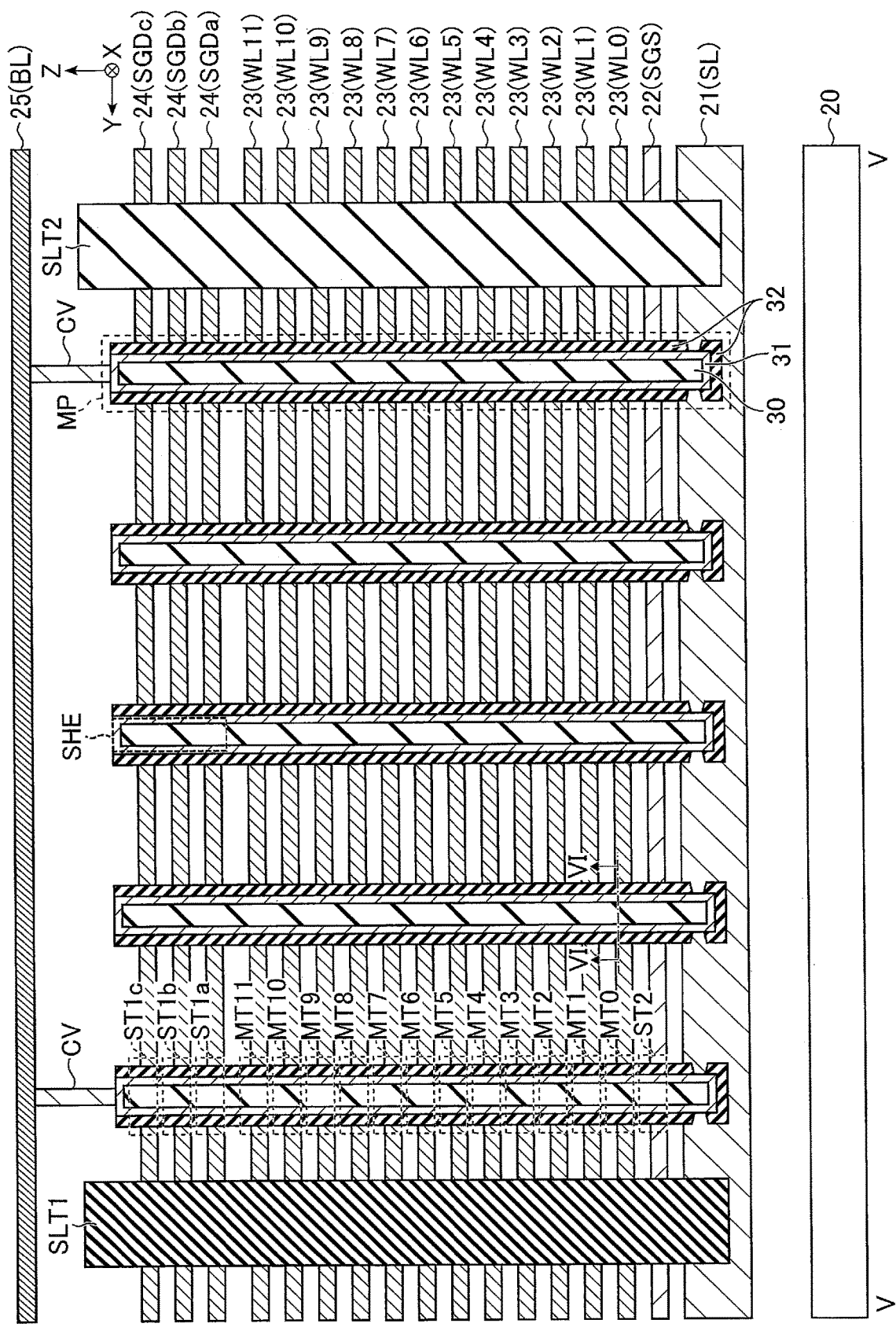
FIG. 5 is a cross-sectional view, taken along line V-V of FIG. 4, showing an example of a cross-section structure in the cell area of the memory cell array included in the semiconductor memory device according to the first embodiment.

FIG. 5 is a cross-sectional view taken along line V-V of FIG. 4, and shows an example of a cross-section structure in the cell area CA of the memory cell array 10 included in the semiconductor memory device 1 according to the first embodiment. In FIG. 5, the portion overlapping with the slit SHE1 in the X direction is indicated by dashed line. As shown in FIG. 5, the memory cell array 10 includes conductive layers 21 to 25. The conductive layers 21 to 25 are provided above the semiconductor substrate 20.

Specifically, the conductive layer 21 is provided through an insulating layer above the semiconductor substrate 20. Although illustration is omitted, circuits corresponding to the row decoder module 15 and the sense amplifier module 16, etc. are formed in the insulating layer between the semiconductor substrate 20 and the conductive layer 21. The conductive layer 21 has a configuration in which, for example, a plurality of conductive layers formed in a plate-like shape expanding along the XY plane are stacked, and is used as source line SL. The conductive layer 21 contains, for example, silicon (Si).

The conductive layer 22 is provided through the insulating layer above the conductive layer 21. The conductive layer 22 is formed in a plate-like shape expanding along the XY plane, for example, and is used as select gate line SGS. The conductive layer 22 contains, for example, silicon.

The insulating layer and the conductive layer 23 are alternately arranged above the conductive layer 22. The conductive layer 23 is formed, for example, in a plate-like shape expanding along the XY plane. The plurality of conductive layers 23 stacked are respectively used as word lines WL0 to WL11 in order, from the semiconductor substrate 20 side. The conductive layer 23 contains, for example, tungsten (W).

The insulating layer and the conductive layer 24 are alternately arranged above the uppermost conductive layer 23. The conductive layer 24 is formed, for example, in a plate-like shape expanding along the XY plane. For example, the plurality of conductive layers 24 stacked are respectively used as select gate lines SGDa, SGDb, and SGDc, in order from the semiconductor substrate 20 side. The conductive layer 24 contains, for example, tungsten.

The conductive layer 25 is provided through the insulating layer above the uppermost conductive layer 24. The conductive layer 25 is formed in the shape of a line extending along the Y direction, for example, and is used as bit line BL. Namely, the plurality of conductive layers 25 are arranged along the X direction in a region not shown. The conductive layer 25 contains, for example, copper (Cu).

Each of the memory pillars MP extends along the Z direction, and penetrates the conductive layers 22 to 24. Each of the memory pillars MP includes, for example, a core member 30, a semiconductor layer 31, and a laminated film 32.

The core member 30 is provided to extend along the Z direction. For example, the upper end of the core member 30 is included in the layer higher than the uppermost conductive layer 24, while the lower end of the core member 30 is included in the layer in which the conductive layer 21 is provided. The semiconductor layer 31 is provided around the core member 30, for example. At the lower portion of the memory pillar MP, a part of the side surface of the semiconductor layer 31 is in contact with the conductive layer 21. The laminated film 32 covers the side and bottom surfaces of the conductive layer 31, except for the portion in which the semiconductor layer 31 and the conductive layer 21 are in contact with each other. The core member 30 includes an insulator of silicon oxide ($SiO_2$), etc., for example. The semiconductor layer 31 contains, for example, silicon.

A column-like contact CV is provided on the top surfaces of the semiconductor layer 31 in the memory pillar MP. In the region illustrated, the contacts CV corresponding to two memory pillars MP, among five memory pillars MP, are shown. Contacts CV are coupled, in a region not shown, to the memory pillars MP not overlapping with the slit SHE, and to which the contacts CV are not coupled in the region illustrated.

One conductive layer 25, i.e., one bit line BL, is in contact with the top surface of the contact CV. One contact CV is coupled to one conductive layer 25 in each of the spaces partitioned by the slits SLT1, SLT2 and SHE, and the memory pillar MP that is in contact with the slit SHE. Each of the conductive layers 25 is electrically coupled to, for example, one memory pillar MP between the adjacent slits SLT1 and SHE, and one memory pillar MP between the adjacent slits SHE and SLT2.

The slit SLT is formed in a plate-like shape expanding along the XZ plane, for example, and divides the conductive layers 22 to 24. The upper end of the slit SLT is included in the layer between the uppermost conductive layer 24 and the conductive layer 25. The lower end of the slit SLT is included in the layer in which the conductive layer 21 is provided, for example. The slit SLT includes an insulator of silicon oxide, for example.

The slit SHE is formed in a plate-like shape expanding along the XZ plane, for example, and divides the stacked conductive layers 24. The upper end of the slit SHE is included in the layer between the uppermost conductive layer 24 and the conductive layer 25. The lower end of the slit SHE is included in the layer between the uppermost conductive layer 23 and the lowermost conductive layer 24, for example. The slit SHE includes an insulator of silicon oxide, for example. For example, the upper end of the slit SHE and the upper end of the memory pillar MP are aligned. The configuration is not limited to this, and the upper end of the memory pillar MP and the upper ends of the slits SLT and SHE may not be aligned.

In the configuration of the memory pillar MP described above, the intersection between the memory pillar MP and the conductive layer 22 functions as select transistor ST2. The intersection between the memory pillar MP and the conductive layer 23 functions as the memory cell transistor MT. The intersection between the memory pillar MP and the conductive layer 24 functions as select transistor ST1.

Figure 6:
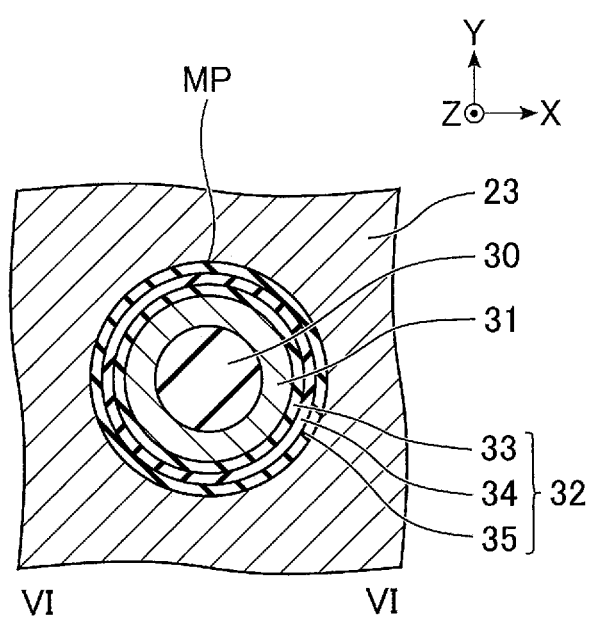
FIG. 6 is a cross-sectional view, taken along line VI-VI of FIG. 5, showing an example of a cross-section structure of a memory pillar in the semiconductor memory device according to the first embodiment.

FIG. 6 is a cross-sectional view taken along line VI-VI of FIG. 5, and shows an example of the cross-section structure of the memory pillar MP in the semiconductor memory device 1 according to the first embodiment. More specifically, FIG. 5 shows the cross-section structure of the memory pillar MP in the layer parallel to the surface of the semiconductor substrate 20 and including the conductive layer 23.

As shown in FIG. 6, in the layer including the conductive layer 23, the core member 30 is provided at the center of the memory pillar MP, for example. The semiconductor layer 31 surrounds the side surface of the core member 30. The laminated film 32 surrounds the side surface of the semiconductor layer 31. The laminated film 32 includes, for example, a tunnel insulation film 33, an insulation film 34, and a block insulation film 35.

The tunnel insulation film 33 surrounds the side surface of the semiconductor layer 31. The insulation film 34 surrounds the side surface of the tunnel insulation film 33. The block insulation film 35 surrounds the side surface of the insulation film 34. The conductive layer 23 surrounds the side surface of the block insulation film 35. The tunnel insulation film 33 and the block insulation film 35 each contain, for example, silicon oxide. The insulation film 34 contains, for example, silicon nitride (SiN).

In the semiconductor memory device 1 according to the first embodiment, the semiconductor layer 31 is used as a channel of each of memory cell transistors MT0 to MT11 and select transistors ST1a, ST1b, ST1c and ST2. The insulation film 34 is used as a charge storage layer in the memory cell transistor MT. Therefore, each of the memory pillars MP functions as one NAND string NS.

(Configuration of Memory Cell Array 10 in Hookup Area HA)

Figure 7:
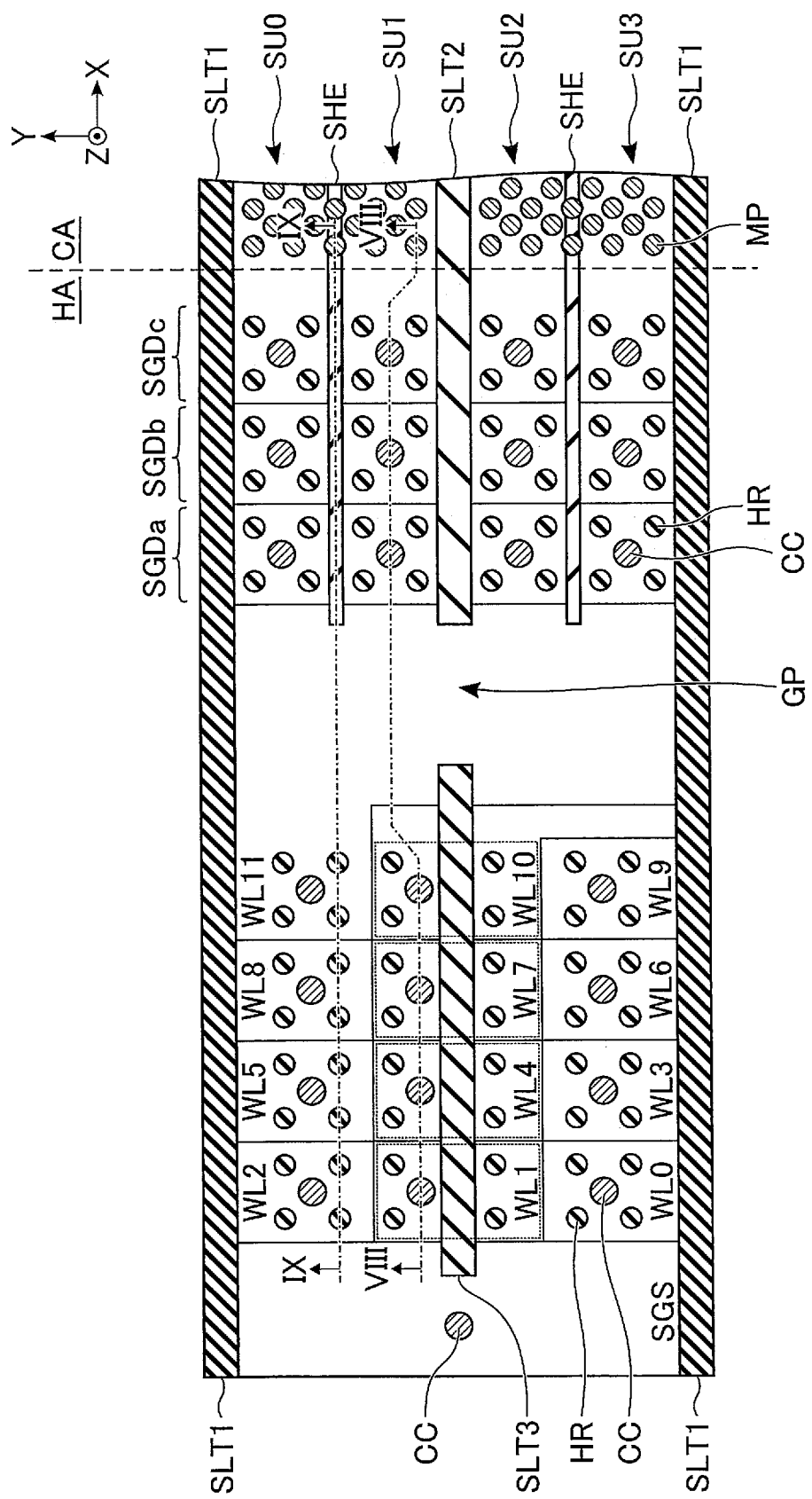
FIG. 7 is a plane view showing an example of a detailed planar layout in a hookup area of the memory cell array included in the semiconductor memory device according to the first embodiment.

FIG. 7 is an example of the detailed planar layout of the memory cell array 10 in the hookup area HA of the semiconductor memory device 1 according to the first embodiment, focusing on a region corresponding to one block BLK. FIG. 7 further shows a part of the cell area CA in the vicinity of the hookup area HA. As shown in FIG. 7, in the hookup area HA, end portions of the select gate line SGS, word lines WL0 to WL11, and select gate lines SGDa, SGDb and SGDc are provided in a stepwise manner. In the hookup area HA, the memory cell array 10 includes a plurality of contacts CC, and a plurality of support pillars HR.

Specifically, the select gate line SGS, word lines WL0 to WL11, and select gate lines SGDa, SGDb and SGDc each include, at their end portions, a terraced portion that does not overlap with the upper interconnect layer (conductive layer). For example, the end portions of word lines WL0 to WL11 are arranged stepwise in three lines with two steps in the Y direction and multiple steps in the X direction. The end portion of each of select gate lines SGDa, SGDb and SGDc is arranged stepwise with steps provided in the X direction. The select gate line SGS is drawn outside from the end area of word lines WL0 to WL11, provided in a stepwise manner.

With respect to the above-described staircase configuration of the stacked interconnect, the slit SLT3 is arranged at the intermediate portion between the adjacent two slits SLT1, and extends across the terraced portions corresponding respectively to word lines WL1, WL4, WL7 and WL10 in the X direction. The slit SLT3 may or may not extend across the terraced portion of the select gate line SGS in the X direction. The slit SHE is arranged, for example, at the intermediate portion between the adjacent slits SLT1 and SLT2, and extends across the terraced portions corresponding respectively to select gate lines SGDa, SGDb, and SGDc in the X direction.

In this example, the word lines WL provided in the same layer in the same block BLK are shorted-circuited through the gap portion GP. In other words, the word lines WL in contact with one slit SLT1 of adjacent two slits SLT1, and the word lines WL in contact with the other slit SLT1, are electrically coupled through the gap portion GP.

The contacts CC are provided on the terraced portions of the respective select gate line SGS, word lines WL0 to WL11, and select gate lines SGDa, SGDb and SGDc. The select gate line SGS, word lines WL0 to WL11, and the select gate lines SGDa, SGDb and SGDc are electrically coupled to the row decoder module 15 through the corresponding contacts CC.

The support pillars HR are arranged as appropriate in the hookup area HA, excluding the portions where the slits SLT1 and SLT2, and the contacts CC, are formed, for example. The support pillar HR is filled up with an insulating member in the hole extending in the Z direction, and penetrates the stacked interconnect layers (e.g., word lines WL and select gate line SGD). For example, the plural support pillars HR are arranged around the contact CC in the terraced portion of each of the word lines WL and select gate lines SGD.

Figure 8:
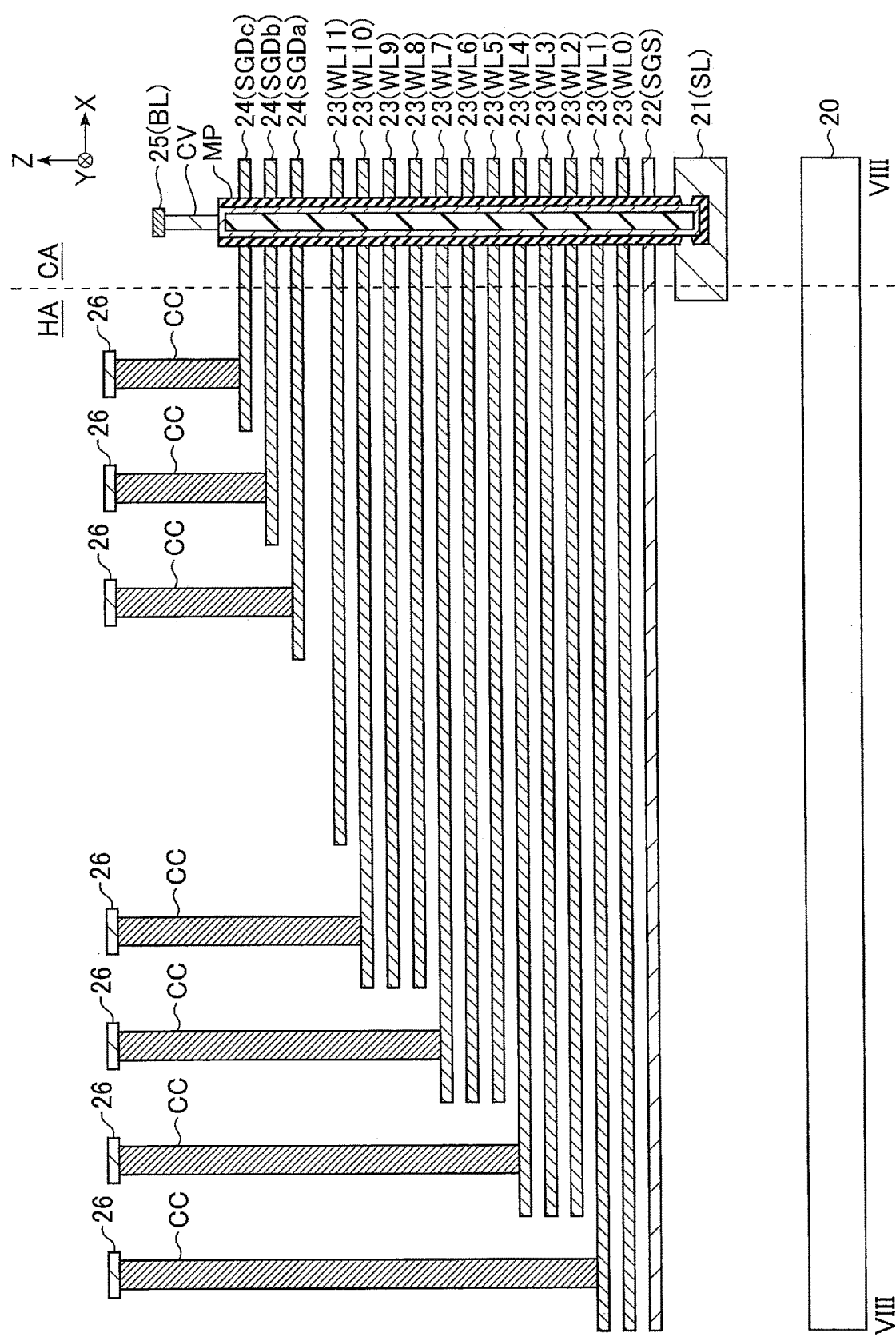
FIG. 8 is a cross-sectional view, taken along line VIII-VIII of FIG. 7, showing an example of a cross-section structure in the hookup area of the memory cell array included in the semiconductor memory device according to the first embodiment.

FIG. 8 is a cross-sectional view taken along line VIII-VIII of FIG. 7, and shows an example of the cross-section structure in the hookup area HA of the memory cell array 10 included in the semiconductor memory device 1 according to the first embodiment. FIG. 8 further shows a region of the cross section including the contacts CC. As shown in FIG. 8, in the hookup area HA, the end portions of the conductive layers corresponding to the word lines WL and the select gate lines SGD are provided stepwise. Moreover, in the hookup area HA, the memory cell array 10 includes a plurality of conductive layers 26.

The area illustrated includes a plurality of terraced portions corresponding to word lines WL1, WL4, WL7 and WL10 and select gate lines SGDa, SGDb and SGDc. A contact CC is provided on the terraced portion of each of four conductive layers 23 corresponding respectively to word lines WL0, WL4, WL7 and WL10, and each of three conductive layers 24 corresponding respectively to select gate lines SGDa, SGDb and SGDc. A conductive layer 26 is provided on each contact CC, and is electrically coupled. Each conductive layer 26 is included in the layer higher than the conductive layer 25, for example.

Figure 9:
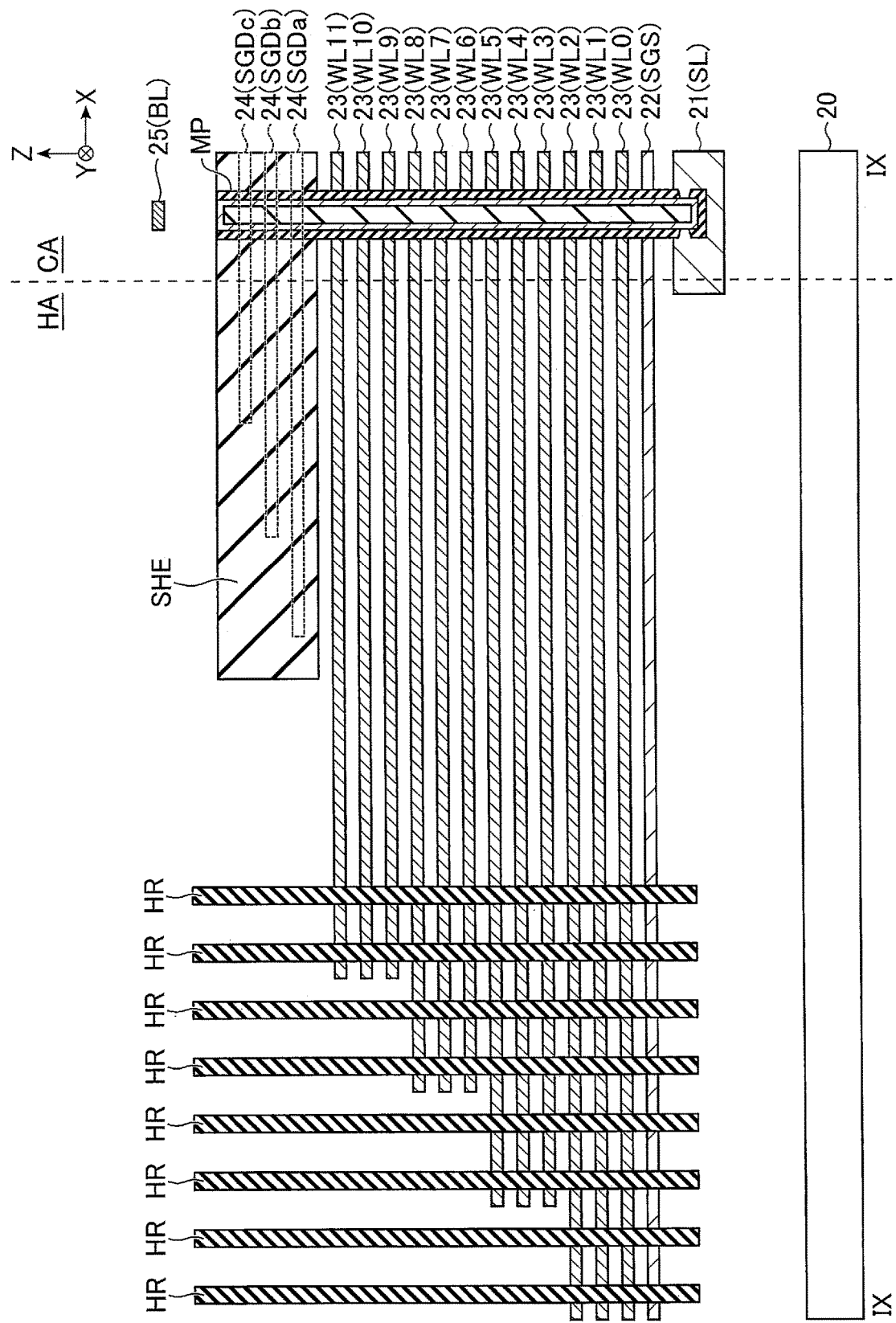
FIG. 9 is a cross-sectional view, taken along line IX-IX of FIG. 7, showing an example of a cross-section structure in the hookup area of the memory cell array included in the semiconductor memory device according to the first embodiment.

FIG. 9 is a cross-sectional view taken along line IX-IX of FIG. 7, and shows an example of a cross-section structure in the hookup area HA of the memory cell array 10 included in the semiconductor memory device 1 according to the first embodiment. FIG. 9 further shows a region of the cross section including the slit SHE, and indicates, with the aid of a dashed line, the portion where the three conductive layers 24 and the slit SHE overlap in the Y direction. As shown in FIG. 9, in the hookup area HA, a conductive layer 21 corresponding to the source line SL is omitted.

The support pillar HR extends in the Z direction, and penetrates the conductive layers 22 to 24. The upper end of the support pillar HR is included in the layer between the conductive layer 25 and the upper end of the memory pillar MP, for example. The lower end of the support pillar HR is included in the layer lower than the conductive layer 22, for example. The configuration is not limited to this, and the lower end of the support pillar HR may reach at least the conductive layer 22.

The slit SHE divides the end portions (terraced portions) of the stacked conductive layers 24. Similarly to the cell area CA, the upper end of the slit SHE is included in the layer between the uppermost conductive layer 24 and the conductive layer 25, while the lower end of the slit SHE is included in the layer between the uppermost conductive layer 23 and the lowermost conductive layer 24.

(Configuration of Memory Cell Array 10 in Penetration Contact Region C4T)

Figure 10:
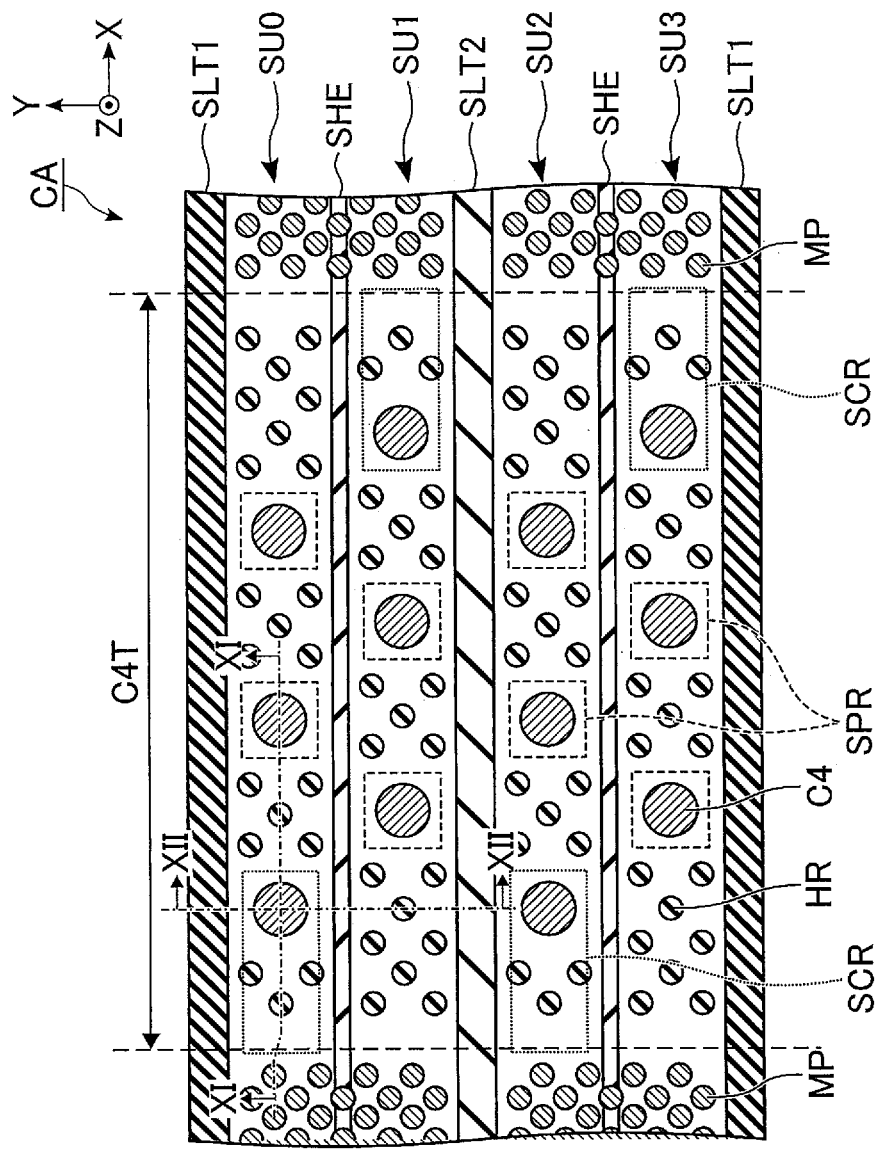
FIG. 10 is a plane view showing an example of a detailed planar layout in a penetration contact region of the memory cell array included in the semiconductor memory device according to the first embodiment.

FIG. 10 shows an example of the detailed planar layout of the memory cell array 10 in the penetration contact region C4T of the semiconductor memory device 1 according to the first embodiment, focusing on a region corresponding to one block BLK. FIG. 10 further shows a part of the cell area CA in the vicinity of the penetration contact region C4T. As shown in FIG. 10, the memory cell array 10 includes, in the penetration contact region C4T, a plurality of support pillars HR, contacts C4, source connection regions SCR, and source penetration regions SPR.

The support pillars HR are arranged as appropriate excluding the portions where slits SLT1 and SLT2, and the contacts C4, are formed. The contacts C4 penetrate the stacked interconnect layers (e.g., select gate line SGS and word lines WL). At least one contact C4 is arranged in each of the source connection region SCR and the source penetration region SPR. The contact C4 has an outer diameter larger than that of the support pillar HR.

The source connection region SCR is arranged to be adjacent to the portion where the memory pillars MP are arranged in the cell area CA. The contact C4 provided in the source connection region SCR is coupled to the source line SL. The source penetration region SPR is arranged to be apart from the source connection region SCR, for example. The contact C4 provided in the source penetration region SPR is used for coupling the interconnects below and above the memory cell array 10. The source line SL is electrically coupled to the circuit provided below the memory cell array 10 through the contact C4 in the source connection region SCR, and the contact C4 in the source penetration region SPR.

The stacked structure of the source line section in the source connection region SCR is different from that in the source penetration region SPR. For example, the stacked structure of the source line section in each of the regions SCR and SPR is used for controlling the bottom position of the contact hole corresponding to the contact C4 in the process of manufacturing the semiconductor memory device 1 described later.

The support pillar HR may be arranged in each of the source connection region SCR and the source penetration region SPR. The number or arrangement of contacts C4 or support pillars HR provided in the penetration contact region C4T may be changed as appropriate. The arrangement of the source connection region SCR or the source penetration region SPR may be changed as appropriate. At least one pair of the source connection region SCR and the source penetration region SPR may be arranged in the penetration contact region C4T provided in the cell area CA.

Figure 11:
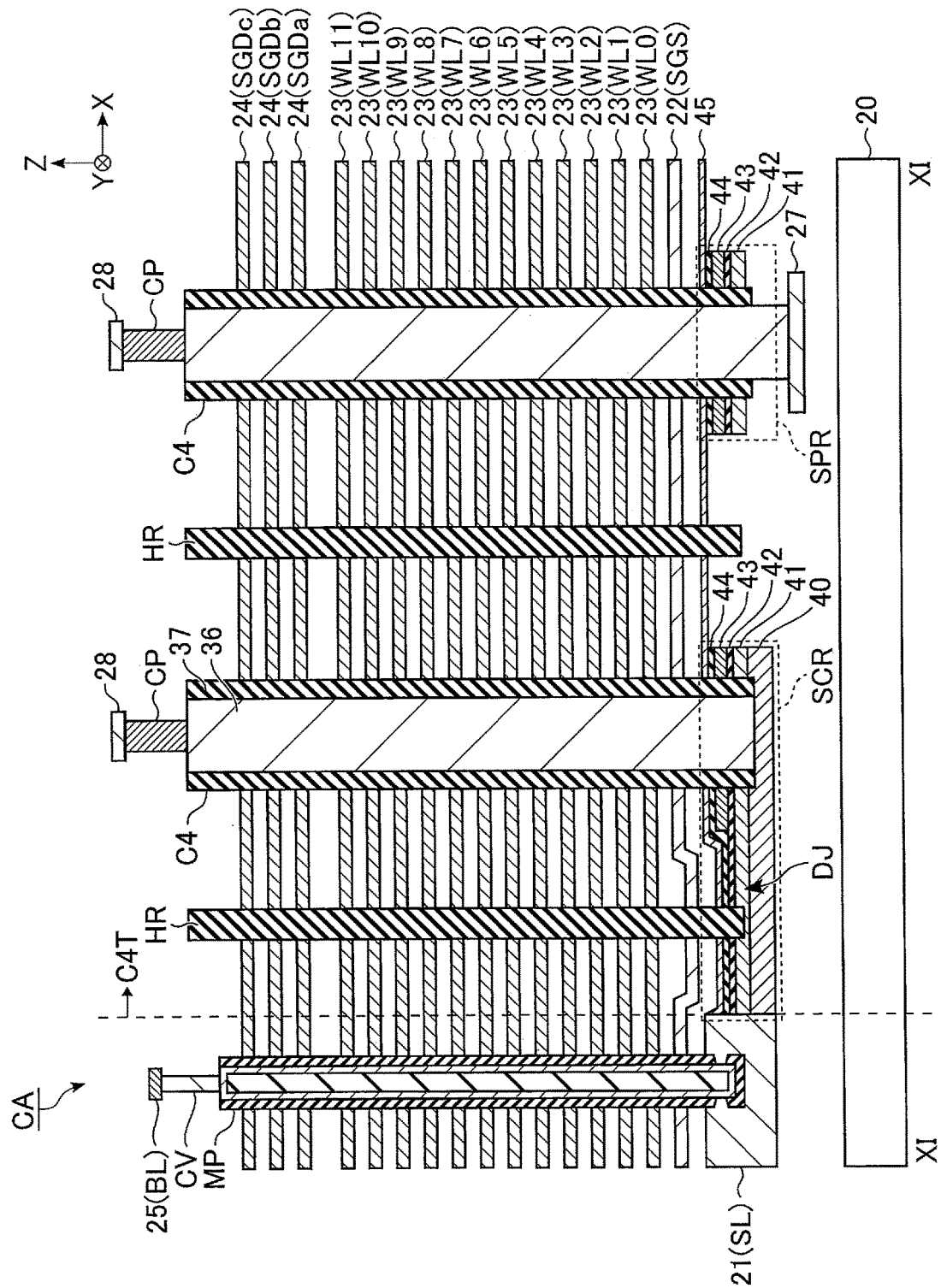
FIG. 11 is a cross-sectional view, taken along line XI-XI of FIG. 10, showing an example of a cross-section structure in the penetration contact region of the memory cell array included in the semiconductor memory device according to the first embodiment.

FIG. 11 is a cross-sectional view taken along line XI-XI of FIG. 10, and shows an example of the cross-section structure in the penetration contact region C4T of the memory cell array 10 included in the semiconductor memory device 1 according to the first embodiment. FIG. 11 shows a region of the cross section including the source connection region SCR and the source penetration region SPR, and shows the detailed structure of the source line section in the penetration contact region C4T. As shown in FIG. 11, the memory cell array 10 includes, in the penetration contact region C4T, conductive layers 27, 28, 40, 41 and 45, insulating layers 42 and 44, sacrificial members 43, and contacts CP.

The conductive layer 27 is an interconnect used for the circuit below the memory cell array 10. The conductive layer 28 is an interconnect used for the circuit above the memory cell array 10. The conductive layers 27 and 28 overlapping in the plane view are electrically coupled through, for example, the contact C4 on the conductive layer 27 and the contact CP on the contact C4.

The stacked structure of the source line section in the source connection region SCR is included in the layer in which the conductive layer 21 is provided. In the source connection region SCR, the conductive layer 40 is provided in the lowermost layer of the source line section. A conductive layer 41 is provided on the conductive layer 40. An insulating layer 42 is provided on the conductive layer 41. A sacrificial member 43 is provided on the first portion of the insulating layer 42. An insulating layer 44 is provided on the sacrificial member 43 and the second portion of the insulating layer 42. A conductive layer 45 is provided on the insulating layer 44.

The sacrificial member 43 on the first portion of the insulating layer 42 is separated from the conductive layer 21 by the insulating layer 44 on the second portion of the insulating layer 42. In other words, the sacrificial member 43 in the source connection region SCR is separated from the conductive layer 21 provided at the lower portion of the memory pillar MP, by providing, in a dividing section DJ, the insulating members (insulating layers 42 and 44) differing in material from the conductive layer 21 and the sacrificial member 43. The insulating members provided in the dividing section DJ are in contact with the conductive layers 41 and 45 in the Z direction, and with the conductive layer 21 in the X direction.

The conductive layers 40, 41 and 45 in the source connection region SCR are made of, for example, a semiconductor containing silicon, and may be integrally provided with the conductive layer 21 coupled to the memory pillar MP. That is, paraphrasing the structure of the source line SL, the conductive layer used as the source line SL above the semiconductor substrate 20 (hereinafter, "source line SL") includes the first portion corresponding to the conductive layer 21, the second portion corresponding to the conductive layers 40 and 41, and the third portion corresponding to the conductive layer 45. An insulating layer 44, for example, used as a part of the insulating member of the dividing section DJ is provided between the second and third portions of the source line SL. The memory pillar MP is provided to penetrate the stacked conductive layers 23, and is electrically coupled to the first portion (conductive layer 21) of the source line SL through the side surface of the semiconductor layer 31. In the source connection region SCR, the support pillar HR and the contact C4 each penetrate the stacked conductive layers 23 and the third portion (conductive layer 45) of the source line SL.

The stacked structure of the source line section in the source penetration region SPR is included in the layer in which the conductive layer 21 is provided. The stacked structure of the source line section in the source penetration region SPR is similar to that in the source connection region SCR, but the conductive layer 40 is omitted. The conductive layer 45 in the source connection region SCR and the conductive layer 45 in the source penetration region SPR are continuously provided. The conductive layer 45 is provided on the entire surface of the penetration contact region C4T, and is electrically coupled to a part of the adjacent conductive layer 21.

The top surface of the conductive layer 45 in the dividing section DJ is lower than the top surface of the conductive layer 45 in the other portion. That is, the conductive layer 45 includes a concave part along the portion in which the sacrificial member 43 is omitted. The conductive layer 22 above the dividing section DJ includes, in a manner similar to the conductive layer 45, for example, a concave part along the portion in which the sacrificial member 43 is omitted. In other words, the conductive layers 45 and 22 each have a step above the dividing section DJ.

In the source connection region SCR, the support pillar HR may be arranged in the dividing section DJ, or in the area where the sacrificial member 43 is provided. In the source connection region SCR, the sacrificial member 43 penetrated by at least the support pillar HR or the contact C4 may be provided away from the conductive layer 21 through the dividing section DJ.

The contact C4 extends along the Z direction. The contact C4 penetrates, for example, the conductive layer 22 to 24, 41, and 45. For example, in the source connection region SCR, the bottom of the contact C4 is in contact with the conductive layer 40. In the source penetration region SPR, the bottom of the contact C4 is in contact with the conductive layer 27. The upper end of the contact C4 is aligned with, for example, the upper end of the support pillar HR.

The contact C4 includes, for example, a conductive layer 36 and an insulating layer 37. The conductive layer 36 is formed into a pillar shape extending in the Z direction, and a contact CP is provided on the conductive layer 36. The insulating layer 37 covers the side surface of the conductive layer 36. The insulating layer 37 insulates the contact C4 from the conductive layers 22 to 24, 41 and 45 penetrated by the contact C4.

Figure 12:
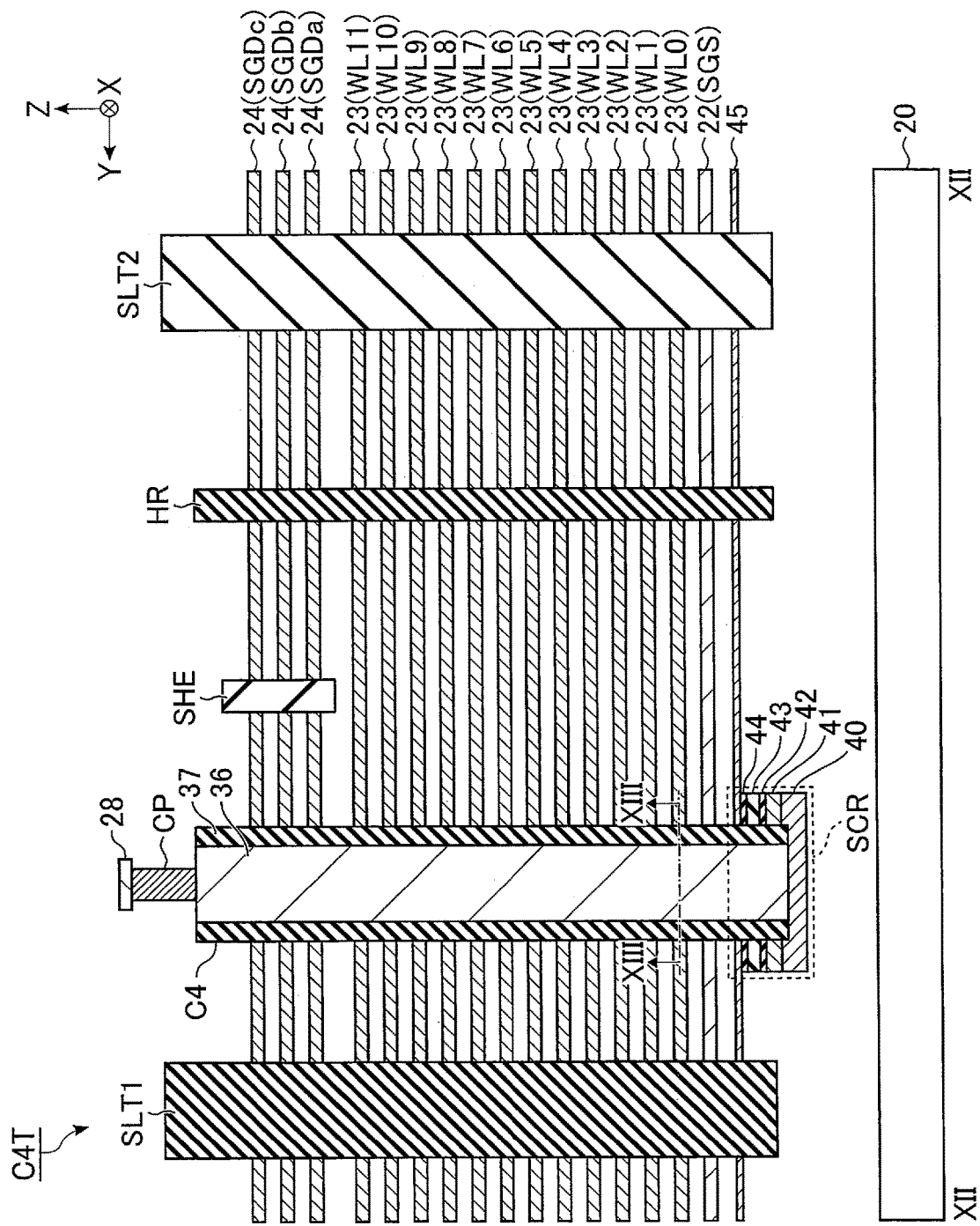
FIG. 12 is a cross-sectional view, taken along line XII-XII of FIG. 10, showing an example of the cross-section structure in the penetration contact region of the memory cell array included in the semiconductor memory device according to the first embodiment.

FIG. 12 is a cross-sectional view taken along line XII-XII of FIG. 10, and shows an example of the cross-section structure in the penetration contact region C4T of the memory cell array 10 included in the semiconductor memory device 1 according to the first embodiment. FIG. 12 shows a region of the cross section including the source connection region SCR and the slits SLT1 and SLT2, and shows the detailed structure of the source line section in the penetration contact region C4T. As shown in FIG. 12, the stacked structures other than the conductive layer 45 of the source line section, for example, are omitted in the peripheral area of the source connection region SCR in the penetration contact region C4T. In the penetration contact region C4T, the slits SLT1 and SLT2 each penetrate the conductive layer 45. The slits SLT1 and SLT2 each have a bottom that is in contact with the insulating layer between the semiconductor substrate 20 and the conductive layer 45, for example.

Figure 13:
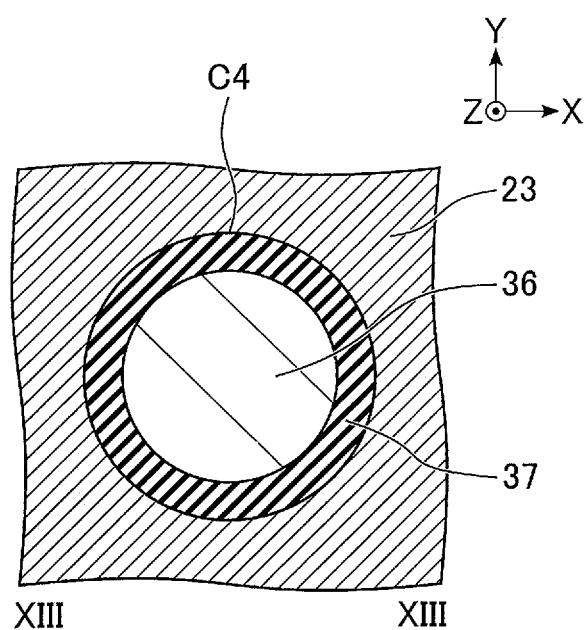
FIG. 13 is a cross-sectional view, taken along line XIII-XIII of FIG. 12, showing an example of a cross-section structure of a contact in the semiconductor memory device according to the first embodiment.

FIG. 13 is a cross-sectional view taken along line XIII-XIII of FIG. 12, and shows an example of the cross-section structure of the contact C4 in the semiconductor memory device 1 according to the first embodiment. More specifically, FIG. 13 shows the cross-section structure of the contact C4 in the layer parallel to the surface of the semiconductor substrate 20 and including the conductive layer 23. As shown in FIG. 13, in the layer including the conductive layer 23, the conductive layer 36 is provided at the center of the contact C4, for example. The insulating layer 37 surrounds the side surface of the conductive layer 36. The conductive layer 23 surrounds the side surface of the insulating layer 37.

In the configuration of the memory cell array 10 described above, the number of the conductive layers 23 is determined based on the number of word lines WL. A plurality of conductive layers 22 provided in a plurality of layers may be allocated to the select gate line SGS. If the select gate line SGS is provided in a plurality of layers, a conductor different from the conductive layer 22 may be used. The number of the conductive layers 24 used as the select gate lines SGD may be determined as appropriate.

The contacts CP and CV may be designed in such a manner that a plurality of contacts are coupled in the Z direction. An interconnect layer may be inserted between the contacts coupled in the Z direction. The conductive layer 26 may pass the area shown in FIG. 9. Similarly, the conductive layer 27 may pass the area shown in FIG. 12. In the first embodiment, the cell area CA includes the penetration contact region C4T, but the configuration is not limited to this. For example, the penetration contact region C4T may be arranged in another area. The penetration contact region C4T may be inserted in the hookup area HA.

[1-2] Manufacturing Method of Semiconductor Memory Device 1

Figure 14:
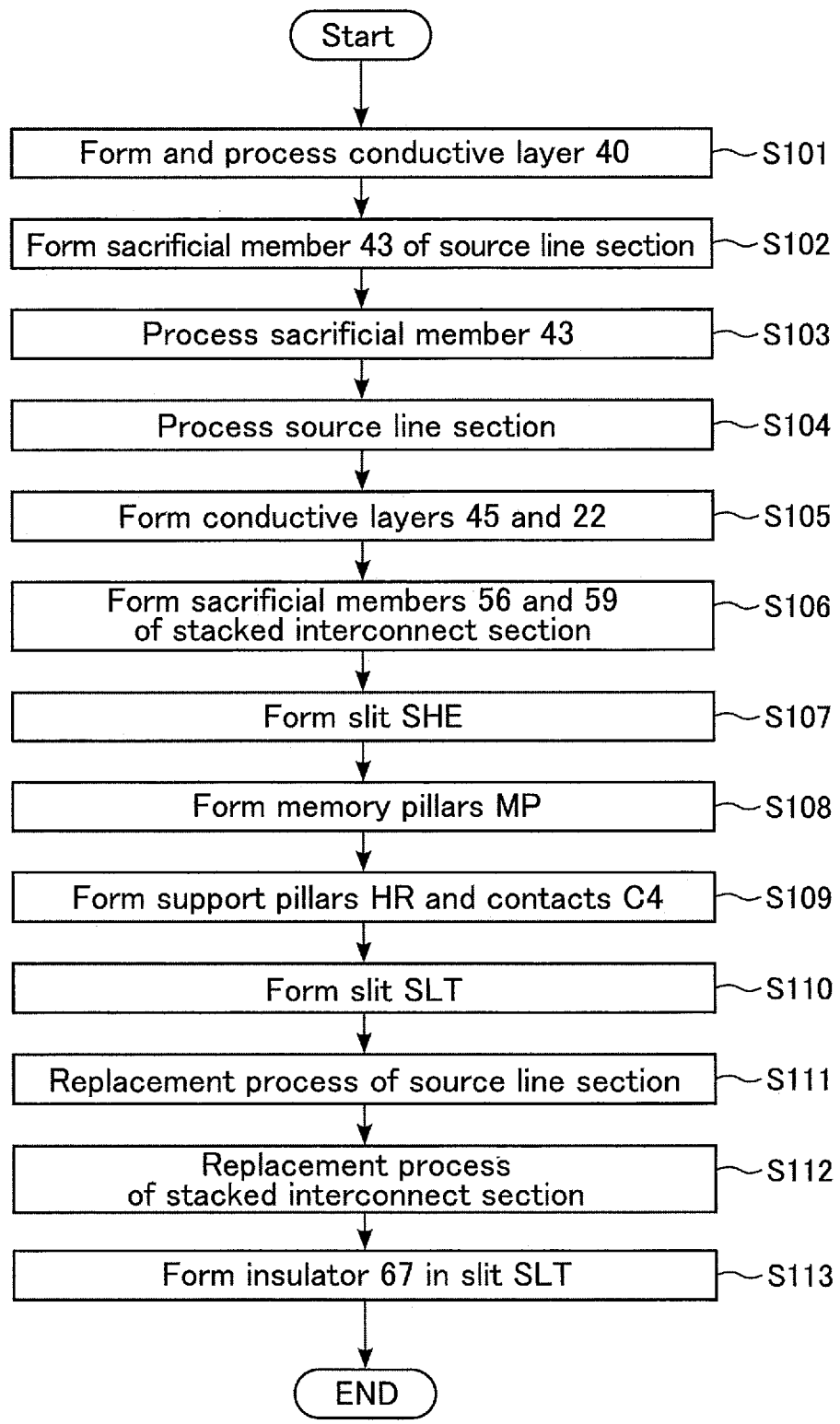
FIG. 14 is a flowchart showing an example of a manufacturing method of the semiconductor memory device according to the first embodiment.

Next, with reference to FIG. 14, a description will be given of an example of a series of manufacturing steps regarding formation of the stacked interconnect structure inside the memory cell array 10 in the semiconductor memory device 1 according to the first embodiment. FIG. 14 is a flowchart showing an example of a manufacturing method of the semiconductor memory device 1 according to the first embodiment. FIGS. 15 to 38 each show an example of the planar layout or the cross-section structure during manufacturing the semiconductor memory device 1 according to the first embodiment. In the manufacturing method described below, the planar view referred to corresponds to the area shown in FIG. 10 while the cross-sectional view corresponds to the area in which the area of the slit SLT is added to the area shown in FIG. 11. The source line section refers to a stacked structure of the interconnect layer corresponding to the conductive layer 21 functioning as the source line SL. The stacked interconnect section refers to a stacked structure corresponding to the conductive layers 23 functioning as the word lines WL and the conductive layers 24 functioning as the select gate lines SGD.

In the process of step S101, the conductive layer 40 is formed and processed into a desired shape. Specifically, first, the insulating layer 50 including the conductive layer 27, and the conductive layer 40 are stacked in order, on the semiconductor substrate 20. Although illustration is omitted, circuits corresponding to the row decoder module 15, the sense amplifier module 16, etc. are formed in the insulating layer 50.

Figure 15:
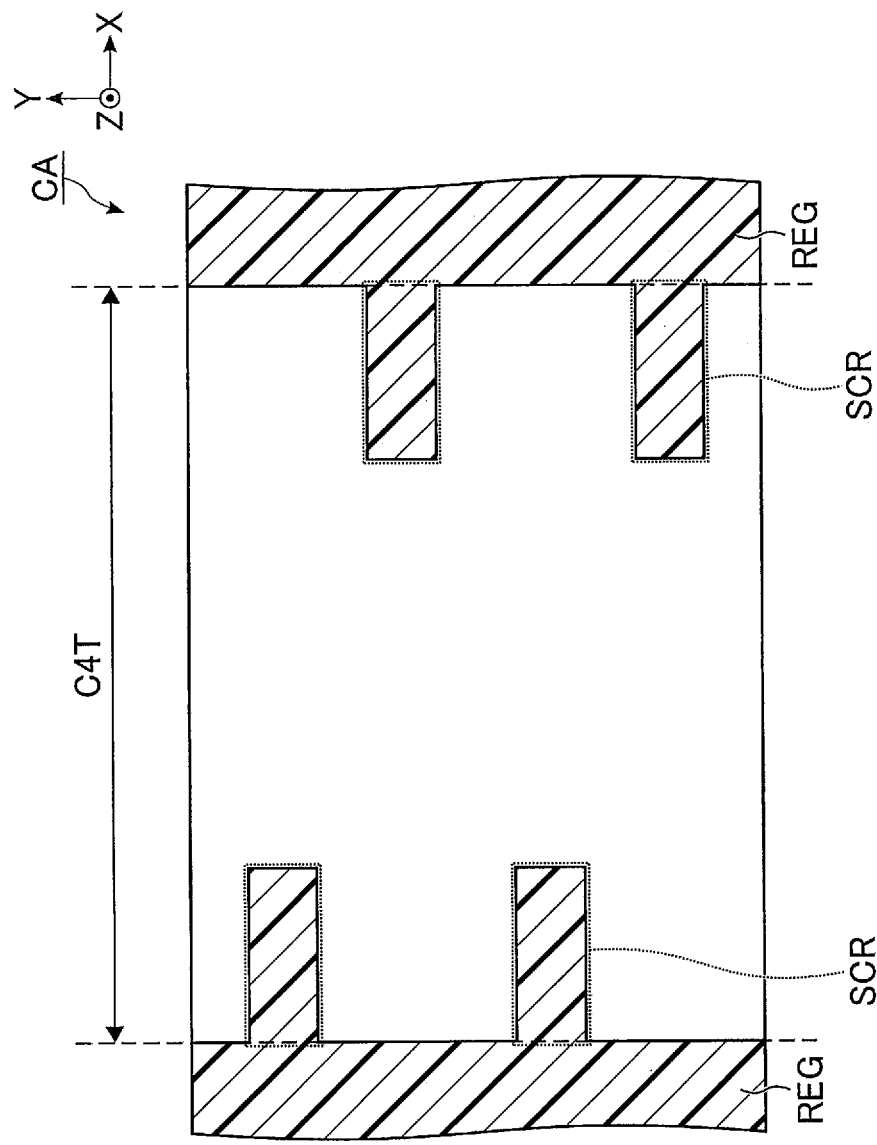
FIG. 15 is a plane view of the memory cell array showing an example of a planar layout during the manufacturing process of the semiconductor memory device according to the first embodiment.
Figure 16:
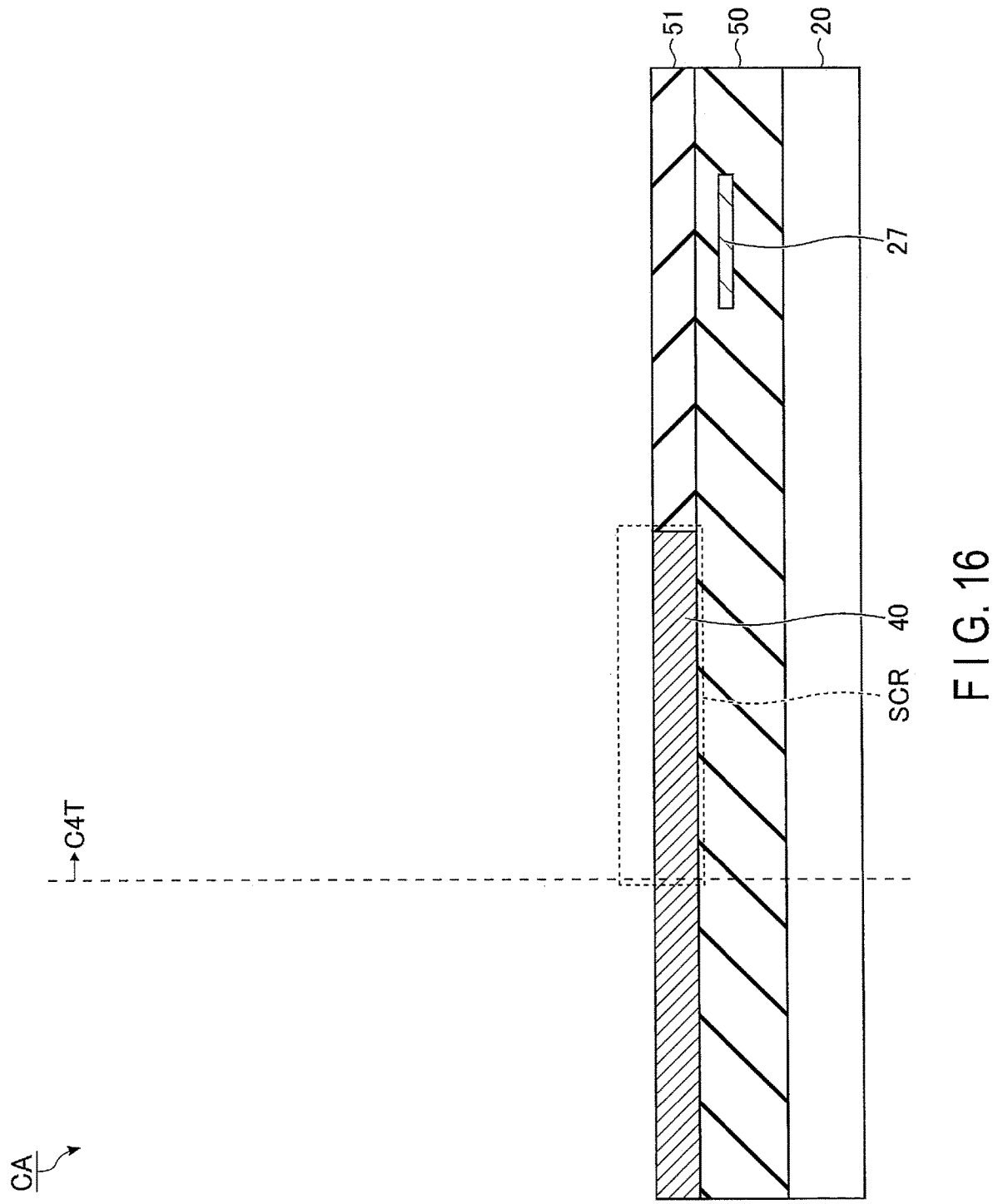
FIGS. 16 and 17 are cross-sectional views of the memory cell array each showing an example of a cross-section structure during the manufacturing process of the semiconductor memory device according to the first embodiment.

Next, a mask REG is formed by photolithography, etc. in which areas where the conductive layer 40 is removed are opened as shown in FIG. 15. For example, in the cell area CA, the mask REG is formed to cover the area where the memory pillar MP is formed, and the source connection region SCR. The mask REG is, for example, a photoresist. Then, by anisotropic etching using the formed mask REG, the conductive layer 40 corresponding to the opening of the mask REG is removed. After the conductive layer 40 is processed, the mask REG is removed. Thereafter, the portion where the conductive layer 40 is removed is filled up with the insulating layer 51 as shown in FIG. 16. The conductive layer 40 is, for example, polysilicon (Si) with phosphorus doped therein.

Figure 17:
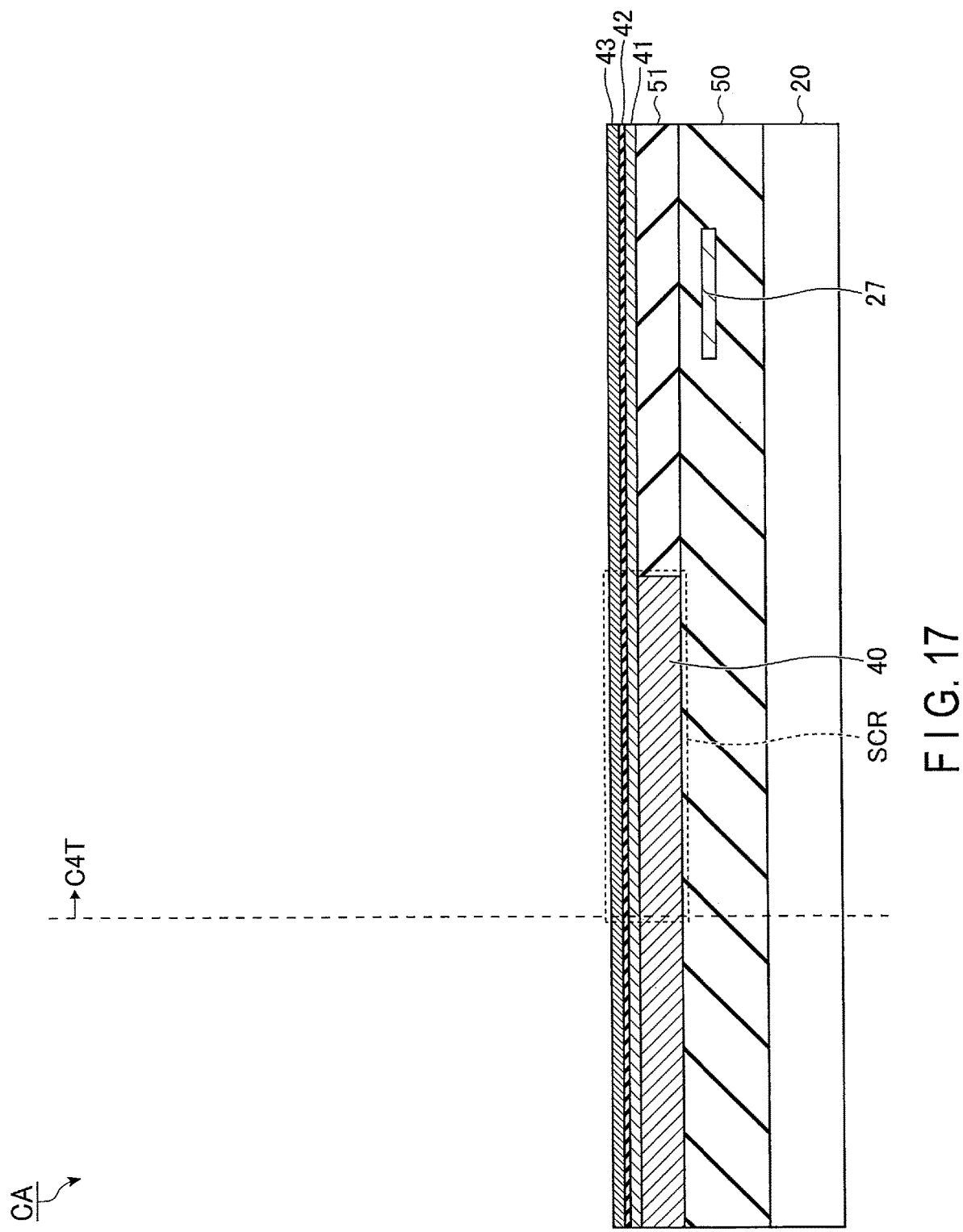

Next, in the process of step S102, the sacrificial member 43 of the source line section is formed as shown in FIG. 17. Specifically, the conductive layer 41, the insulating layer 42, and the sacrificial member 43 are stacked in order on the conductive layer 40 and the insulating layer 51. The conductive layer 41 is, for example, polysilicon with phosphorus doped therein. The insulating layer 42 contains, for example, silicon oxide ($SiO_2$). The sacrificial member 43 is, for example, non-doped polysilicon. The configuration is not limited to this, and if the sacrificial member 43 is made of polysilicon, phosphorus (P), boron (B), carbon (C), etc. may be doped in polysilicon.

Figure 18:
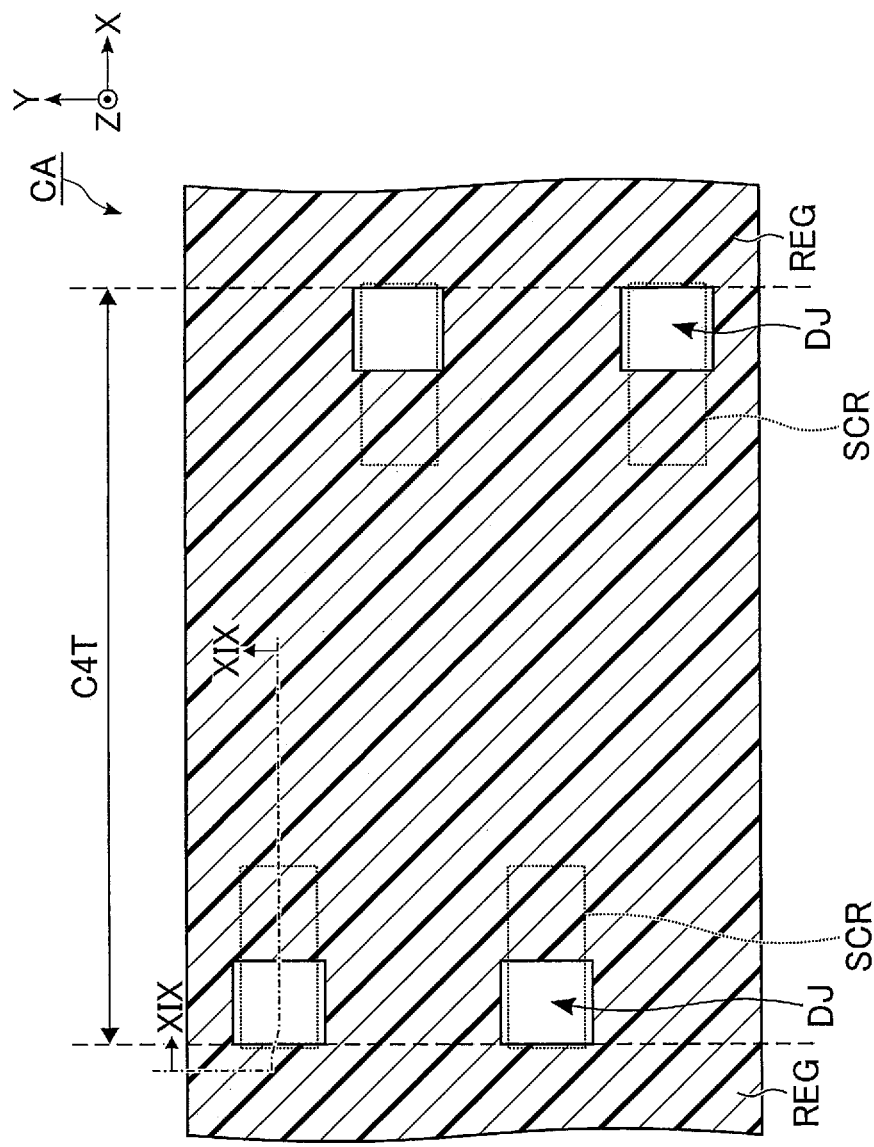
FIG. 18 is a plane view of the memory cell array showing an example of a planar layout during the manufacturing process of the semiconductor memory device according to the first embodiment.
Figure 19:
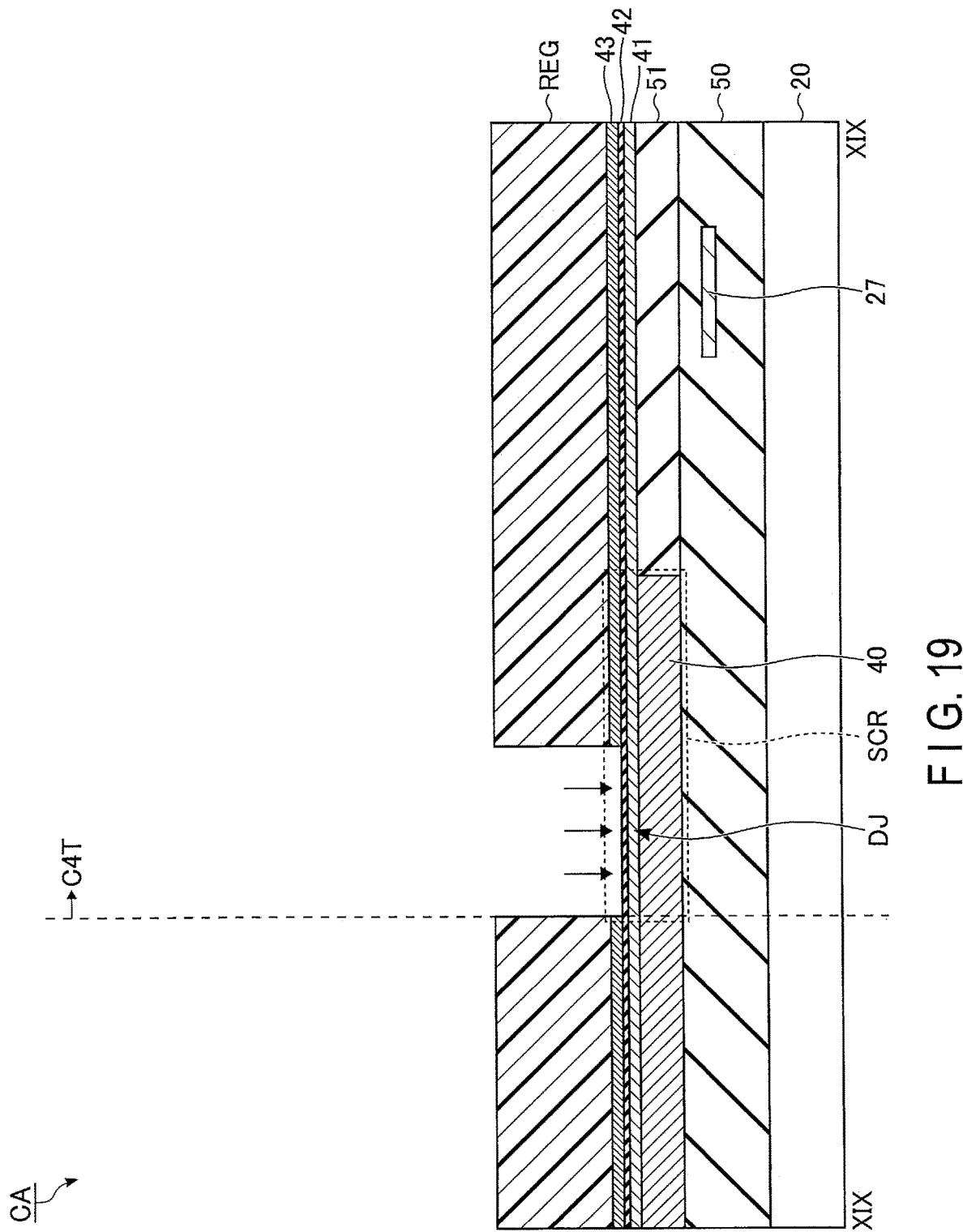
FIG. 19 is a cross-sectional view of the memory cell array, taken along line XIX-XIX of FIG. 18, showing an example of a cross-section structure during the manufacturing process of the semiconductor memory device according to the first embodiment.

Next, in the process of step S103, the sacrificial member 43 is processed into a desired shape. Specifically, first, as shown in FIG. 18, a mask REG is formed by photolithography, etc. in which areas where the sacrificial member 43 is removed are opened. The mask REG in this process is formed in such a manner that the entire dividing section DJ is opened. That is, each opening of the mask REG in this process extends over a part of the corresponding source connection region SCR in the Y direction. Then, by anisotropic etching using the formed mask REG, as shown in FIG. 19, the sacrificial member 43 corresponding to the opening of the mask REG is removed. After the sacrificial member 43 is processed, the mask REG is removed.

Figure 20:
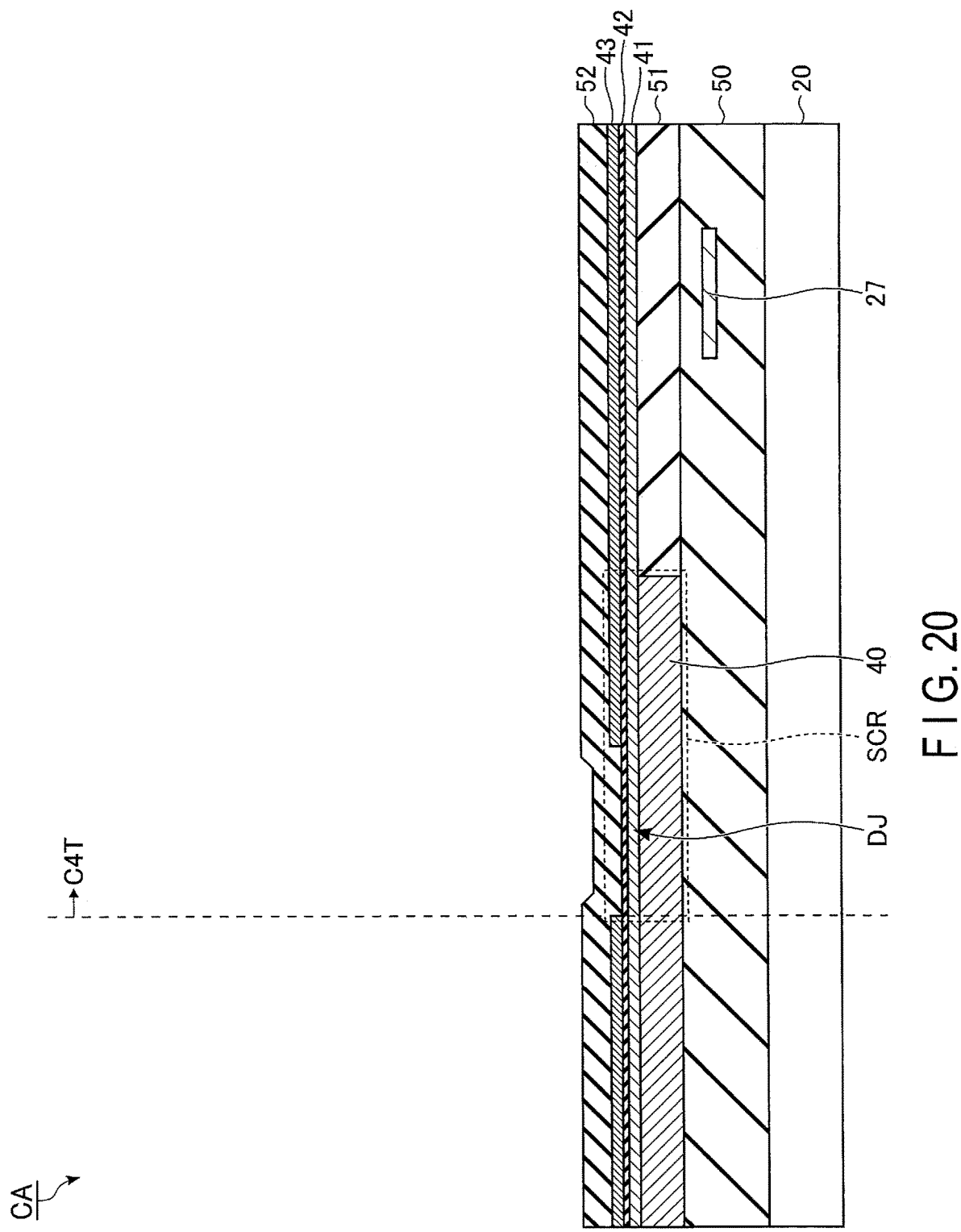
FIG. 20 is a cross-sectional view of the memory cell array showing an example of a cross-section structure during the manufacturing process of the semiconductor memory device according to the first embodiment.

Next, in the process of step S104, the source line section is processed into a desired shape. Specifically, first, as shown in FIG. 20, the passivation film 52 is formed on the exposed portion of the insulating layer 42 and the sacrificial member 43. The passivation film 52 formed in this process includes a concave part in the dividing section DJ. The passivation film 52 is, for example, silicon nitride, and used as an etching stopper.

Figure 21:
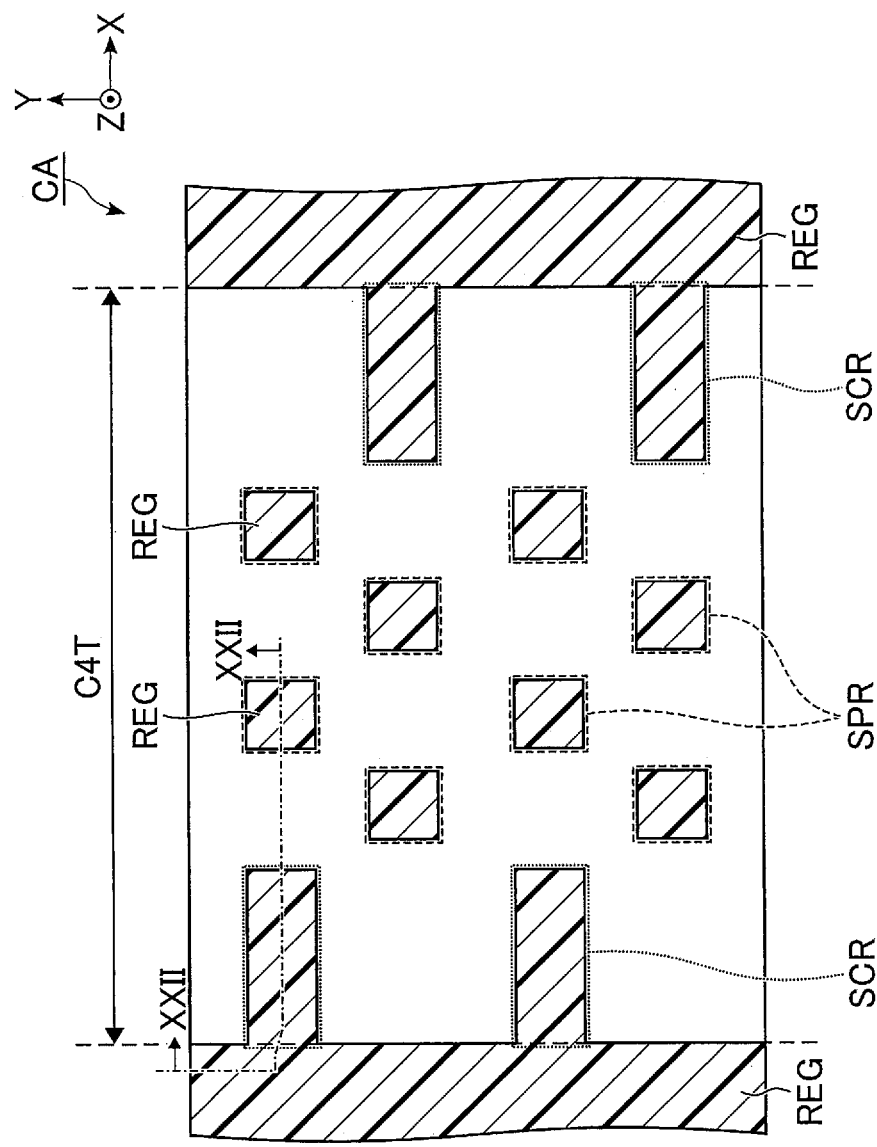
FIG. 21 is a plane view of the memory cell array showing an example of a planar layout during the manufacturing process of the semiconductor memory device according to the first embodiment.

Then, a mask REG is formed by photolithography, etc., as shown in FIG. 21, in which the areas where the conductive layer 41, the insulating layer 42 and the sacrificial member 43 are removed are opened. In the cell area CA, the mask REG in this process is formed to cover the portion where the conductive layer 21 is formed, the source connection region SCR, and the source penetration region SPR.

Then, as shown in FIG. 16, by anisotropic etching using the formed mask REG, the conductive layer 41, the insulating layer 42 and the sacrificial member 43, corresponding to the openings of the mask REG, are removed. In the etching of this process, a part of the insulating layer (e.g., insulating layer 51) provided below the conductive layer 41 may be removed. After the conductive layer 41, the insulating layer 42, and the sacrificial member 43 are processed, the mask REG is removed.

Figure 23:
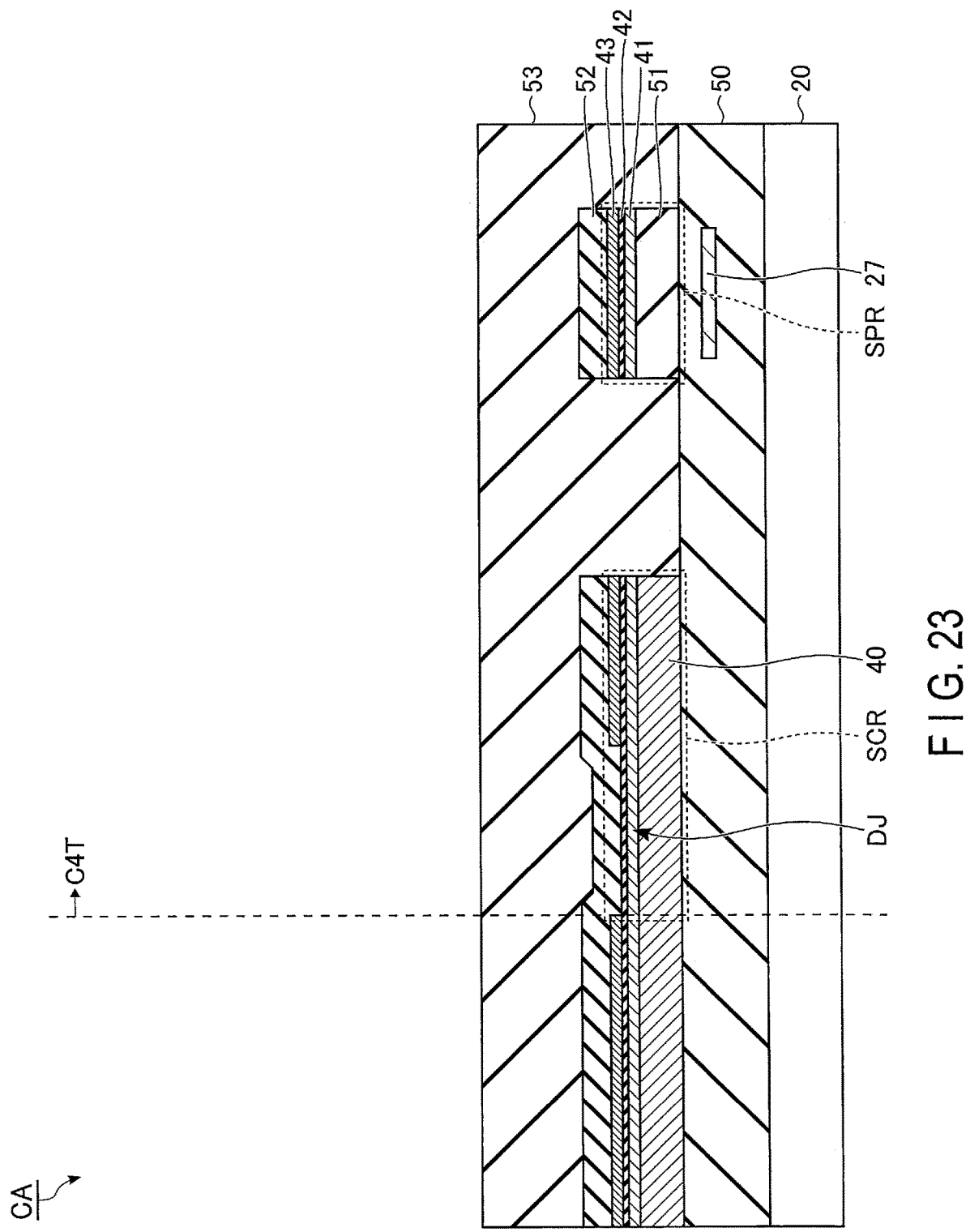
FIGS. 23, 24, 25, and 26 are cross-sectional views of the memory cell array each showing an example of a cross-section structure during the manufacturing process of the semiconductor memory device according to the first embodiment.
Figure 24:
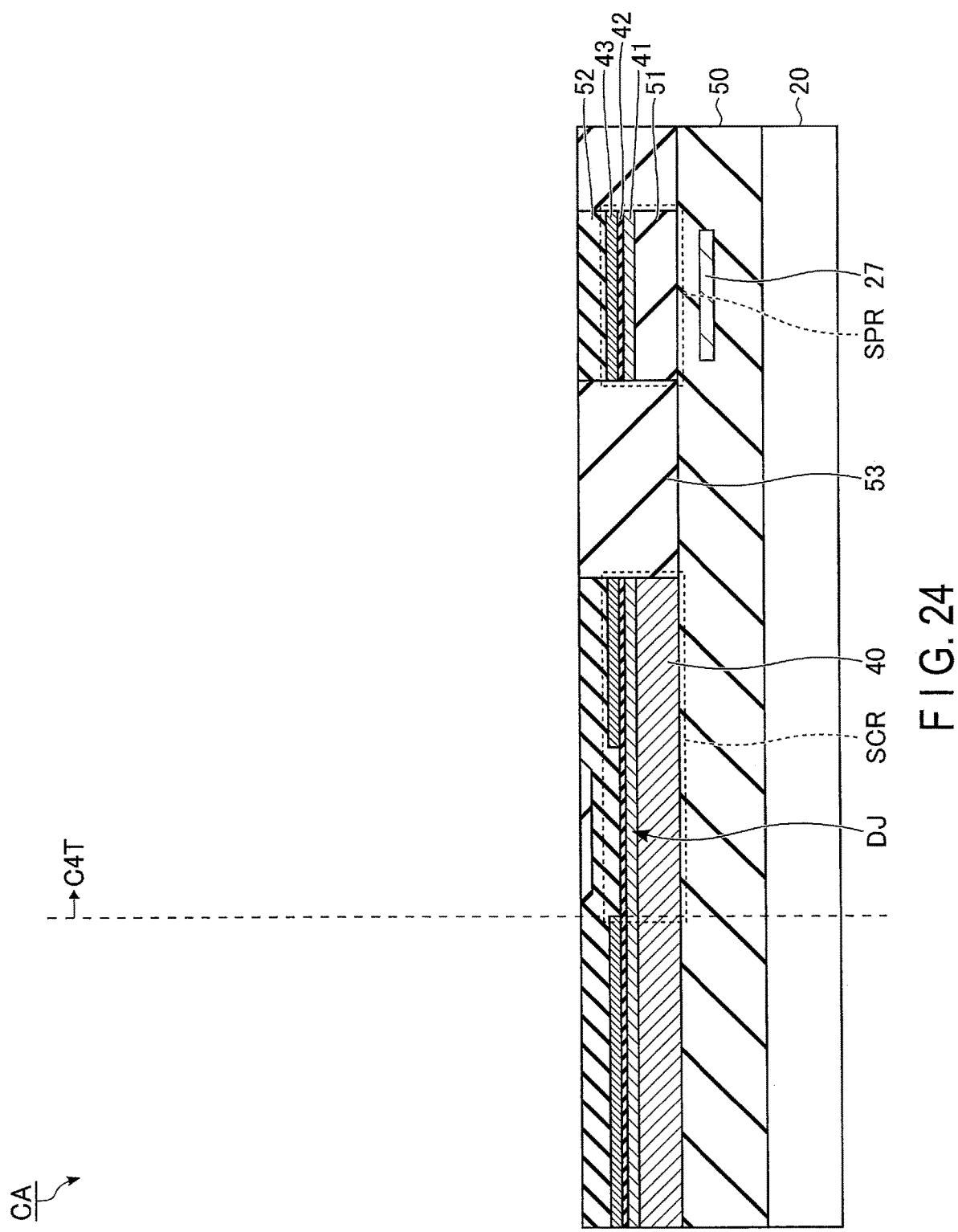
Figure 25:
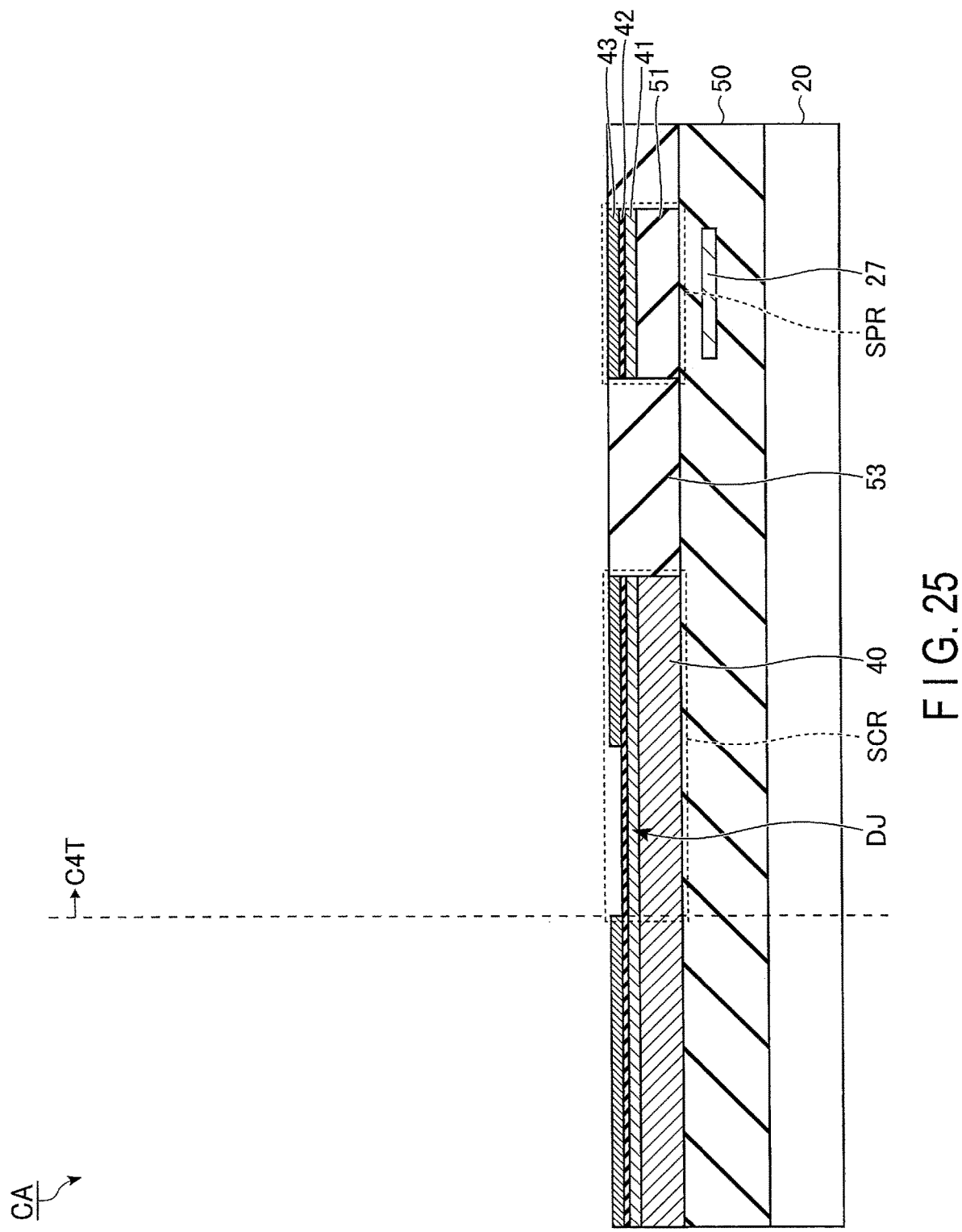

Thereafter, as shown in FIG. 23, the insulating layer 53 is filled up in the portion where the conductive layer 41, the insulating layer 42, and the sacrificial member 43 are removed. The insulating layer 53 above the passivation film 52 is removed, as shown in FIG. 24, by chemical mechanical polishing (CMP) using the passivation film 52 as a stopper, for example. Then, the passivation film 52 is removed, as shown in FIG. 25, by wet etching, for example. During this etching, a part of the insulating layer 53 is removed, and the top surface of the sacrificial member 43 and that of the insulating layer 53 are aligned with each other.

Next, in the process of step S105, the conductive layers 45 and 22 are formed. Specifically, first, the insulating layer 44 and the conductive layer 45 are formed in order on the exposed portion of the insulating layer 42, the sacrificial member 43, and the insulating layer 53. Then, the insulating layer 54, the conductive layer 22, and the insulating layer 55 are formed in order on the conductive layer 45. The insulating layer 44, the conductive layer 45, the insulating layer 54, and the conductive layer 22 formed in this process each include a concave part, i.e., a step, in the dividing section DJ. The top surface of the insulating layer 55 is planarized by, for example, CMP.

Figure 26:
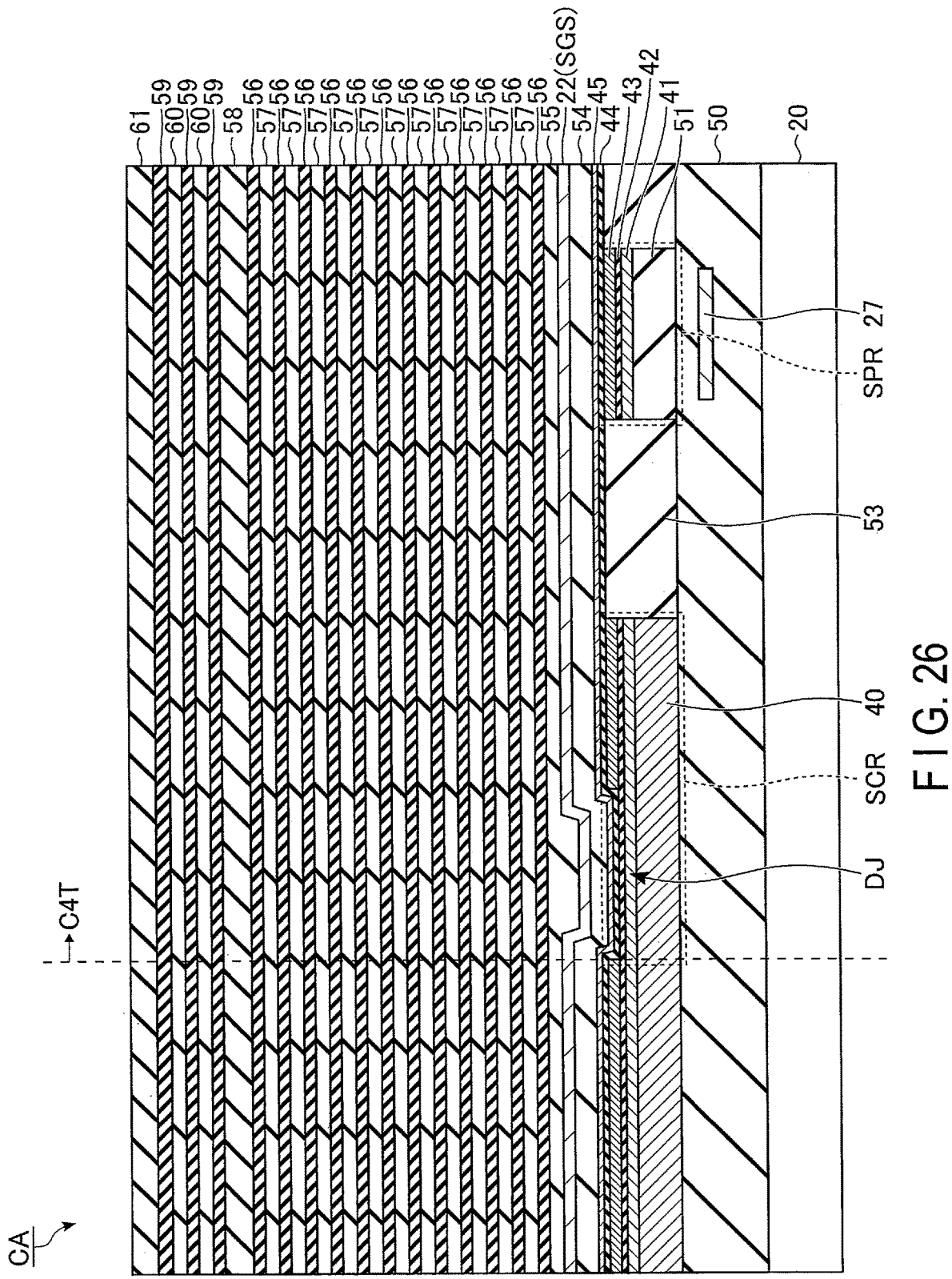

Next, in the process of step S106, the sacrificial members 56 and 59 of the stacked interconnect section are formed as shown in FIG. 26. Specifically, first, the sacrificial member 56 and the insulating layer 57 are alternatively arranged on the insulating layer 55, and the insulating layer 58 is formed on the uppermost sacrificial member 56. Then, the sacrificial member 59 and the insulating layer 60 are alternatively arranged on the insulating layer 58, and the insulating layer 61 is formed on the uppermost sacrificial member 59.

The insulating layers 57, 58, 60, and 61 each contain, for example, silicon oxide. For example, the number of sacrificial members 56 corresponds to the number of word lines WL penetrated by the memory pillar MP. The number of sacrificial members 59 corresponds to the number of select gate lines SGD penetrated by the memory pillar MP. The sacrificial members 56 and 59 contain, for example, silicon nitride. The sacrificial members 56 and 59 are processed in such a manner that the end portions thereof are formed stepwise in the hookup area HA (not shown).

Next, in the process of step S107, the slit SHE is formed. Specifically, first, a mask is formed by photolithography, etc. in which an area corresponding to the slit SHE is opened. Then, the slit SHE is formed by anisotropic etching using the formed mask. Then, the slit SHE is filled up with an insulator. The slit SHE formed in this process divides the sacrificial members 59 stacked in the cell area CA. The bottom of the slit SHE is, for example, terminated in the layer in which the insulating layer 58 is formed. The anisotropic etching in this process is, for example, reactive ion etching (RIE).

Figure 27:
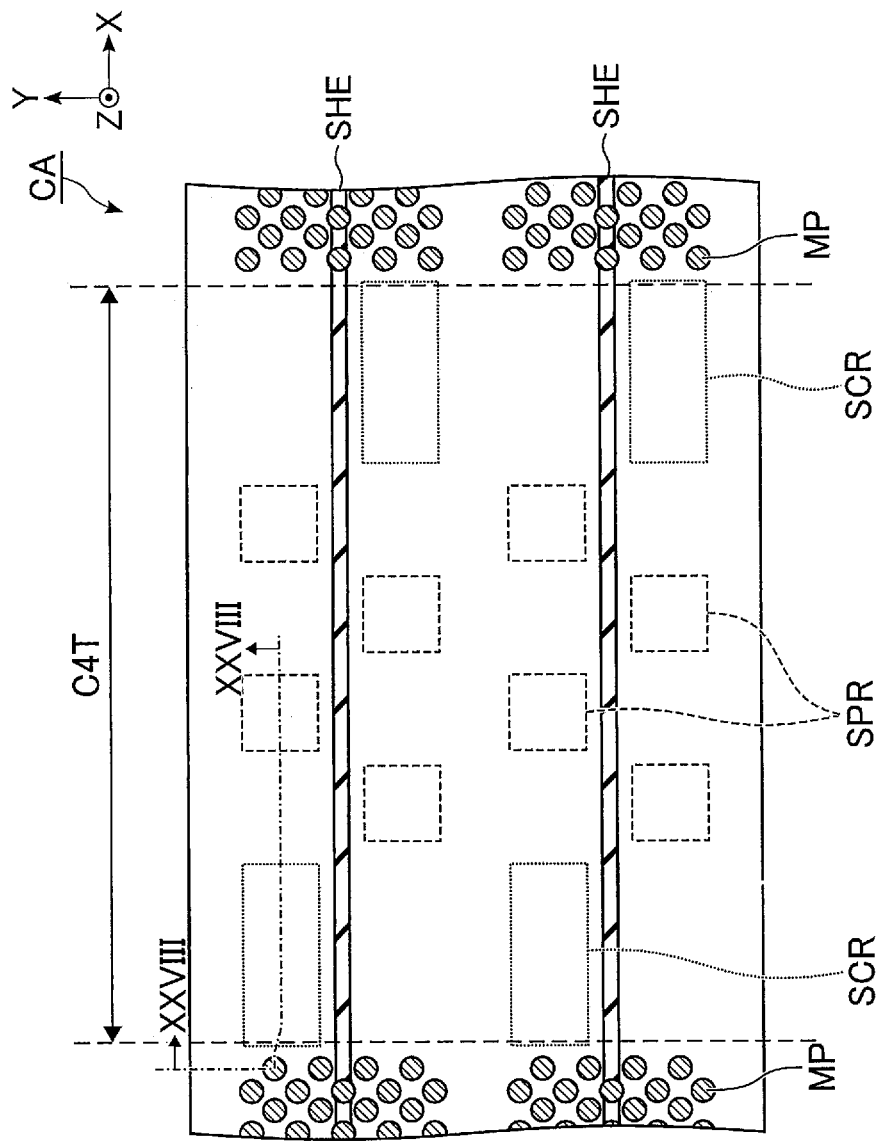
FIG. 27 is a plane view of the memory cell array showing an example of a planar layout during the manufacturing process of the semiconductor memory device according to the first embodiment.
Figure 28:
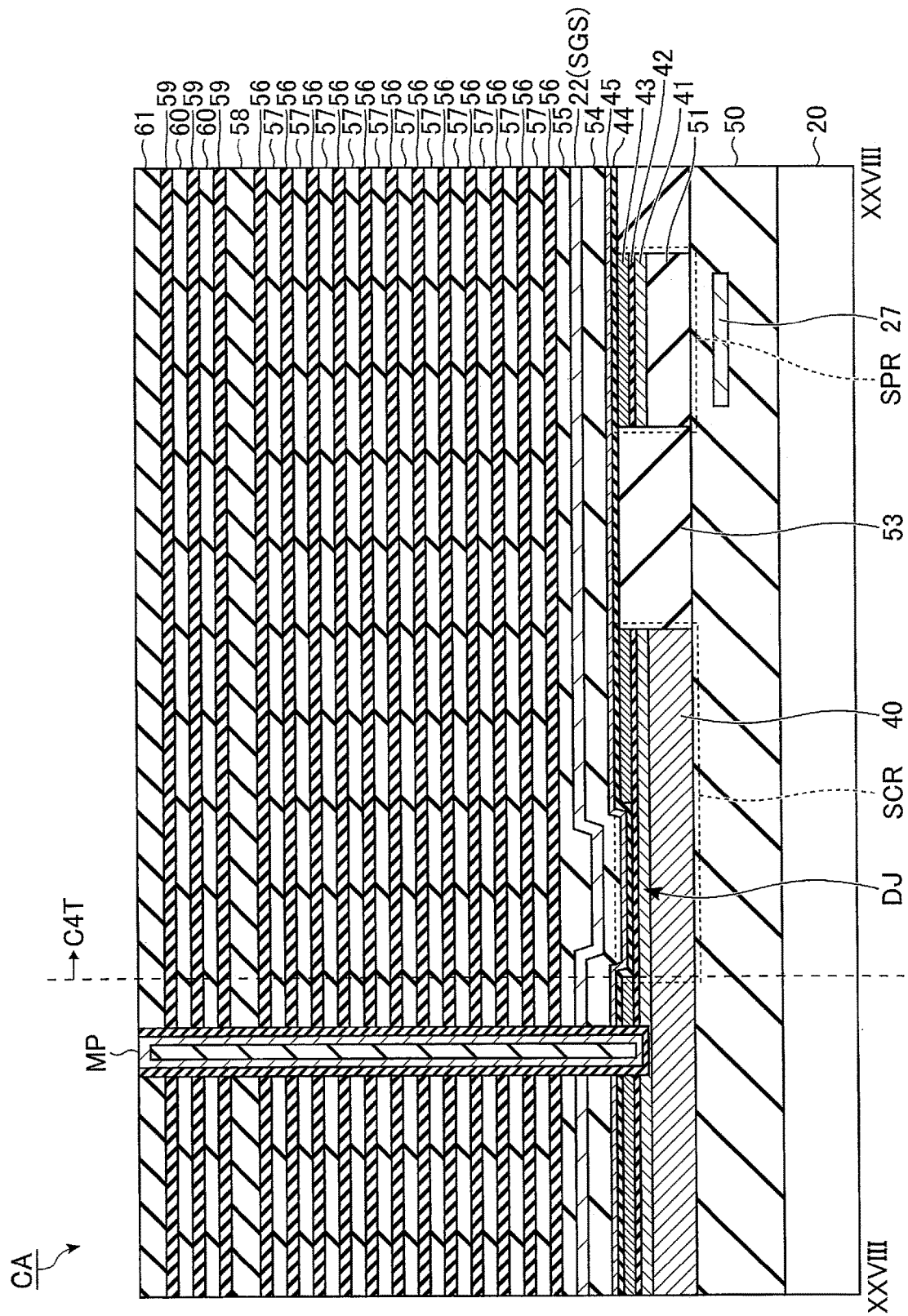
FIG. 28 is a cross-sectional view of the memory cell array, taken along line XXVIII-XXVIII of FIG. 27, showing an example of a cross-section structure during the manufacturing process of the semiconductor memory device according to the first embodiment.

Next, in the process of step S108, the memory pillar MP is formed as shown in FIGS. 27 and 28. Specifically, first, a mask is formed by photolithography, etc. in which an area corresponding to the memory pillar MP is opened. Then, by anisotropic etching using the formed mask, the memory hole is formed.

The memory hole formed in this process penetrates the insulating layers 42, 44, 54, 55, 57, 58, 60 and 61, the conductive layers 45 and 22, and the sacrificial members 43, 56 and 59, and at the bottom of the memory hole, for example, a part of the conductive layer 41 is exposed. The bottom of the memory hole may reach the conductive layer 40. The anisotropic etching in this process is, for example, RIE.

The block insulation film 35, the insulation film 34, the tunnel insulation film 33, the semiconductor layer 31, and the core member 30 are formed in order on the side and bottom surfaces of the memory hole and the top surface of the insulating layer 61, and the memory hole is filled up with the core member 30. Then, a part of the core member 30 formed above the memory hole is removed, and the space is filled up with a semiconductor member.

The block insulation film 35, the insulation film 34, the tunnel insulation film 33, and the semiconductor layer 31 that remain above the insulating layer 61 in this process are removed by, for example, CMP. In this manner, the structure corresponding to the memory pillar MP is formed in the memory hole. After the memory pillar MP is formed, for example, the insulating layer 62 is formed above the top surface of the memory pillar MP and the insulating layer 61. The insulating layer 62 contains, for example, silicon oxide.

Figure 29:
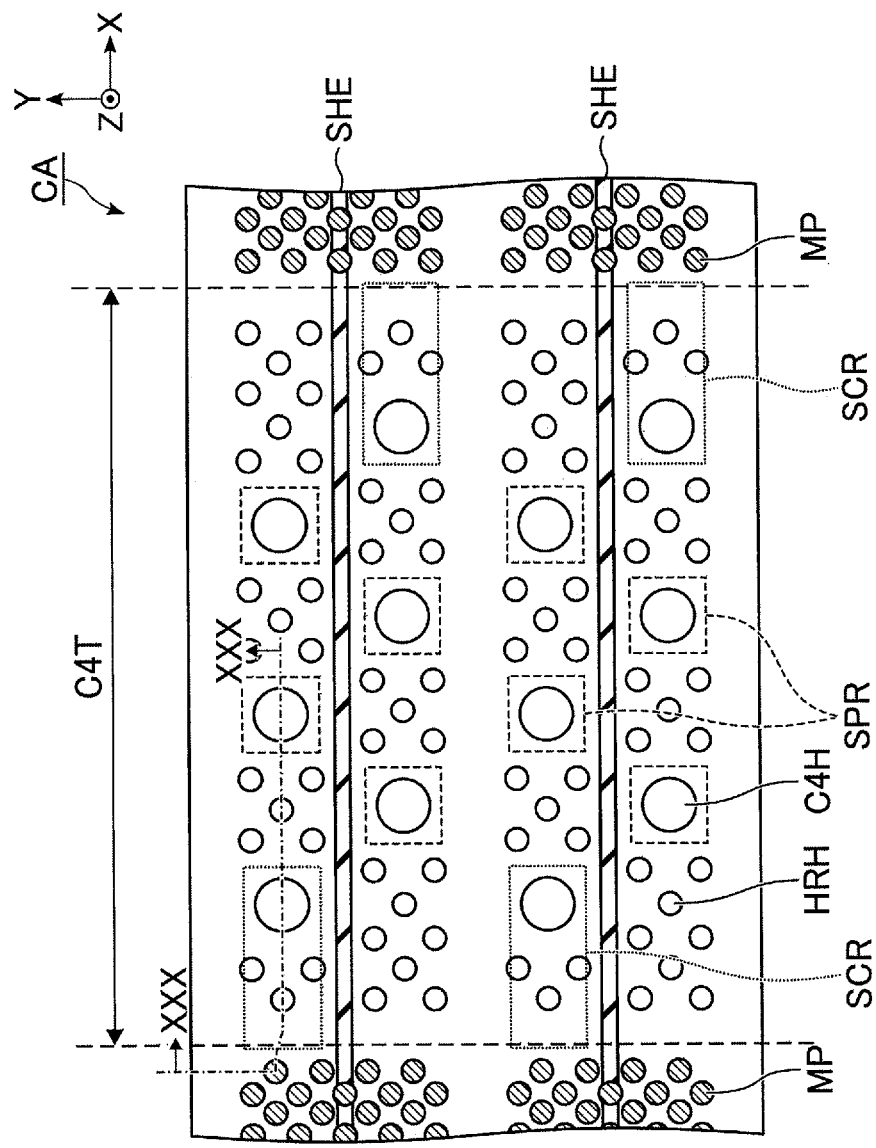
FIG. 29 is a plane view of the memory cell array showing an example of a planar layout during the manufacturing process of the semiconductor memory device according to the first embodiment.
Figure 30:
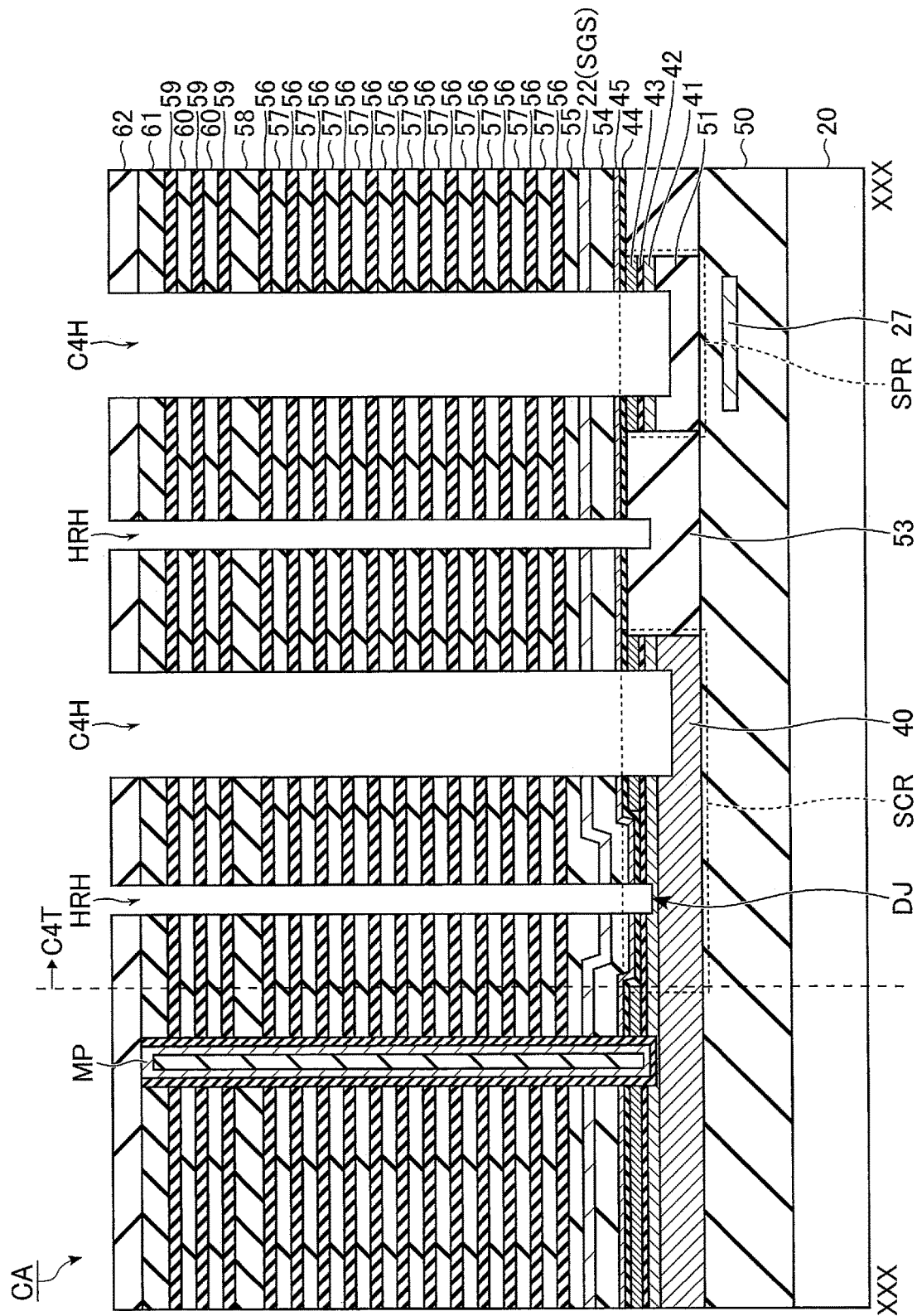
FIG. 30 is a cross-sectional view of the memory cell array, taken along line XXX-XXX of FIG. 29, showing an example of a cross-section structure during the manufacturing process of the semiconductor memory device according to the first embodiment.

Next, in the process of step S109, the support pillar HR and the contact C4 are formed. Specifically, first, a mask is formed by photolithography, etc. in which an area corresponding to the support pillar HR and the contact C4 is opened. Then, by anisotropic etching using the formed mask, the holes HRH and C4H formed as shown in FIGS. 29 and 30. The hole HRH corresponds to the area where the support pillar HR is formed. The hole C4H corresponds to the area where the contact C4 is formed.

The holes HRH and C4H formed in this process each penetrate the insulating layers 44, 54, 55, 57, 58, 60, 61 and 62, the conductive layers 45 and 22, and the sacrificial members 56 and 59. The inner diameter of the hole C4H is larger than that of the hole HRH, and etching progress of the hole C4H is faster. For example, in the source connection region SCR, the bottom of the hole HRH is terminated in the layer in which the conductive layer 41 is provided, and the hole C4H is terminated in the layer in which the conductive layer 40 is formed. In the source penetration region SPR, the hole C4H is terminated in the layer in which the insulating layer 51 is formed. In the regions other than the regions SCR and SPR in the penetration contact region C4T, the bottom of the hole HRH is terminated in the layer in which the insulating layer 53 is formed.

Figure 31:
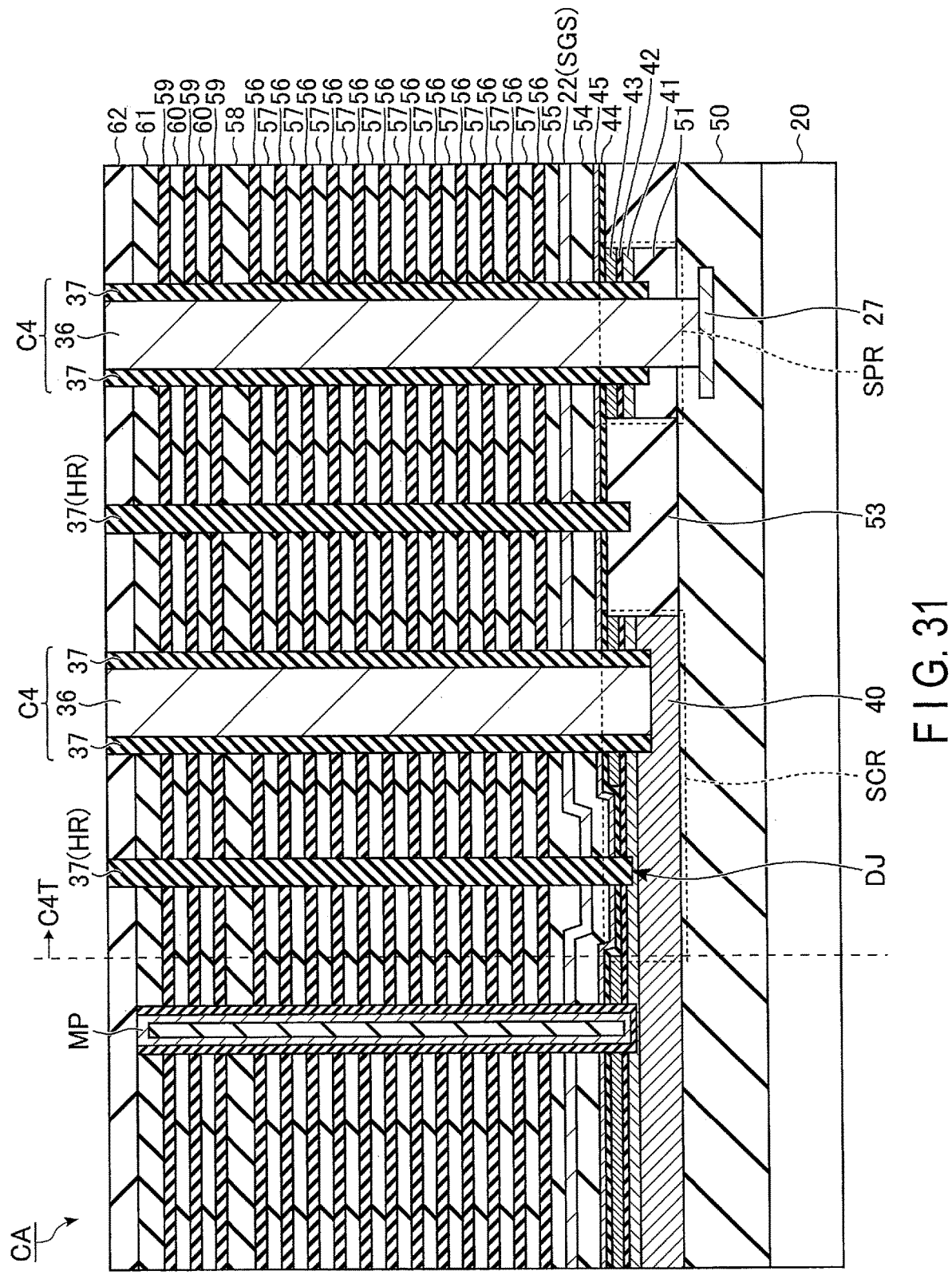
FIG. 31 is a cross-sectional view of the memory cell array showing an example of a cross-section structure during the manufacturing process of the semiconductor memory device according to the first embodiment.

Thereafter, the insulating layer 37 is formed on the side and bottom surfaces of the hole C4H and inside the hole HRH, and the inside of the hole HRH is filled up with the insulating layer 37. A part of the insulating layer 37 formed at the bottom of the hole C4H is removed by etching back so that the surface of the conductive layer 40, for example, is exposed at the bottom of the hole C4H in the source connection region SCR, and the surface of the conductive layer 27 is exposed at the bottom of the hole C4H in the source penetration region SPR. Then, the hole C4H is filled up with the conductive layer 36. The conductive layer 36 formed outside the hole C4H is removed by, for example, CMP. In this manner, the support pillar HR and the contact C4 are formed as shown in FIG. 31. After the support pillar HR and the contact C4 are formed, the insulating layer 63, for example, is formed on the top surfaces of the support pillar HR and the contact C4 and on the insulating layer 62. The insulating layer 63 contains, for example, silicon oxide.

Figure 32:
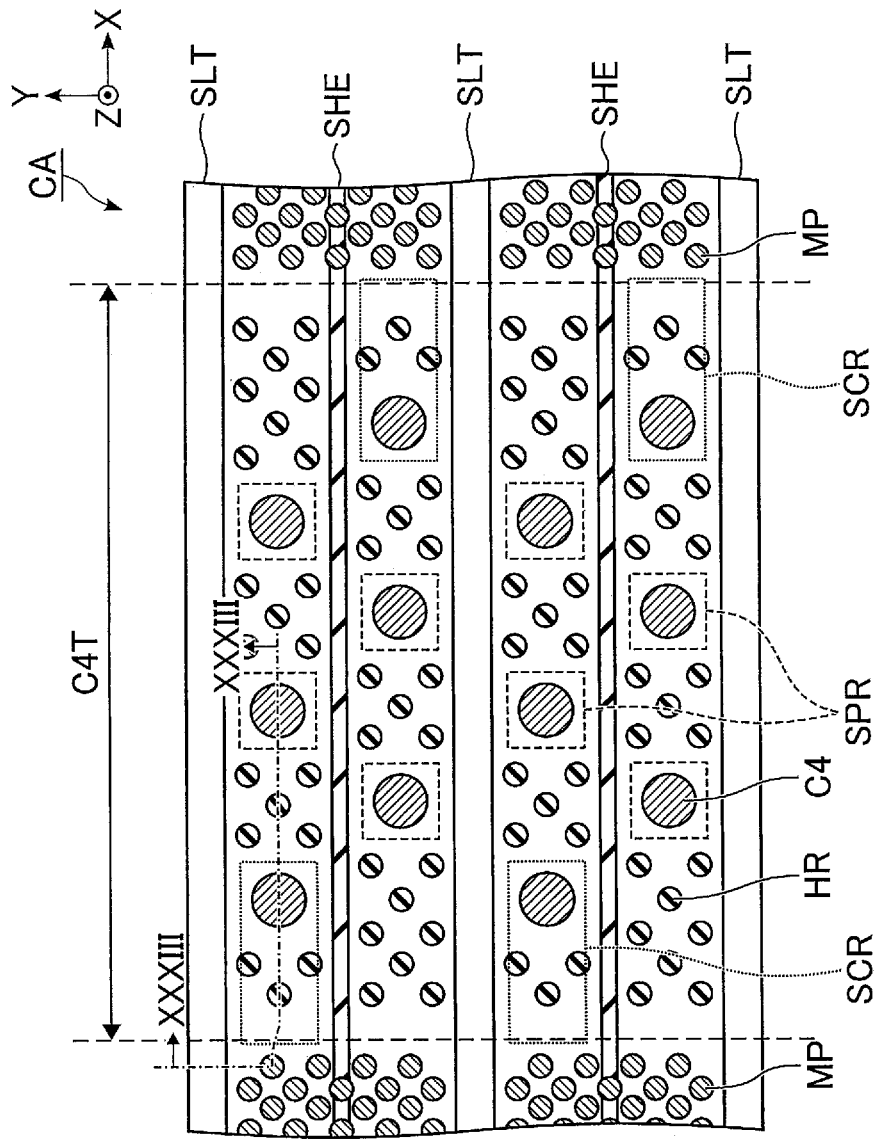
FIG. 32 is a cross-sectional view of the memory cell array showing an example of a planar layout during the manufacturing process of the semiconductor memory device according to the first embodiment.
Figure 33:
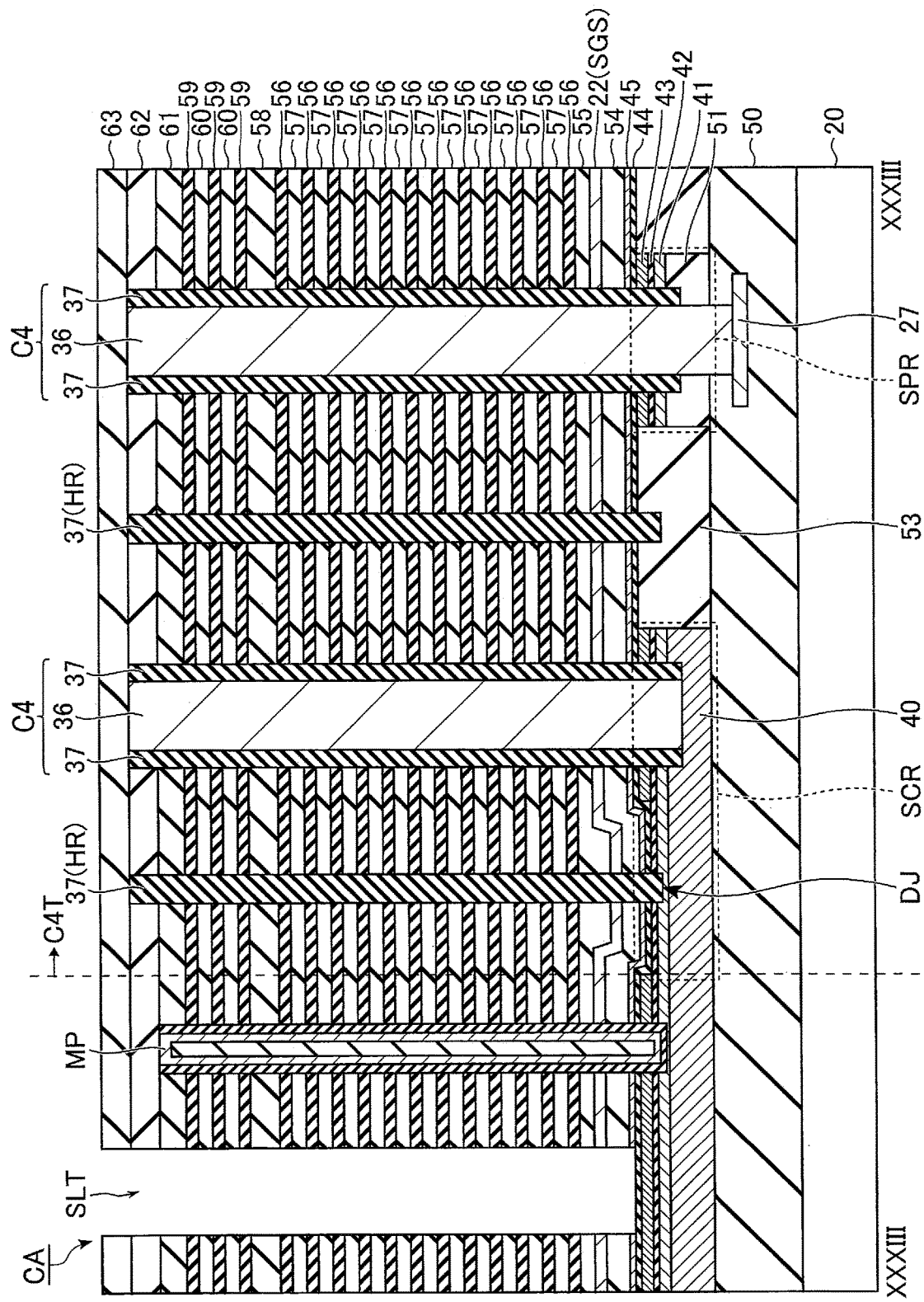
FIG. 33 is a cross-sectional view of the memory cell array, taken along line XXXIII-XXXIII of FIG. 32, showing an example of a cross-section structure during the manufacturing process of the semiconductor memory device according to the first embodiment.

Next, in the process of step S110, slits SLT shown in FIGS. 32 and 33 are formed. Specifically, first, a mask is formed by photolithography, etc. in which areas corresponding to the slits SLT1, SLT2 and SLT3 are opened. Then, by anisotropic etching using the formed mask, the slits SLT are formed.

The slit SLT formed in this process divides the insulating layers 54, 55, 57, 58, 60, 61, 62 and 63, the conductive layers 45 and 22, and the sacrificial members 56 and 59. The bottom of the slit SLT is terminated in the layer in which the insulating layer 44, for example, is formed. The anisotropic etching in this process is, for example, RIE.

Figure 34:
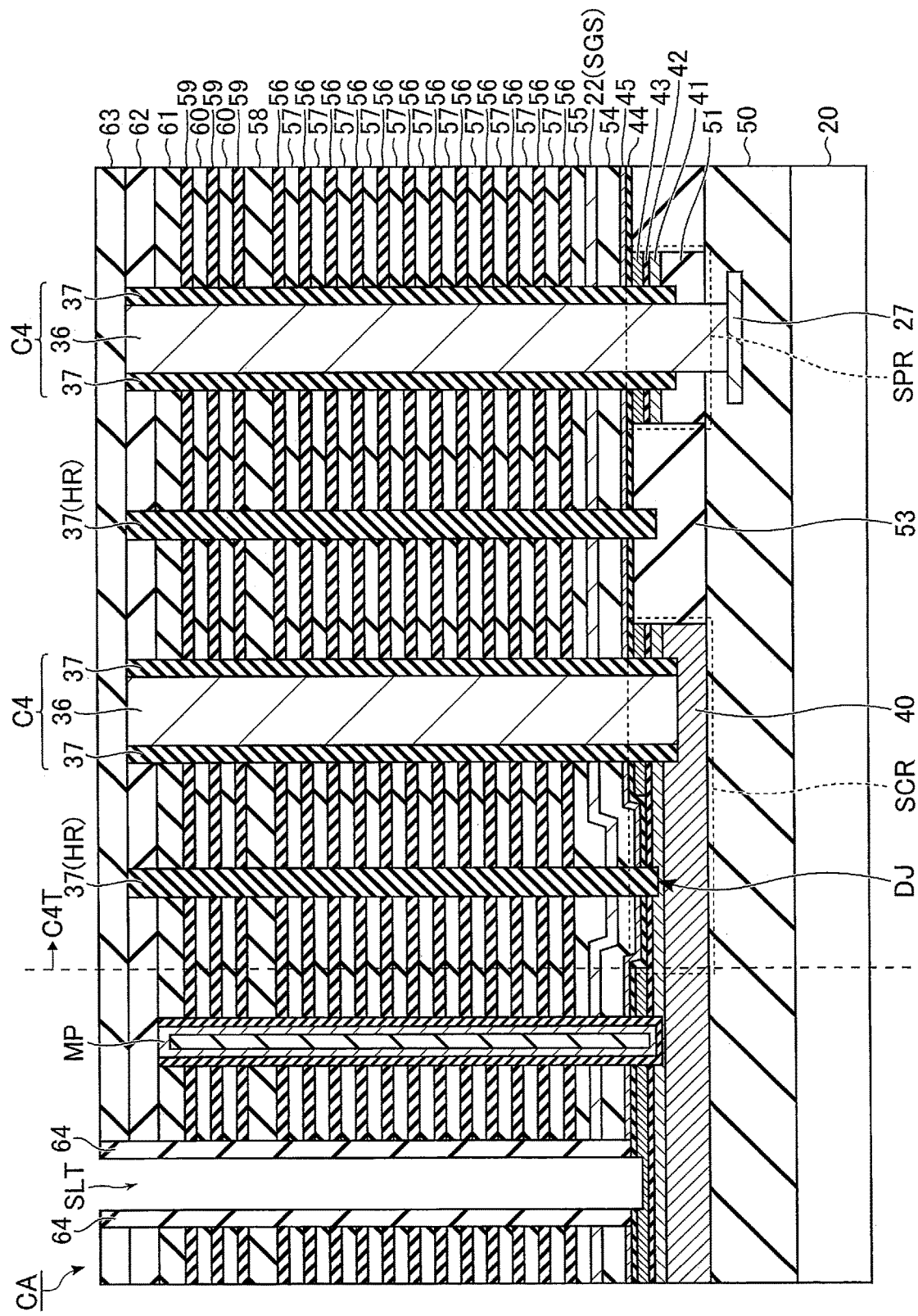
FIGS. 34, 35, 36, 37, and 38 are cross-sectional views of the memory cell array each showing an example of a cross-section structure during the manufacturing process of the semiconductor memory device according to the first embodiment.

Next, in the process of step S111, the replacement process of the source line section is performed. Specifically, the passivation film 64 is formed on the top surface of the insulating layer 63 and the inner wall of the slit SLT. For the passivation film 64, silicon nitride is formed, for example. By etching back, the passivation film 64 formed on the top surface of the insulating layer 63 and the bottom of the slit SLT is removed, and the insulating layer 44 exposed at the bottom of the slit SLT is also removed. Thereby, as shown in FIG. 34, the side wall of silicon nitride is formed on the side surface of the slit SLT, and a part of the sacrificial member 43 is exposed at the bottom of the slit SLT.

Figure 35:
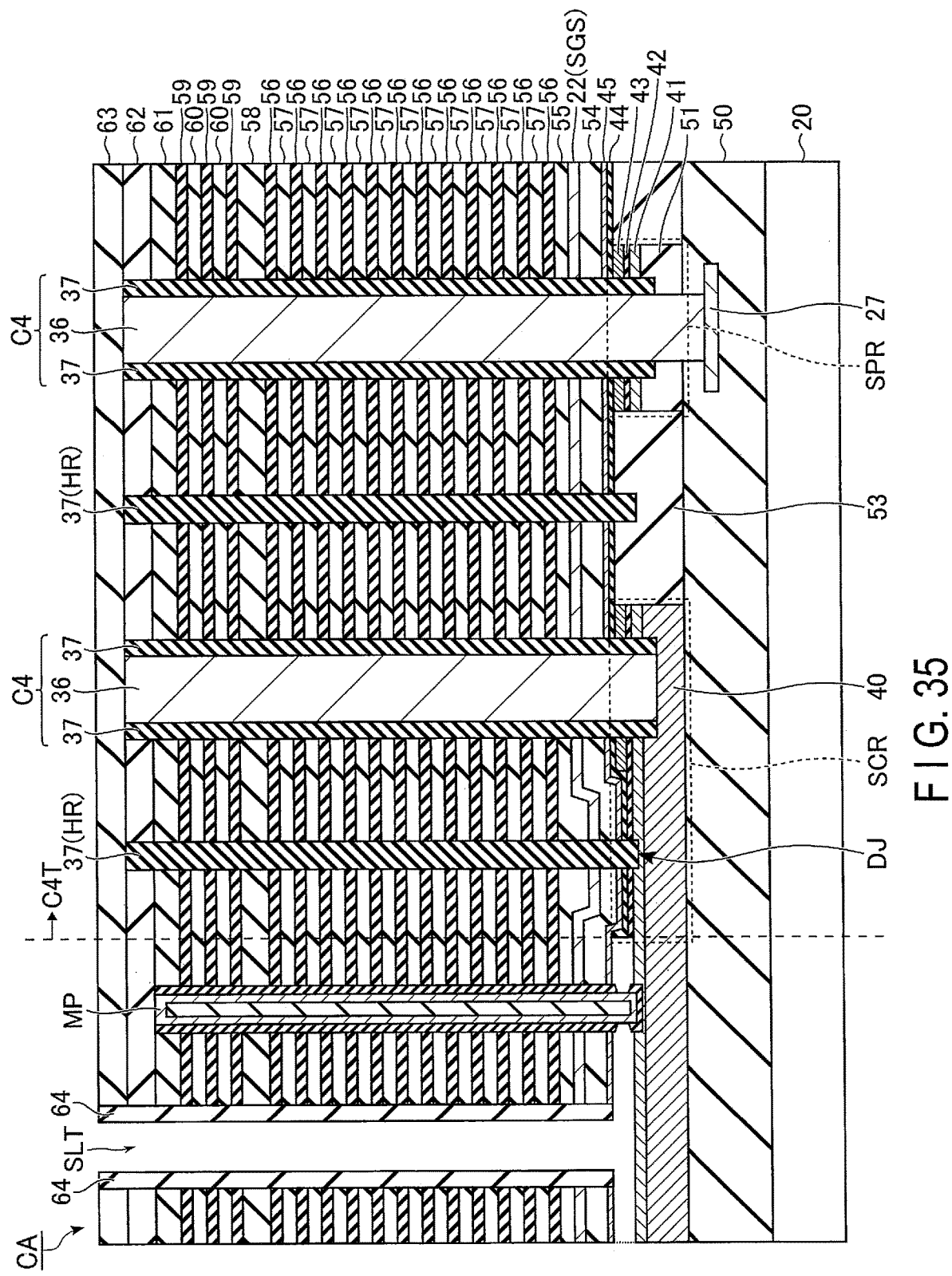

By performing etching through the slit SLT, the sacrificial member 43 is selectively removed. Next, a part of each of the block insulation film 35, the insulation film 34 and the tunnel insulation film 33 at the lower end of the memory pillar MP is removed. As a result, as shown in FIG. 35, a part of the side surface of the semiconductor layer 31 is exposed at the lower end of the memory pillar MP. In this etching, the insulating layers 42 and 44 are removed as well.

The space obtained by removal of the sacrificial member 43 is maintained by a plurality of memory pillars MP. In the source connection region SCR, since the sacrificial member 43 is divided in the dividing section DJ, the sacrificial member 43 remains. In the source penetration region SPR, since the sacrificial member 43 and the slit SLT are separated by the insulating layer 53, the sacrificial member 43 remains.

Figure 36:
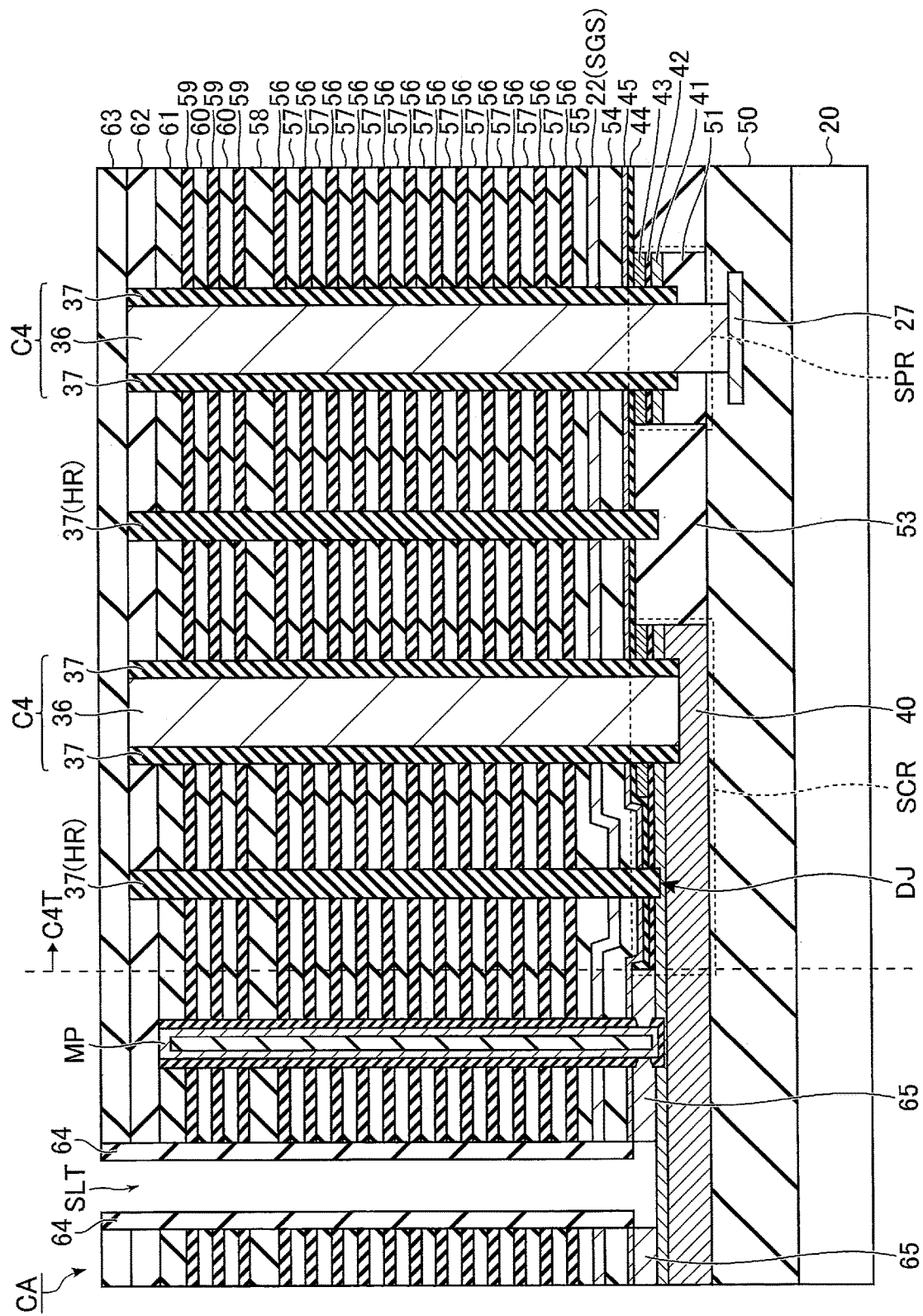

Thereafter, as shown in FIG. 36, the conductive layer 65 is formed. Specifically, by CVD, for example, the conductive layer 65 is formed in the space obtained by removing a part of each of the sacrificial member 43, the block insulation film 35, the insulation film 34, the tunnel insulation film 33, and the insulating layers 42 and 44. Etching back is then performed. As a result, the semiconductor layer 31 of the memory pillar MP and the conductive layers of the source line section (e.g., a group of the conductive layers 40, 41, 65 and 45) are electrically coupled. For the conductive layer 65, polysilicon with phosphorus doped therein is formed. The stacked structure of the conductive layers 40, 41, 65 and 45 in the cell area CA corresponds to the conductive layer 21 shown in FIG. 11.

Figure 37:
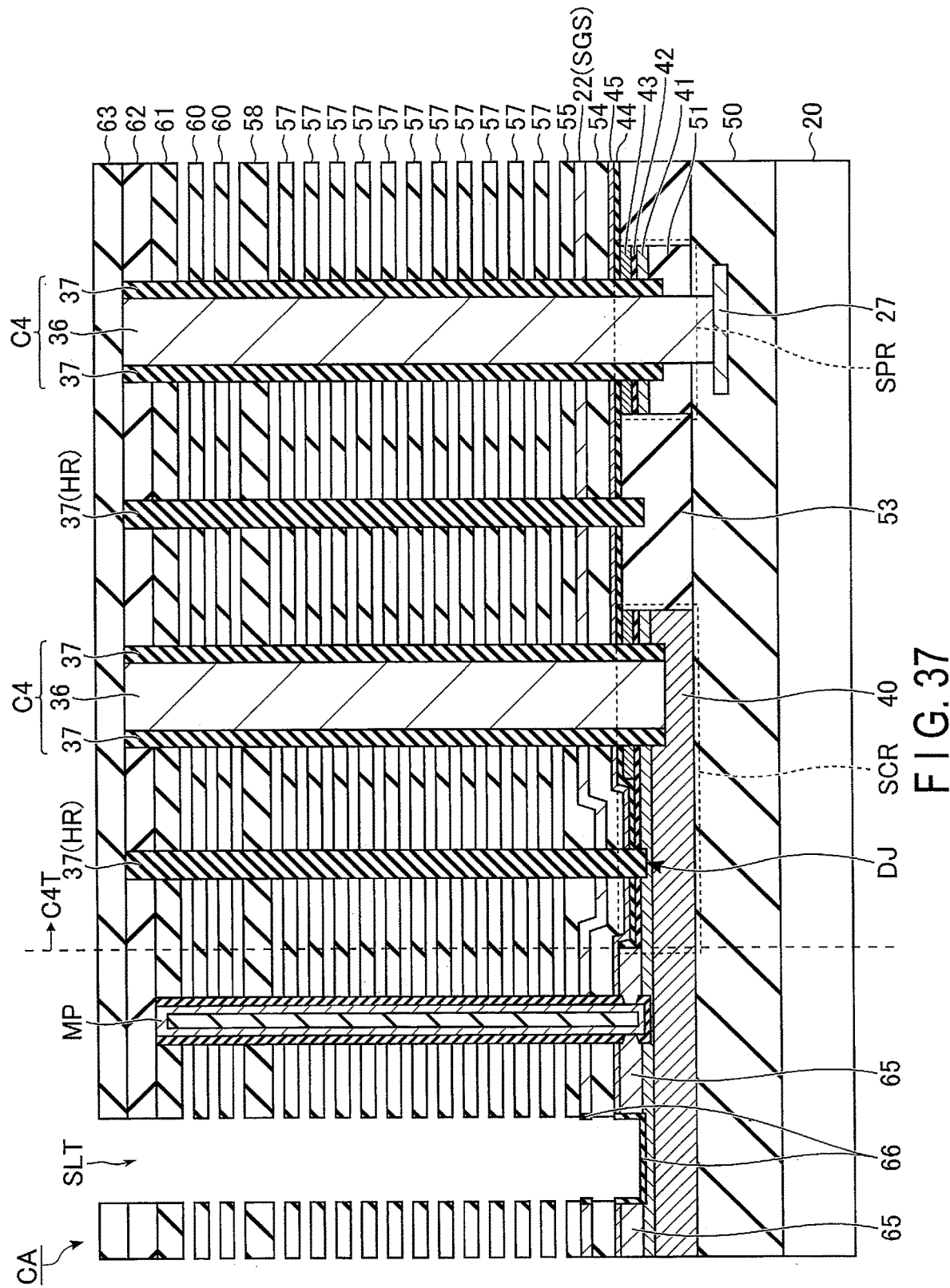

Next, in the process of step S112, the replacement process of the stacked interconnect section is performed. Specifically, first, the passivation film 64 in the slit SLT is removed, and the surfaces of the conductive layers 22, 41, 45 and 65 (e.g., polysilicon film) exposed in the slit SLT are oxidized. Thereby, the oxidized passivation film 66 is formed. The sacrificial members 56 and 59 are selectively removed, as shown in FIG. 37, by wet etching using thermal phosphoric acid. In the structure in which the sacrificial members 56 and 59 are removed, the three-dimensional configuration thereof is maintained by a plurality of memory pillars MP, support pillars HR, contacts C4, etc.

Figure 38:
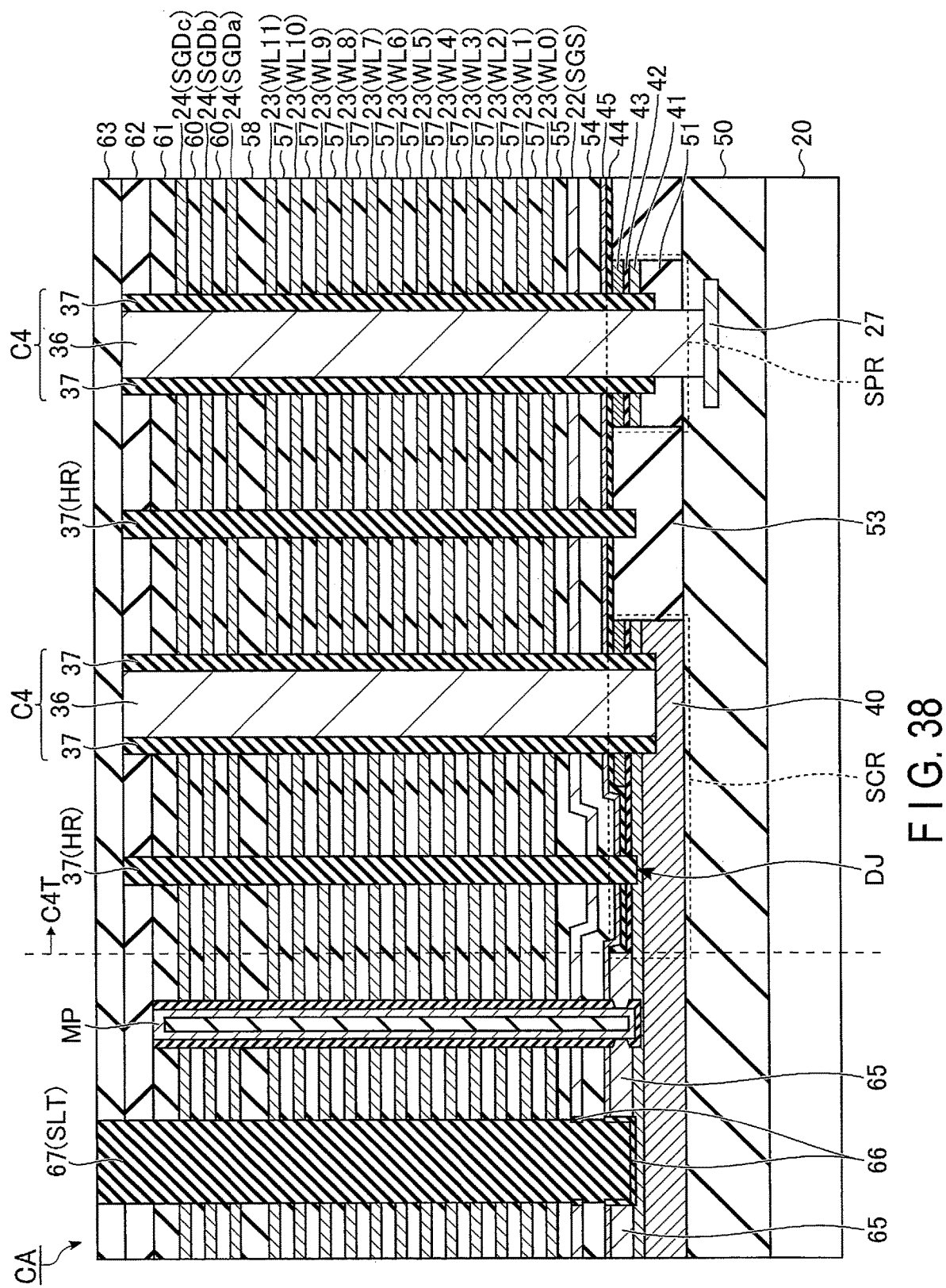

Then, as shown in FIG. 38, the conductor is filled up through the slit SLT in the space obtained by removing the sacrificial members 56 and 59. For the formation of the conductor in this process, CVD is used, for example. Thereafter, the conductor inside the slit SLT and on the top surface of the insulating layer 63 is removed by etching back processing. In this process, the conductors formed in the adjacent interconnect layers may be separate, at least in the slit SLT.

Thereby, the conductive layers 23 corresponding respectively to word lines WL0 to WL11 and the conductive layers 24 corresponding respectively to select gate lines SGDa, SGDb and SGDc are formed. The conductive layers 23 and 24 formed in this process may contain a barrier metal.

In this case, in forming the conductor after the sacrificial members 56 and 59 are removed, tungsten is formed following the formation of titanium nitride as a barrier metal, for example.

Next, in the process of step S113, as shown in FIG. 38, the insulating layer 67 is formed in the slit SLT. In this process, the insulating layer 67 formed above the insulating layer 63 is removed by, for example, CMP, and the upper portions of the insulating layers 63 and 67 are planarized.

By the above-described manufacturing processes of the semiconductor memory device 1 according to the first embodiment, the memory pillar MP, the source line SL coupled to the memory pillar MP, the word lines WL, and the select gate lines SGDa, SGDb, SGDc and SGS are formed. The conductive layers 40, 41, 45 and 65 corresponding to the source line section may be integrally formed depending on the materials to be used. In other words, in the completed semiconductor memory device 1, the boundaries of the conductive layers 40, 41, 45 and 65 may not be seen. The manufacturing processes have been described as an example, and other processes may be inserted between the processes described. The conductive layer 36 in the contact C4 may be formed after the replacement process of the stacked interconnect section is performed. In this case, for example, the hole C4H is filled up with the sacrificial member after the hole C4H is formed and before the slit SLT is formed.

[1-3] Advantages of First Embodiment

The semiconductor memory device 1 according to the first embodiment described above makes it possible to improve the yield of the semiconductor memory device 1. The following is a detailed description of the advantages of the semiconductor memory device 1 according to the first embodiment, with reference to the comparative example.

The semiconductor memory device with three-dimensionally stacked memory cells is provided with the stacked interconnect including, for example, the source line SL, select gate line SGS, the word lines WL, and the select gate line SGD, above the semiconductor substrate. The memory pillar MP is provided to penetrate the stacked interconnects above the source line SL, and is electrically coupled to the source line SL arranged in the lowermost layer. In the semiconductor memory device, there is a case where the interconnect for applying the voltage to the source line SL is provided below the memory cell array, i.e., between the semiconductor substrate and the source line SL.

For example, if the source line SL and the interconnect below the memory cell array are electrically coupled, the contact C4 coupled to the source line SL and penetrating the stacked interconnect above the source line SL is used as well as the contact C4 coupled to the interconnect below the memory cell array and penetrating the stacked interconnect including the source line SL. These contacts C4 are arranged in the penetration contact region C4T in the cell area CA, for example. In the penetration contact region C4T, a plurality of support pillars HR are also arranged to maintain a three-dimensional configuration when the replacement process of the stacked interconnect is carried out.

Moreover, in the semiconductor memory device in which the source line SL is provided above the semiconductor substrate, the semiconductor layer 31 used as a channel in the memory pillar MP and the source line SL are coupled through the side surface of the memory pillar MP. If the source line SL and the semiconductor layer 31 are brought into contact with each other through the side surface of the memory pillar MP, for example, the replacement process of the source line section using the sacrificial member 43 is performed. The replacement process of the source line section is performed after formation of the memory pillars MP, the support pillars HR, and the contacts C4, and includes removing the sacrificial member 43 of the source line section through the slit SLT and a part of the laminated film 32 in the memory pillar MP to thereby expose the semiconductor layer 31 on the side surface of the memory pillar MP.

During the step of removing the sacrificial member 43 of the source line section, if the sacrificial member 43 at the lower portion of the memory pillar MP is insufficiently removed, this may lead to a failure in the coupling between the memory pillar MP and the source line SL. Thus, a sufficient margin is set for etching processing time. However, the increase in etching processing time for the sacrificial member 43 may result in removal of the sacrificial member 43 in the penetration contact region C4T (e.g., the source connection region SCR) formed continuous with the sacrificial member 43 at the lower portion of the memory pillar MP.

Figure 39:
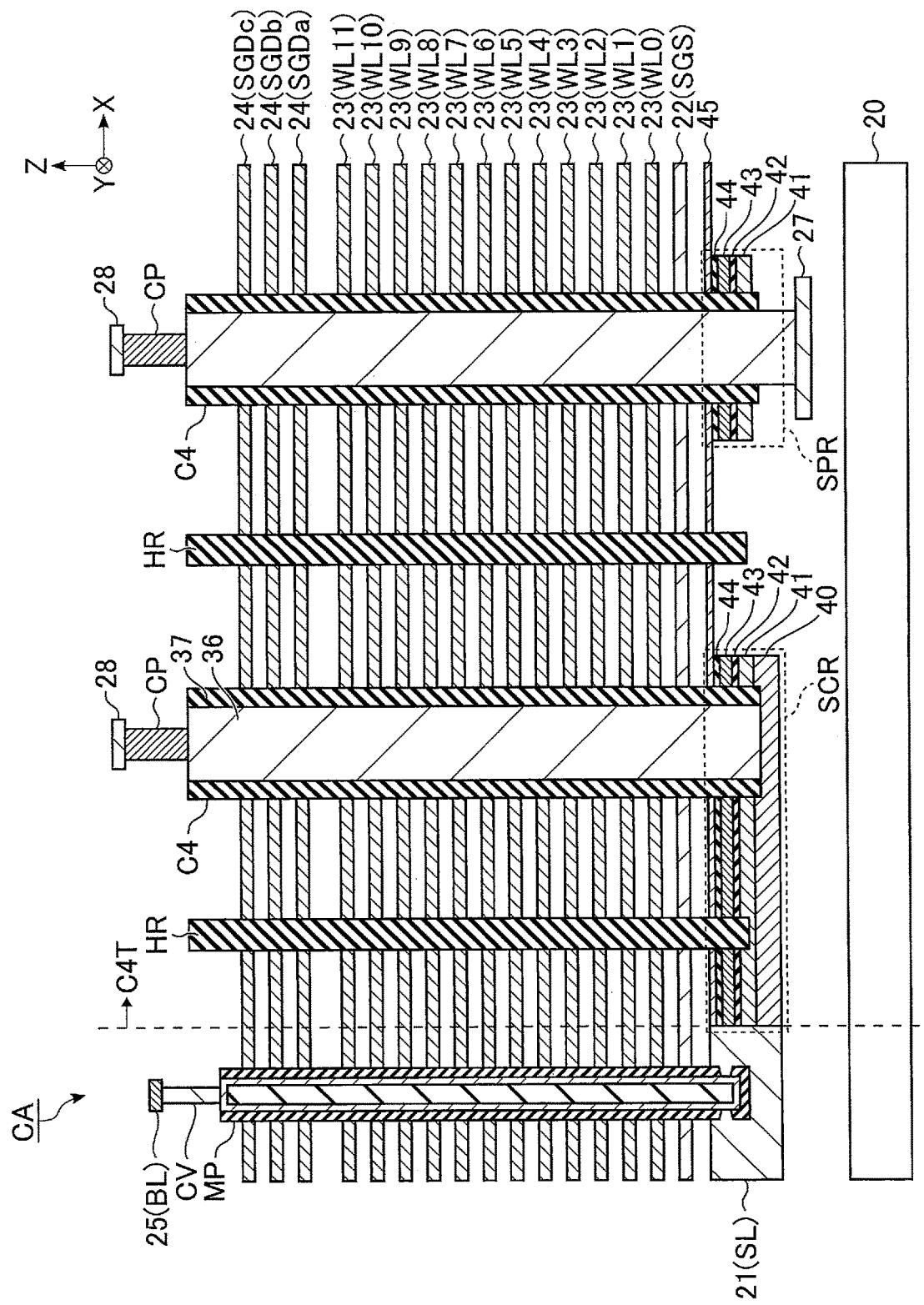
FIG. 39 is a cross-sectional view showing an example of a cross-sectional structure in a penetration contact region of a memory cell array included in a semiconductor memory device according to a comparative example of the first embodiment.

FIG. 39 shows an example of a cross-sectional structure in a penetration contact region C4T of a memory cell array 10 of a semiconductor memory device 1, according to a comparative example of the first embodiment. As shown in FIG. 39, the semiconductor memory device 1 according to the comparative example of the first embodiment has a structure in which the dividing section DJ, in the source connection region SCR of the semiconductor memory device 1 according to the first embodiment, is omitted. That is, in the comparative example of the first embodiment, the sacrificial member 43 in the source connection region SCR is continuous with the sacrificial member 43 in the area in which the memory pillar MP is formed.

In the semiconductor memory device 1 according to the comparative example of the first embodiment, if the sacrificial member 43 in the source connection region SCR is removed, the insulating members (e.g., insulating layer 37) in the support pillar HR and the contact C4 may be removed in the step of removing the laminated film 32. Specifically, etching of the insulating members formed in the support pillar HR and the contact C4 progresses faster than in that of a thin film such as the laminated film 32 in the memory pillar MP. For this reason, during the step of removing the laminated film 32, the insulating members in the holes HRH and C4H may be removed from the source line section up until the conductive layer 22 portion. If the insulating member is removed from the source line section to the conductive layer 22 portion, conductors may be formed at the lower portions of the holes HRH and C4H, and the source line SL and the select gate line SGS may be short-circuited.

In contrast, in the semiconductor memory device 1 according to the first embodiment, the sacrificial member 43 of the source connection region SCR is divided in the dividing section DJ, and the sacrificial member 43 in the source connection region SCR remains, without having been removed in the step of removing the sacrificial member 43 in the replacement process of the source line section. In the semiconductor memory device 1 according to the first embodiment, during the step of removing the laminated film 32, etching through the space obtained by removing the sacrificial member 43 does not progress in the dividing section DJ and the area in which the sacrificial member 43 is isolated.

In this manner, in the semiconductor memory device 1 according to the first embodiment, it is possible to suppress the progress of etching of the insulating members inside the support pillar HR and the contact C4 in the penetration contact region C4T. As a result, the method of manufacturing the semiconductor memory device 1 according to the first embodiment can suppress occurrence of a short circuit between the source line SL and the select gate line SGS, and can improve the yield of the semiconductor memory device 1.

The short circuit between the source line SL and the select gate line SGS in the penetration contact region C4T described above can also be suppressed by forming, in the comparative example, the hole HRH corresponding to the support pillar HR and the hole C4H corresponding to the contact C4 in separate steps, and terminating the bottom of the support pillar HR in the select gate line SGS (conductive layer 22). It is also possible to suppress occurrence of the short circuit between the source line SL and the select gate line SGS resulting from the contact C4 by setting, in the source connection region SCR, a longer path between the sacrificial member 43 at the lower portion of the memory pillar MP and the sacrificial member 43 at the lower portion of the contact C4.

However, in the comparative example, even if the hole HRH corresponding to the support pillar HR and the hole C4H corresponding to the contact C4 are formed in separate steps, there remains a risk that a short circuit occurs between the source line SL and the select gate line SGS resulting from the contact C4. Furthermore, if the processing of the holes HRH and C4H is carried out in separate steps, the manufacturing costs increase due to the increase in the manufacturing steps. In addition, if a long path is set between the sacrificial member 43 at the lower portion of the memory pillar MP and the sacrificial member 43 at the lower portion of the contact C4, the area of the penetration contact region C4T increases and the storage capacity per unit area of the semiconductor memory device 1 decreases.

In contrast, the method of manufacturing the semiconductor memory device 1 according to the first embodiment involves performing the processing of the holes HRH and C4H concurrently, and makes it possible to reduce the manufacturing steps as compared to when the holes HRH and C4H are processed in separate steps. Moreover, the semiconductor memory device 1 according to the first embodiment can achieve the advantages by only removing the sacrificial member 43 in the dividing section DJ, and can be realized without changing the layout of the penetration contact region C4T. Thus, the semiconductor memory device 1 according to the first embodiment can suppress the manufacturing costs.

In the first embodiment, the holes HRH and C4H are concurrently processed, but the method is not limited to this. For example, the holes HRH and C4H may be processed in separate steps, and processed concurrently with the memory hole corresponding to the memory pillar MP. In this case, assuming that the memory hole and the hole HRH have approximately equal inner diameters, the bottom of the support pillar HR and the bottom of the memory pillar MP are aligned with each other. When the memory hole and the hole HRH are processed concurrently, the advantages similar to the first embodiment can be achieved by removing the sacrificial member 43 in the dividing section DJ.

In the first embodiment, the sacrificial member 43 is removed in the dividing section DJ, but the method is not limited to this. For example, the sacrificial member 43 may be removed in the entire penetration contact region C4T in step S103. Even in such a case, in the step of removing the laminated film 32, it is possible to suppress a risk that the insulating members in the support pillar HR and the contact C4 are removed, and to achieve the advantages similar to that of the first embodiment. The semiconductor memory device 1 can achieve the advantages similar to those of the first embodiment, at least when the path between the sacrificial member 43 at the lower portion of the memory pillar MP and the sacrificial member 43 at the lower portion of the support pillar HR is divided from the path between the sacrificial member 43 at the lower portion of the memory pillar MP and the sacrificial member 43 at the lower portion of the contact C4.

[2] Second Embodiment

The second embodiment relates to the method of manufacturing the semiconductor memory device 1 for suppressing defects in an intersection of slits SLT. In the following, a description will be given of differences between the semiconductor memory device 1 according to the second and that of the first embodiment.

[2-1] Configuration of Semiconductor Memory Device 1

FIG. 40 shows a configuration example of the semiconductor memory device 1 according to the second embodiment. As shown in FIG. 40, the semiconductor memory device 1 according to the second embodiment includes planes PL1 and PL2. The plane PL1 includes a memory cell array 10A, a row decoder module 15A, and a sense amplifier module 16A, while the plane PL2 includes a memory cell array 10B, a row decoder module 15B, and a sense amplifier module 16B.

The memory cell array 10A is controlled by the row decoder module 15A and the sense amplifier module 16A. The memory cell array 10B is controlled by the row decoder module 15B and the sense amplifier module 16B. The sequencer 13 can control the elements included in each plane PL independently for each plane PL.

In this example, it is assumed that each plane PL includes the memory cell array 10, the row decoder module 15, and the sense amplifier module 16; however, the configuration is not limited to this. The plane PL may include at least the memory cell array 10. The elements used in each plane PL may be shared by a plurality of planes PL as appropriate.

Figure 41:
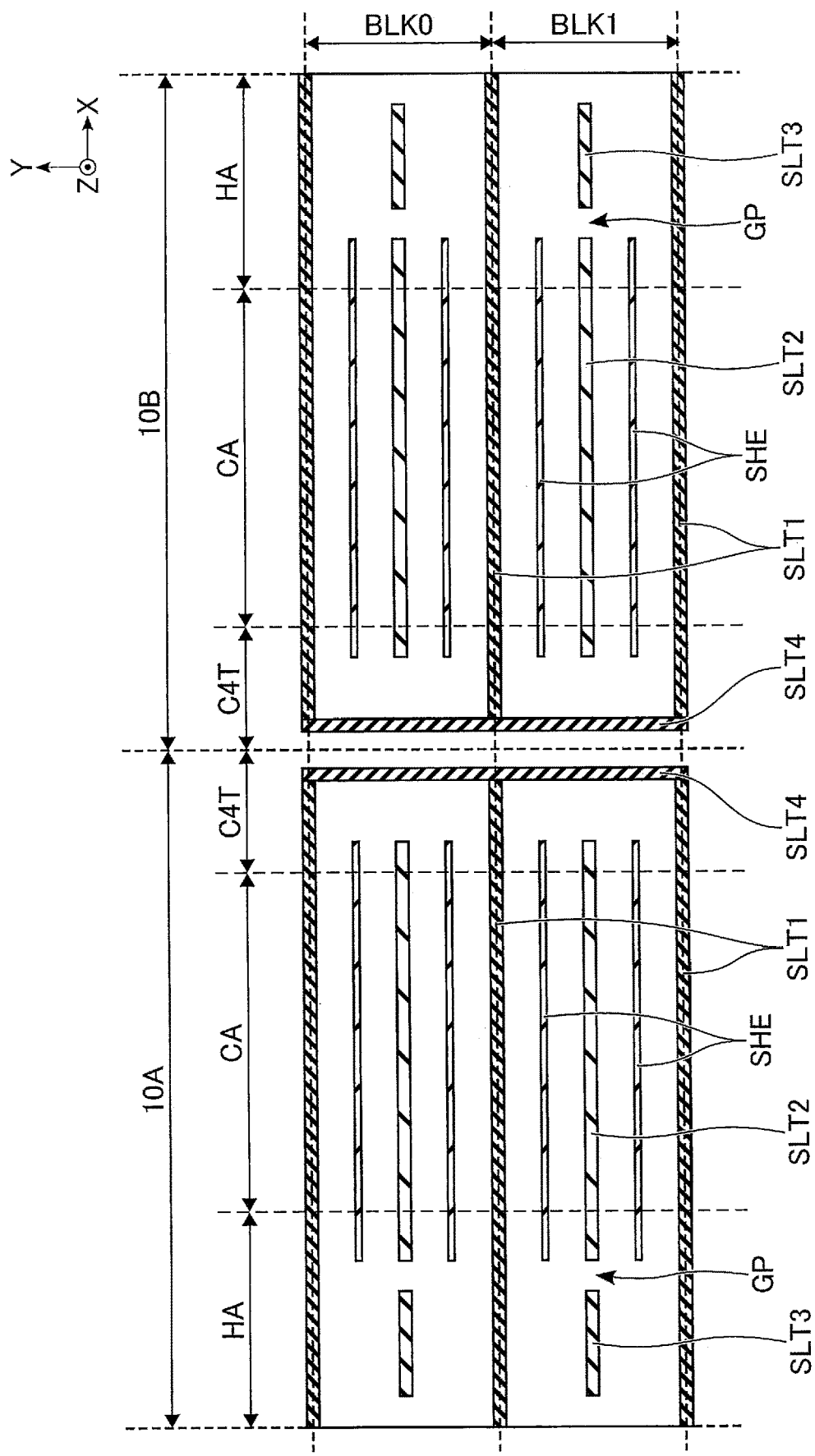
FIG. 41 is a plane view showing an example of a planar layout of a memory cell array included in the semiconductor memory device according to the second embodiment.

FIG. 41 is an example of the planar layout of the memory cell arrays 10A and 10B included in the semiconductor memory device 1 according to the second embodiment, focusing on a region corresponding to two blocks BLK0 and BLK1. As shown in FIG. 41, in each planar layout of the memory cell arrays 10A and 10B, for example, slit SLT4 and penetration contact region C4T are provided in the vicinity of the boundary between the memory cell arrays 10A and 10B.

The slit SLT4 is provided to extend in the Y direction, and is formed in the same process as slits SLT1 to SLT3. In the area of each of the memory cell arrays 10A and 10B, slit SLT4 is arranged in the vicinity of the boundary between the adjacent memory cell arrays 10A and 10B, and slit SLT4 is in contact with or intersects with the end portions of the slits SLT1. That is, the slits SLT1 and SLT4 include the portions continuously provided. In a manner similar to the slit SLT1, the slit SLT4 is filled up with an insulating member, and divides the conductive layers (e.g., select gate line SGS and word lines WL) provided on the same interconnect layer and adjacent through the slit SLT4.

In the second embodiment, the blocks BLK adjacent in the X direction between the memory cell arrays 10A and 10B are separated from each other by the slits SLT4 in a plate-like shape expanding along the YZ plane. Specifically, the slit SLT4 divides block BLK0 in the memory cell array 10A and block BLK0 in the memory cell array 10B, and divides block BLK1 in the memory cell array 10A and block BLK 1 in the memory cell array 10B.

Figure 42:
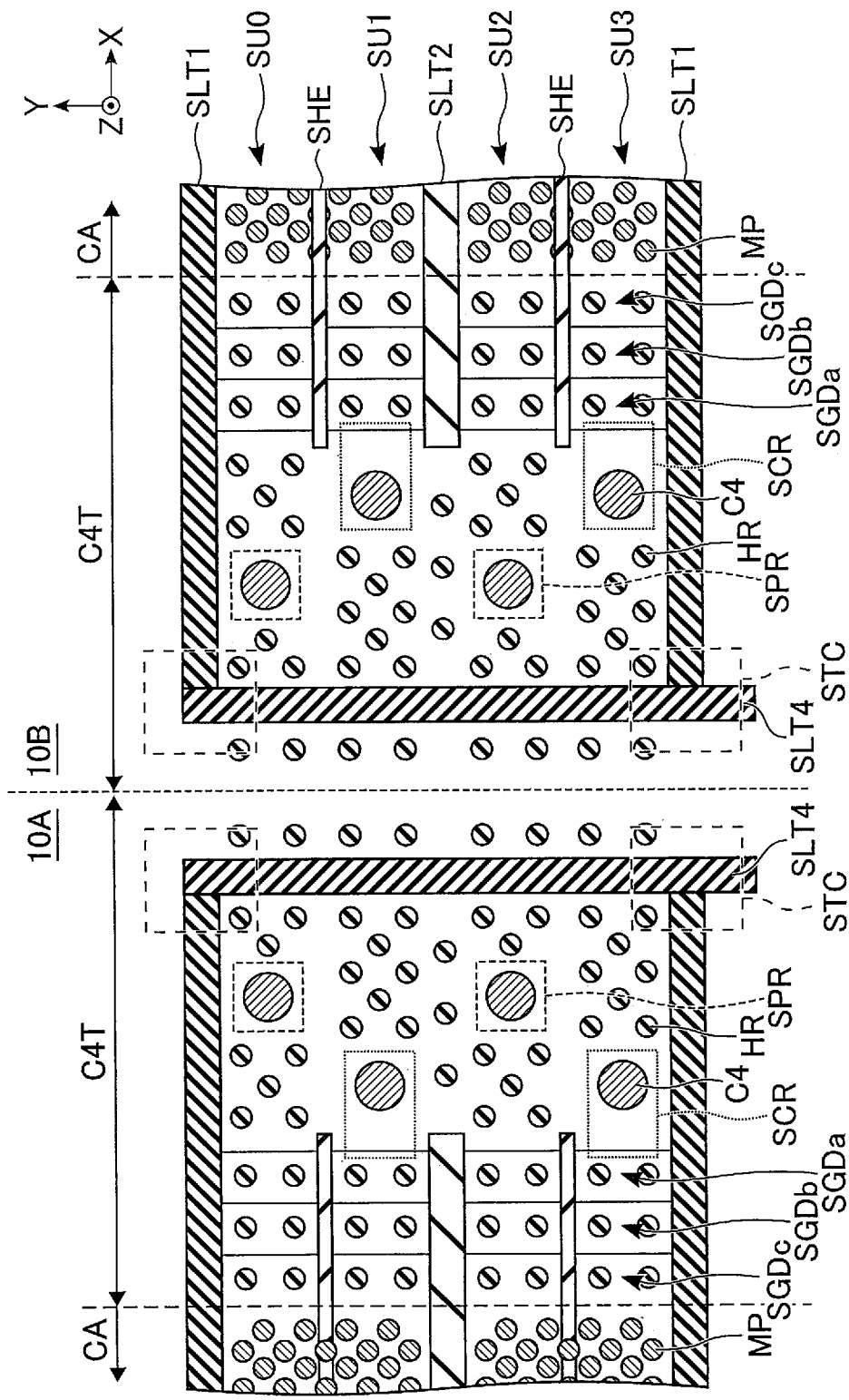
FIG. 42 is a plan view showing an example of a detailed planar layout in a penetration contact region of the memory cell array included in the semiconductor memory device according to the second embodiment.

FIG. 42 shows an example of the detailed planar layout of the memory cell array 10 in the penetration contact region C4T of the semiconductor memory device 1 according to the second embodiment, focusing on a region including the boundary portion between the memory cell arrays 10A and 10B. FIG. 42 further shows a part of the cell area CA in the vicinity of the penetration contact region C4T. As shown in FIG. 42, the memory cell array 10 includes a plurality of slit intersection regions STC in the penetration contact regions C4T adjacent to the boundary between the memory cell arrays 10A and 10B.

Each of the slit intersection regions STC includes a portion where the slits SLT1 and SLT4 are in contact with each other or cross each other. The layer structure of the source line section in the slit intersection region STC is similar to that in the source penetration region SPR, for example. The slit intersection region STC includes, for example, support pillars HR.

In the penetration contact regions C4T adjacent to the boundary between the memory cell arrays 10A and 10B, the end portions of the select gate lines SGDa, SGDb and SGDc are arranged stepwise in a manner similar to the hookup area HA. The contacts CC are not coupled to the terraced portions formed in the stepped portions, and the support pillars HR are arranged as appropriate.

In the penetration contact region C4T, a plurality of support pillars HR, a plurality of contacts C4, a source connection region SCR, and a source penetration region SPR are arranged appropriate in a manner similar to the first embodiment. Since the other configurations of the semiconductor memory device 1 according to the second embodiment are the same as those of the semiconductor memory device 1 according to the first embodiment, detailed descriptions of the configurations are omitted.

[2-2] Manufacturing Method of Semiconductor Memory Device 1

Figure 43:
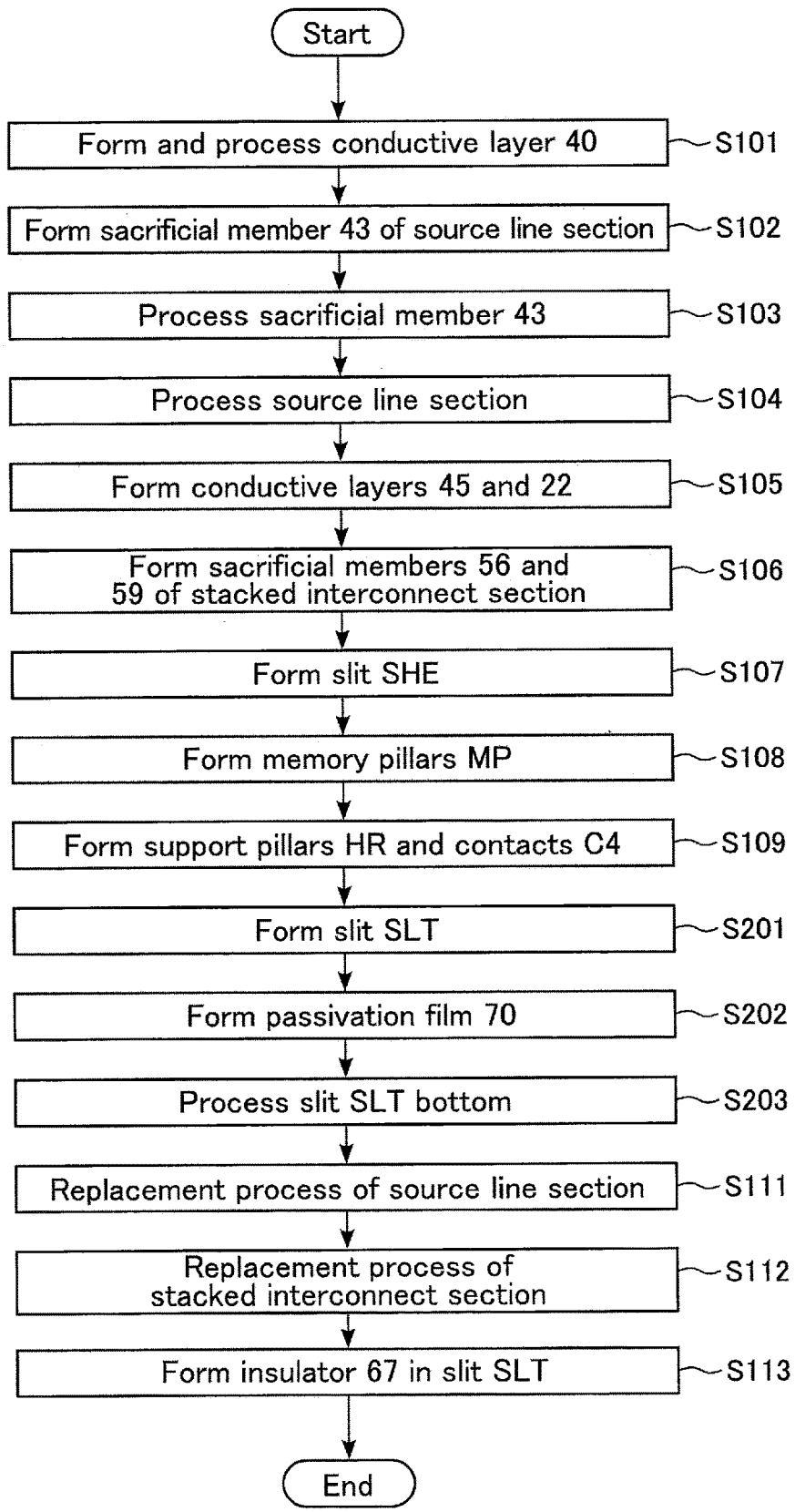
FIG. 43 is a flowchart showing an example of a manufacturing method of the semiconductor memory device according to the second embodiment.

Next, a description will be given of an example of a series of manufacturing steps relating to formation of the stacked interconnect structure inside the memory cell array 10 in the semiconductor memory device 1 according to the second embodiment. FIG. 43 is a flowchart showing an example of the manufacturing method of the semiconductor memory device 1 according to the second embodiment. FIGS. 44 to 47 each show an example of the cross-section structure during manufacturing the semiconductor memory device 1 according to the second embodiment. The cross-sectional view referred to in the following description focuses on the areas corresponding to the slit SLT adjacent to the memory pillar MP in the cell area CA and the slit SLT arranged in the slit intersection regions STC in the penetration contact region C4T.

The processes of steps S101 to S109 described in the first embodiment are performed in order. As a result, the structure shown in FIG. 31 is formed on the semiconductor substrate 20. Simply speaking, the source line section and the sacrificial members 43, 56 and 59 of the stacked interconnect section are stacked, and then the memory pillars MP, the support pillars HR and the contacts C4 are formed. The stacked structure corresponding to the source line section is processed into a desired shape for each region in the memory cell array 10. The sacrificial member 59 above the uppermost sacrificial member 56 in the slit intersection regions STC is removed when the staircase processing is applied to the end portion of the sacrificial member 59 after step S109, for example. The insulating layer 62, for example, is filled in the layer above the uppermost sacrificial member 56 in the slit intersection region STC.

Figure 44:
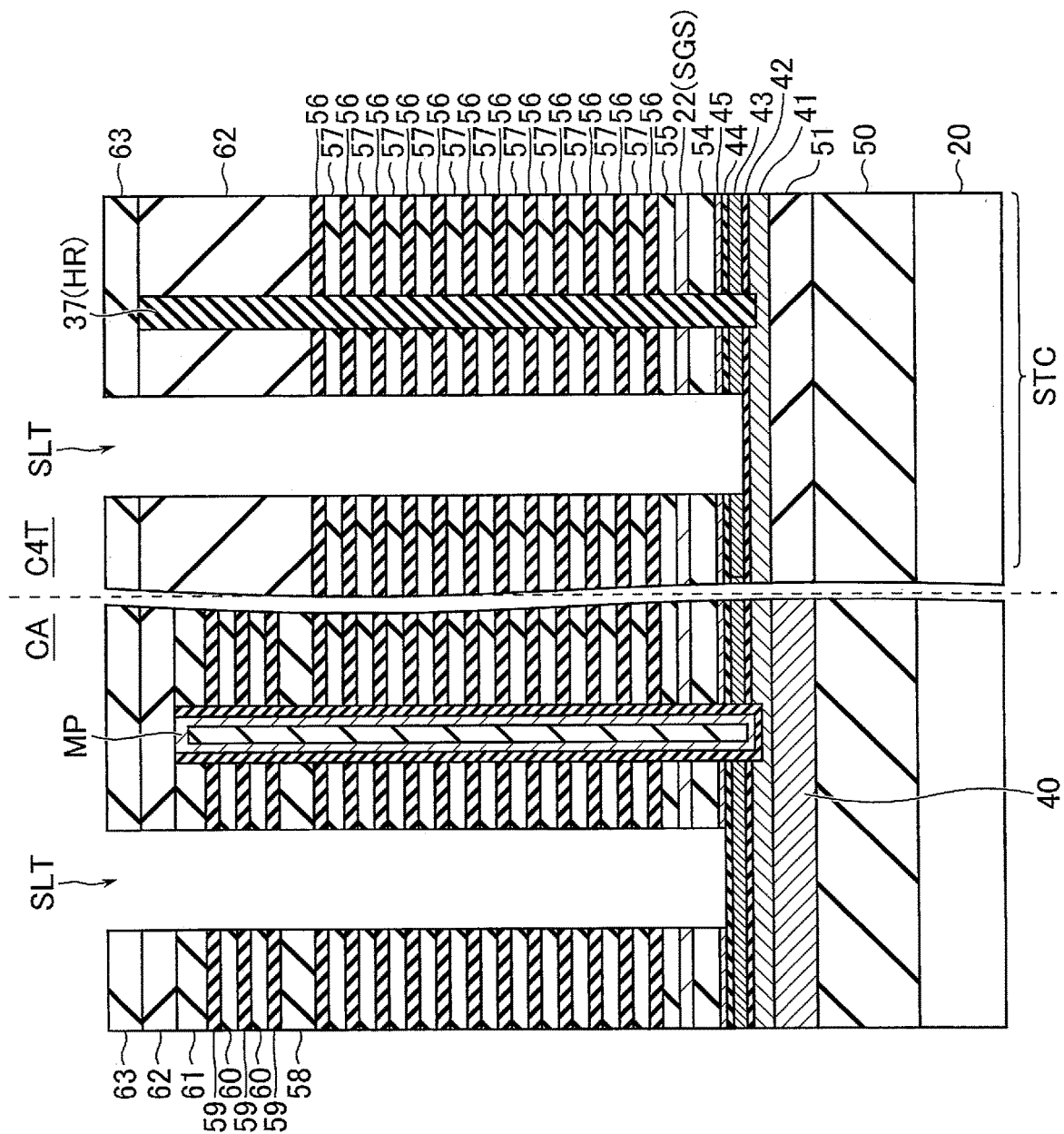
FIGS. 44, 45, 46, and 47 are cross-sectional views of the memory cell array each showing an example of a cross-section structure during the manufacturing process of the semiconductor memory device according to the second embodiment.

Next, in the process of step S201, slits SLT are formed as shown in FIG. 44. Specifically, first, a mask is formed by photolithography, etc. in which areas corresponding to the slits SLT1, SLT2, SLT3 and SLT4 are opened. Then, by anisotropic etching using the formed mask, the slits SLT are formed.

In the second embodiment, the bottom position of the slit SLT varies depending on the area in which the slit SLT is formed. For example, the slit SLT provided in the cell area CA, or in an area excluding the slit intersection region STC in the penetration contact region C4T, has a bottom that is terminated in the layer in which the insulating layer 44 is formed, as described in the first embodiment.

On the other hand, in the slit intersection region STC, there is a large opening area of the intersection between the slits SLT and etching progresses faster; thus, the bottom of the slit SLT in the intersection may penetrate the insulating layer 44. For example, the bottom of the slit SLT in the slit intersection region STC penetrates the sacrificial member 43, and is terminated in the layer in which the insulating layer 42 is provided.

Figure 45:
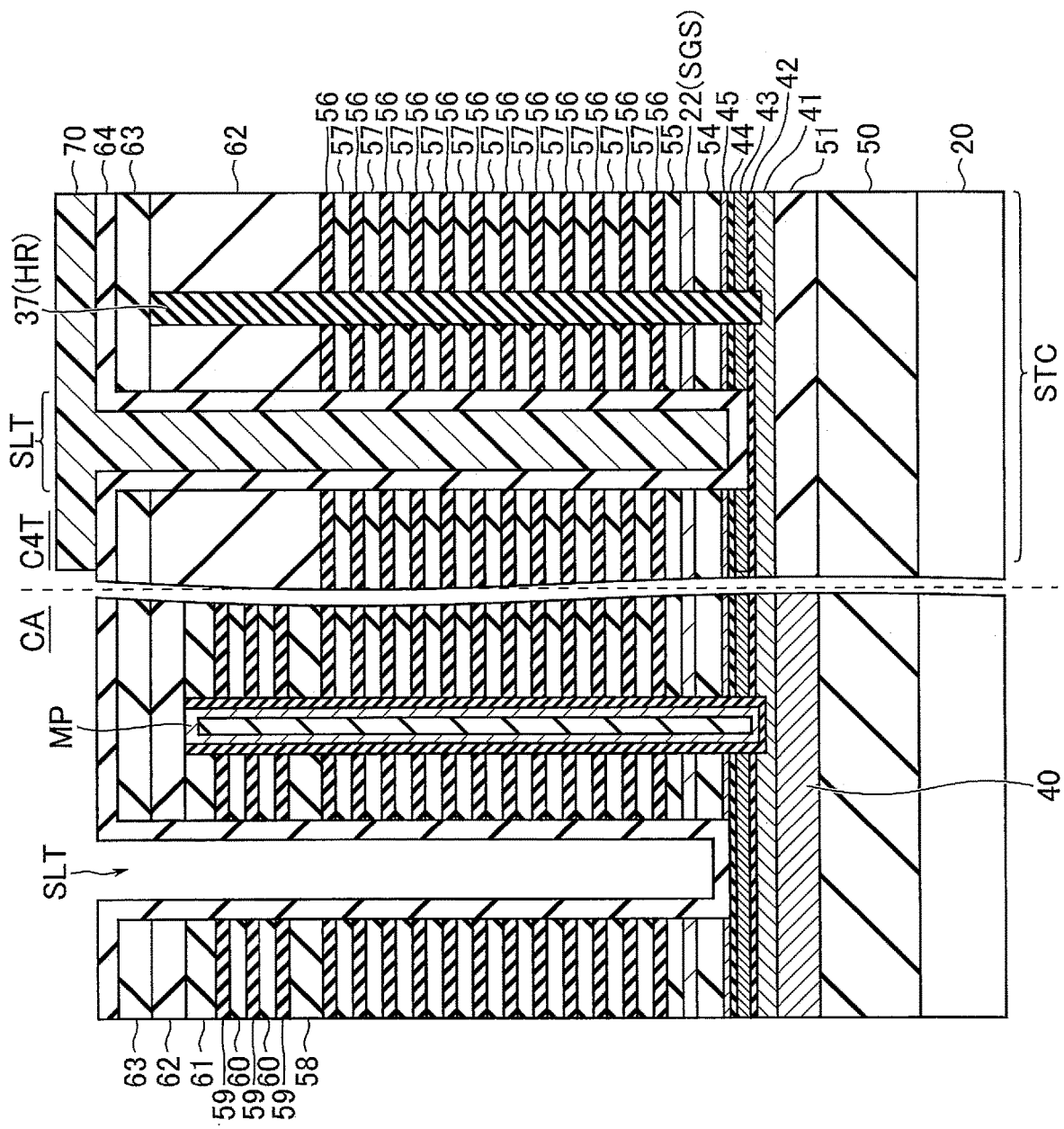

Next, in the process of step S202, the passivation film 70 is formed as shown in FIG. 45. Specifically, the passivation film 64 is formed on the top surface of the insulating layer 63 and the inner wall of the slit SLT in a manner similar to the first embodiment. Then, by photolithography, etc., the slit SLT in the slit intersection region STC is covered, and the passivation film 70 is formed in such a manner that the slit SLT portion provided in an area other than the slit intersection region STC is opened. The passivation film 70 is, for example, a photoresist.

Figure 46:
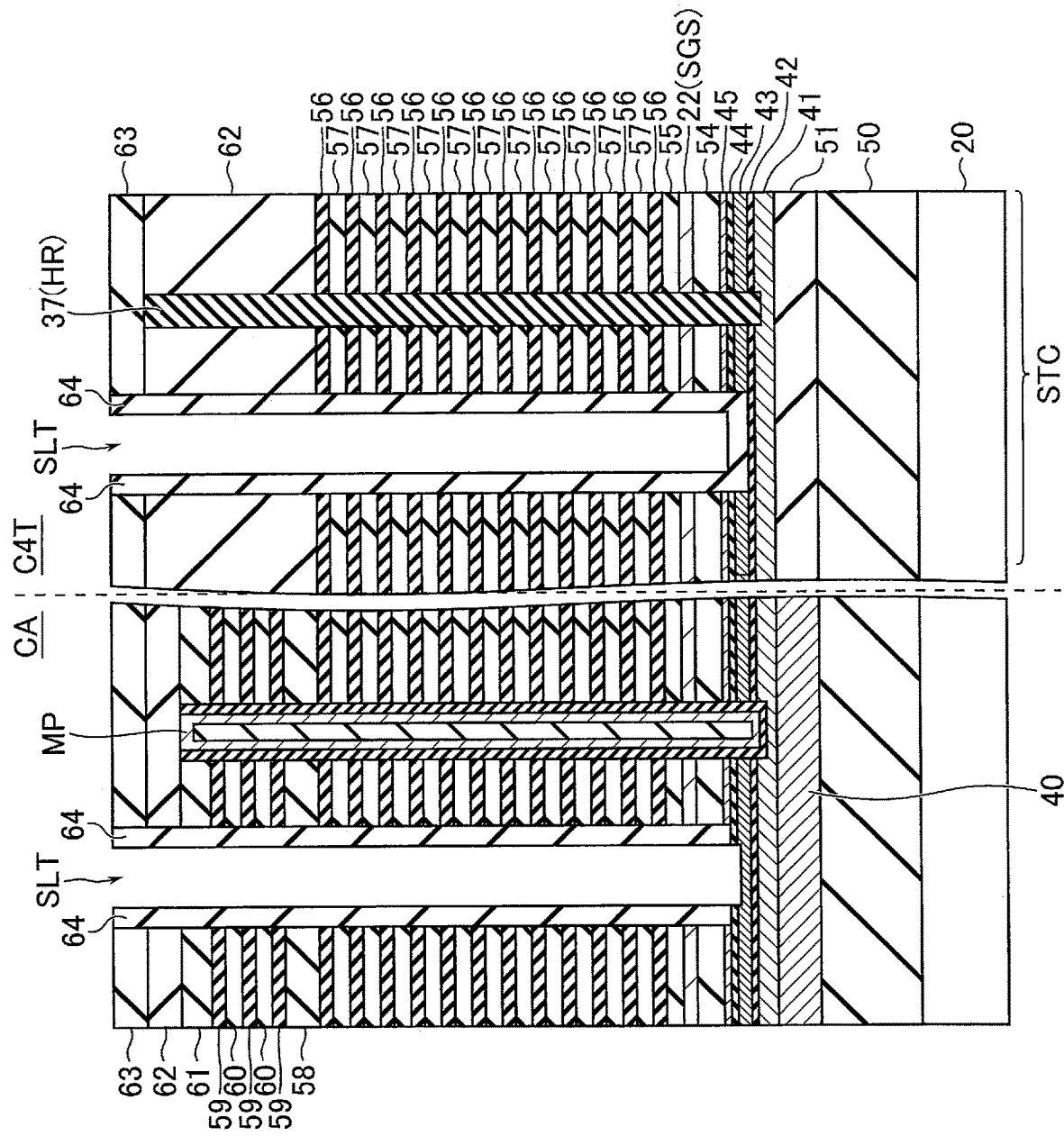

Next, in the process of step S203, the slit SLT bottom is processed as shown in FIG. 46. In this process, RIE is used, for example. Then, at the bottom of the slit SLT provided in an area other than the slit intersection region STC, the passivation film 64 is removed to expose a part of the sacrificial member 43. On the other hand, the slit SLT provided in the slit intersection region STC is protected by the passivation film 70, and the bottom of the slit SLT is not processed. The passivation film 70 is removed after the process in step S203, for example.

Next, the processes of steps S111 to S113 described in the first embodiment are performed in order. Simply speaking, the replacement process of the source line section, the replacement process of the stacked interconnect section, and the formation of the insulating layer 67 in the slit SLT are performed. Thereby, the memory pillar MP, the source line SL coupled to the memory pillar MP, the word lines WL, and the select gate lines SGDa, SGDb, SGDc and SGS are formed.

Figure 47:
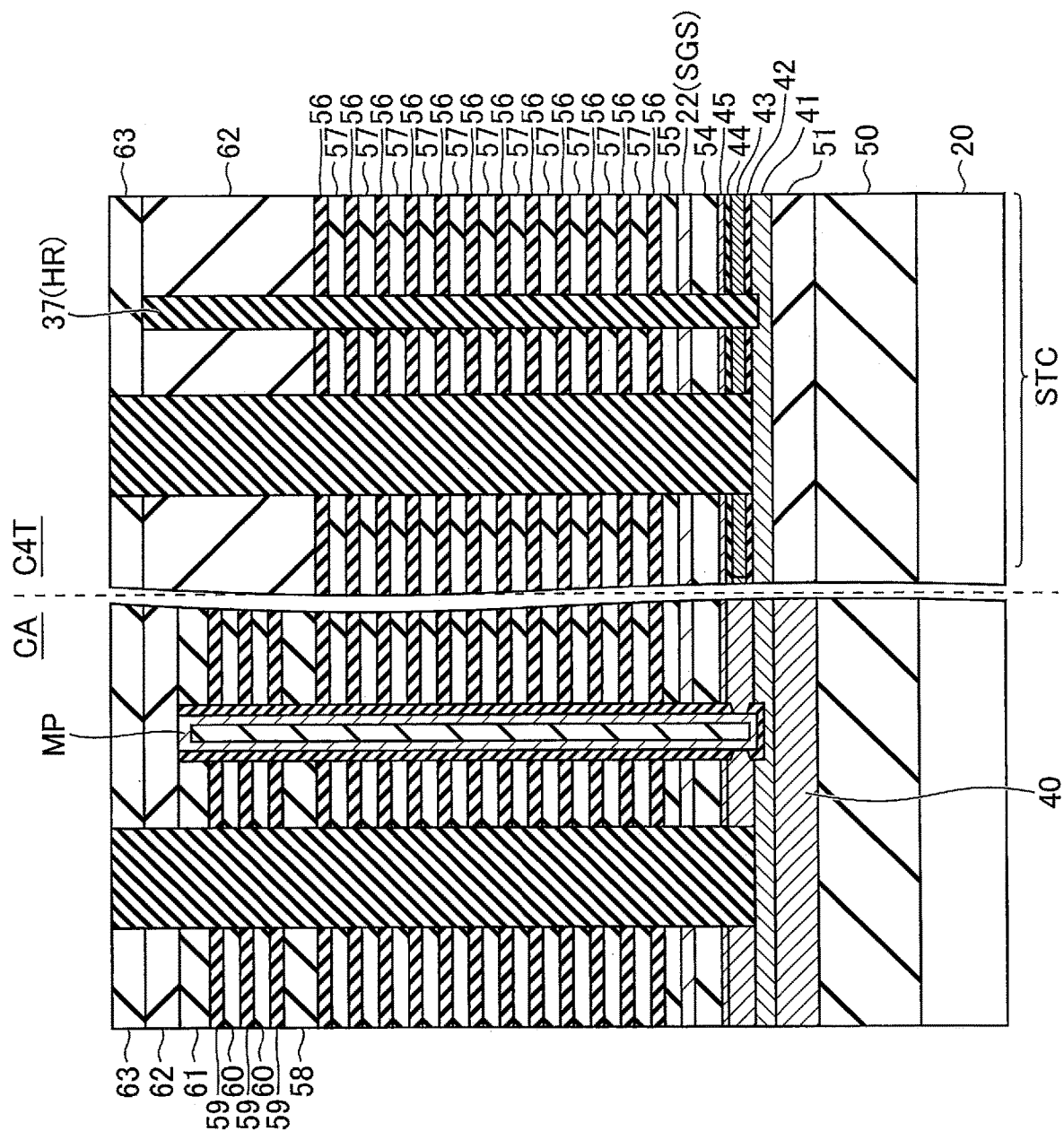

In the method of manufacturing the semiconductor memory device 1 according to the second embodiment, the sacrificial member 43 at the bottom of the slit SLT in the slit intersection region STC is not exposed at the time of the replacement process of the source line section. For this reason, as shown in FIG. 47, the sacrificial member 43 in the slit intersection region STC and the insulating layers 42 and 44 below and above the sacrificial member 43 remain after the replacement process of the source line section is performed. That is, the insulating layer 67 filled inside the slit SLT in the slit intersection region STC includes a portion that is in contact with the insulating layer 42, the sacrificial member 43 and the insulating layer 44. Since the details of the other manufacturing steps of the semiconductor memory device 1 according to the second embodiment are similar to those of the first embodiment, descriptions are omitted.

[2-3] Advantages of Second Embodiment

The semiconductor memory device 1 according to the second embodiment described above makes it possible to improve the yield of the semiconductor memory device 1.

The following is a detailed description of the advantages of the semiconductor memory device 1 according to the second embodiment with reference to the comparative example.

Figure 48:
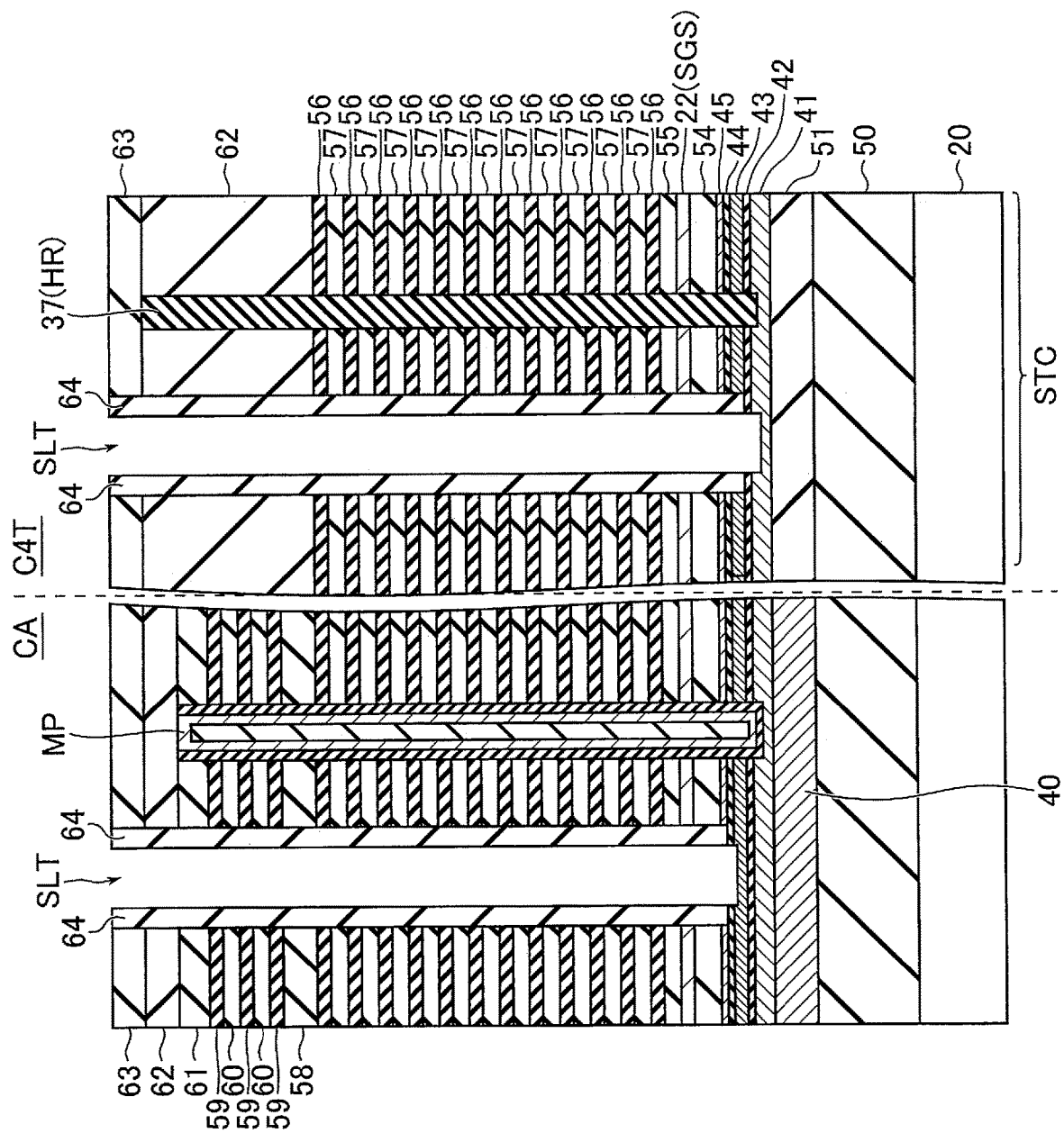
FIG. 48 is a cross-sectional view of the memory cell array showing an example of a cross-section structure during the manufacturing process of the semiconductor memory device according to a comparative example of the second embodiment.

FIG. 48 shows an example of the cross-section structure during manufacturing the semiconductor memory device 1 according to the comparative example of the second embodiment, exemplifying the process results when the passivation film 70 does not exist at the time of the process in step S203. As shown in FIG. 48, in the method of manufacturing the semiconductor memory device 1 according to the comparative example of the second embodiment, even if the sacrificial member 43 is partially removed similarly to the source connection region in order to suppress a risk that the insulating member of the support pillar HR is removed, over-etching may occur in the slit intersection region STC and the bottom of the slit SLT may reach the conductive layer 41.

If the bottom of the slit SLT reaches the conductive layer 41, etching may progress toward the conductive layer 41 during the step of removing the sacrificial member 43 in the replacement process of the source line section. It is assumed that the area of the slit intersection region STC is large and that etching progresses quickly toward the conductive layer 41; consequently, etching may progress to the bottom of the support pillar HR in the slit intersection region STC. If etching progresses to the bottom of the support pillar HR, the insulating member in the hole HRH may be removed from the source line SL to the select gate line SGS during the step of removing a part of the laminated film 32 in a manner similar to the first embodiment. That is, a short circuit between the source line SL and the select gate line SGS may occur.

In contrast, in the semiconductor memory device 1 according to the second embodiment, the slit intersection region STC is covered with the passivation film 70 at the time of processing the bottom of the slit SLT. As a result, etching of the conductive layer 41 can be eliminated in the replacement process of the source line section. Therefore, the method of manufacturing the semiconductor memory device 1 according to the second embodiment can suppress occurrence of a short circuit between the source line SL and the select gate line SGS, and can improve the yield.

[3] Other Modifications

A semiconductor memory device according to an embodiment includes a substrate, a first conductive layer, a plurality of second conductive layers, a first pillar, a second pillar, and a first member. The substrate includes a first region and a second region. The first and second regions are adjacent in a first direction. The first conductive layer is provided above the substrate in the first and second regions. The first conductive layer includes a first portion in the first region, a second portion in the second region, and a third portion in the second region. The second portion is continuous with the first portion. The third portion is continuous with the first portion and apart from the second portion above the second portion. The second conductive layers are provided above the first conductive layer. The second conductive layers are stacked to be apart from one another. The first pillar is provided to penetrate the second conductive layers in a stacked direction of the second conductive layers to reach the first portion of the first conductive layer. The first pillar includes a first semiconductor layer and a first insulating layer. The first semiconductor layer is in contact with the first portion of the first conductive layer in a direction crossing the stacked direction. The first insulating layer is provided between the first semiconductor layer and the second conductive layers. The second pillar is provided to penetrate the second conductive layers and the third portion of the first conductive layer in the stacked direction. The first member differs in material from the first conductive layer. The first member is provided between the first and second pillars and between the second and third portions of the first conductive layer, is in contact with each of the second and third portions of the first conductive layer in the stacked direction, and is in contact with the first portion of the first conductive layer in the first direction. Thus, it is possible to improve the yield of the semiconductor memory device.

In the above-described embodiments, the memory cell array 10 may have other configurations. For example, the memory pillar MP may be formed of two or more pillars connected in the Z direction. Moreover, the memory pillar MP may have a structure in which a pillar corresponding to the select gate line SGD and a pillar corresponding to the word line WL are connected. The inside of the slit SLT may be made of various types of insulators. The number of bit lines BL overlapping with each memory pillar MP may be determined as appropriate.

In the above-described embodiments, the memory cell array 10 may include at least one dummy word line between word line WL0 and select gate line SGS, and between word line WL11 and select gate line SGDa. If dummy word lines are provided, dummy transistors of the number corresponding to the number of dummy word lines are provided between memory cell transistor MT0 and select transistor ST2, and between memory cell transistor MT11 and select transistor ST1a. Dummy transistors have a configuration similar to that of the memory cell transistors MT, and are transistors which are not used for storage of data. If two or more memory pillars MP are connected in the Z direction, the memory cell transistor MT in the vicinity of the contact portion of the pillars may be used as a dummy transistor.

In the above-described embodiments, in the hookup area HA, the end portions of word lines WL0 to WL11 are arranged stepwise in three lines with two steps in the Y direction and multiple steps in the X direction; however, the configuration is not limited to this. The number of steps formed in the Y direction at the end portions of the stacked word lines WL may be determined as appropriate. That is, in the semiconductor memory device 1, the end portions of the word lines WL in the hookup area HA may be designed stepwise to have any number of steps.

In the above-described embodiment, circuits such as the sense amplifier module 16 are provided below the memory cell array 10 of the semiconductor memory device 1; however, the configuration is not limited to this. For example, the semiconductor memory device 1 may have a structure in which a chip provided with the sense amplifier module 16, etc. and a chip provided with the memory cell array 10 are bonded to each other.

In the drawings referred to in the description of the above embodiments, the support pillar HR and the contact C4 have the same diameter in the Z direction, but the invention is not limited to this. For example, the support pillar HR and the contact C4 may have a tapered or reversed tapered shape, or a shape having a bloated middle part. Similarly, the slit SLT and the slit SHE may have a tapered or reversed tapered shape, or a shape having a bloated middle part. Moreover, in the embodiment described above, the support pillar HR, the contact C4, and the memory pillar MP each have a circular cross-section; however, the cross-section thereof may be oval, and may be determined as appropriate.

In this specification, the term "coupling" refers to electrical coupling, and does not exclude intervention of another element. The term "electrically coupling" may include intervention of an insulator as long as it can be operated in a manner similar to one electrically coupled. The term "continuously provided" refers to a case where at least a part is formed in the same manufacturing process. In an element, parts continuously provided have no boundary. The term "continuously provided" is synonymous with being a film continuous from a first portion toward a second portion in a film or a layer.

The term "pillar" in this specification refers to the structure provided in the hole formed in the process for manufacturing the semiconductor memory device 1. The term "outer diameter" refers to a diameter of an element in the cross section parallel to the surface of the semiconductor substrate 20. The term "outer diameter" is measured using the outermost member among the members in the hole used for the formation of the element to be measured, for example. For example, when the outer diameter of the contact C4 is compared with the outer diameter of the support pillar HR, the outer diameters of the elements included in the same cross section are compared. The term "inner diameter" refers to a diameter in the inner wall of the hole in the cross section parallel to the surface of the semiconductor substrate 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate including a first region and a second region, the first and second regions being adjacent in a first direction;
a first conductive layer provided above the substrate in the first and second regions, the first conductive layer including a first portion in the first region, a second portion in the second region, and a third portion in the second region, the second portion being continuous with the first portion, the third portion being continuous with the first portion and apart from the second portion above the second portion;
a plurality of second conductive layers provided above the first conductive layer, the second conductive layers being stacked to be apart from one another;
a first pillar provided to penetrate the second conductive layers in a stacked direction of the second conductive layers to reach the first portion of the first conductive layer, the first pillar including a first semiconductor layer and a first insulating layer, the first semiconductor layer being in contact with the first portion of the first conductive layer in a direction crossing the stacked direction, the first insulating layer being provided between the first semiconductor layer and the second conductive layers;
a second pillar provided to penetrate the second conductive layers and the third portion of the first conductive layer in the stacked direction;

a first member differing in material from the first conductive layer, the first member being provided between the first and second pillars and between the second and third portions of the first conductive layer, being in contact with each of the second and third portions of the first conductive layer in the stacked direction, and being in contact with the first portion of the first conductive layer in the first direction; and a second member differing in material from the first member, wherein the first member includes a fourth portion, a fifth portion, and a sixth portion, the fourth portion being in contact with the first, second, and third portions of the first conductive layer, the fifth portion being continuous with the fourth portion and in contact with the second portion of the first conductive layer, the sixth portion being continuous with the fourth portion and apart from the fifth portion above the fifth portion while in contact with the third portion of the first conductive layer, and wherein the second member is provided between the fifth portion and the sixth portion of the first member.

2. The device of claim 1, wherein the second pillar penetrates the second member in the stacked direction.

3. The device of claim 1, wherein the second member is non-doped silicon.

4. The device of claim 1, wherein the second member is silicon in which at least one of phosphorus, boron or carbon is doped.

5. The device of claim 1, further comprising:
a third conductive layer provided between the first conductive layer and the second conductive layers, the third conductive layer including a concave part in an area overlapping with the fourth portion of the first member in a plane view.

6. The device of claim 5, wherein the third portion of the first conductive layer includes a part provided along the concave part of the third conductive layer through an insulating layer.

7. The device of claim 1, wherein the second pillar includes a fourth conductive layer and a first insulating member, the fourth conductive layer extending in the stacked direction and electrically coupled to the second portion of the first conductive layer through a bottom, the first insulating member being provided between the fourth conductive layer and the second conductive layers.

8. The device of claim 7, further comprising:
a fifth conductive layer provided between the substrate and the first conductive layer in a third region different from the first and second regions; and
a third pillar provided to penetrate the second conductive layers and the third portion of the first conductive layer above the substrate in the third region to reach the fifth conductive layer, the third pillar including a sixth conductive layer and a second insulating member, the sixth conductive layer extending in the stacked direction and being electrically coupled to the fifth conductive layer through a bottom, the second insulating member being provided between the sixth conductive layer and the second conductive layers.

9. The device of claim 8, wherein the sixth conductive layer is electrically coupled to the fourth conductive layer through an upper part.

10. The device of claim 8, further comprising:
a seventh conductive layer provided to be apart from and in a same layer as the second portion of the first conductive layer above the substrate m the third region, the third pillar penetrating the seventh conductive layer to reach the fifth conductive layer.

11. The device of claim 10, further comprising:
a third member differing in material from the first and seventh conductive layers, and provided between the third portion of the first conductive layer and the seventh conductive layer.

12. The device of claim 11, further comprising:
a fourth member differing in material from the third member,
wherein the fourth member is provided between the third portion of the first conductive layer and the seventh conductive layer.

13. The device of claim 12, wherein the third member includes a seventh portion and an eighth portion, the seventh portion of the third member being provided between the third portion of the first conductive layer and the fourth member, the eighth portion of the third member being provided between the seventh conductive layer and the fourth member.

14. The device of claim 12, wherein:
the first member and the third member are formed of a same material; and
the second member and the fourth member are formed of a same material.

15. The device of claim 7, wherein a bottom of the first semiconductor layer is covered with the first insulating layer.

16. The device of claim 1, wherein the second pillar is formed of an insulating layer.

17. The device of claim 1, further comprising:
an eighth conductive layer provided to be apart from and in a same layer as the second portion of the first conductive layer above the substrate in a fourth region different from the first and second regions;
a fifth member differing in material from the first and eighth conductive layers, and provided between the eighth conductive layer and the third portion of the first conductive layer above the substrate in the fourth region; and
a third insulating member in contact with each of the second conductive layers, the third insulating member including a ninth portion, a tenth portion, and an eleventh portion, the ninth portion extending in the first direction, the tenth portion extending in a second direction crossing each of the stacked direction and the first direction, the eleventh portion being provided to be in contact with or cross the ninth and tenth portions,
wherein the eleventh portion of the third insulating member is in contact with the third portion of the first conductive layer, the eighth conductive layer, and the fifth member.

18. The device of claim 1, wherein:
an intersection between the first pillar and one of the second conductive layers functions as a memory cell; and
the first conductive layer functions as a source line.

* * * * *